US012727319B2

(12) United States Patent
Yoshiyasu et al.

(10) Patent No.: US 12,727,319 B2
(45) Date of Patent: Sep. 1, 2026

(54) LIGHT-EMITTING DEVICE, LIGHT-EMITTING APPARATUS, ELECTRONIC APPLIANCE, AND LIGHTING DEVICE

(71) Applicant: Semiconductor Energy Laboratory Co., Ltd., Kanagawa-ken (JP)

(72) Inventors: Yui Yoshiyasu, Atsugi (JP); Naoaki Hashimoto, Sagamihara (JP); Tatsuyoshi Takahashi, Atsugi (JP); Sachiko Kawakami, Atsugi (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 403 days.

(21) Appl. No.: 18/276,328

(22) PCT Filed: Jan. 31, 2022

(86) PCT No.: PCT/IB2022/050798
§ 371 (c)(1),
(2) Date: Aug. 8, 2023

(87) PCT Pub. No.: WO2022/172119
PCT Pub. Date: Aug. 18, 2022

(65) Prior Publication Data

US 2024/0130228 A1 Apr. 18, 2024

(30) Foreign Application Priority Data

Feb. 12, 2021 (JP) ................................ 2021-021324

(51) Int. Cl.
*H10K 50/16* (2023.01)
*C09K 11/06* (2006.01)
(Continued)

(52) U.S. Cl.
CPC .............. *H10K 50/16* (2023.02); *C09K 11/06* (2013.01); *H10K 85/342* (2023.02);
(Continued)

(58) Field of Classification Search
CPC .... H10K 50/16; H10K 85/342; H10K 85/615; H10K 85/633; H10K 85/636;
(Continued)

(56) References Cited

U.S. PATENT DOCUMENTS

| | | | | |
|---|---|---|---|---|
| 4,757,364 A * | 7/1988 | Miura | ...................... | H10D 1/66 257/E29.345 |
| 5,953,985 A | 9/1999 | Kobayashi | | |

(Continued)

FOREIGN PATENT DOCUMENTS

| | | |
|---|---|---|
| CN | 001902769 A | 1/2007 |
| CN | 109509765 A | 3/2019 |

(Continued)

OTHER PUBLICATIONS

International Search Report (Application No. PCT/IB2022/050798) Dated May 17, 2022.

(Continued)

*Primary Examiner* — Caleb E Henry
*Assistant Examiner* — Pratiksha Jayant Lohakare
(74) *Attorney, Agent, or Firm* — Husch Blackwell LLP

(57) ABSTRACT

A light-emitting device with high heat resistance in a manufacturing process is to be provided. The light-emitting device includes a second electrode over a first electrode with an EL layer sandwiched therebetween; the EL layer includes at least a light-emitting layer, a first electron-transport layer, and a second electron-transport layer; the first electron-transport layer is over the light-emitting layer; the light-emitting device includes an insulating layer in contact with a side surface of the light-emitting layer and a side surface (Continued)

of the first electron-transport layer; the second electron-transport layer is over the first electron-transport layer; the insulating layer is positioned between the second electron-transport layer and the side surface of the light-emitting layer and the side surface of the first electron-transport layer; and the first electron-transport layer contains a heteroaromatic compound including at least one heteroaromatic ring and an organic compound different from the heteroaromatic compound.

18 Claims, 24 Drawing Sheets

(51) Int. Cl.
*H10K 85/30* (2023.01)
*H10K 85/60* (2023.01)
(52) U.S. Cl.
CPC ......... *H10K 85/615* (2023.02); *H10K 85/633* (2023.02); *H10K 85/636* (2023.02); *H10K 85/6572* (2023.02); *C09K 2211/1044* (2013.01); *C09K 2211/185* (2013.01); *H10K 50/166* (2023.02)
(58) Field of Classification Search
CPC .. H10K 85/6572; H10K 50/166; H10K 50/11; H10K 50/81; H10K 50/82; H10K 59/1213; H10K 59/90; H10K 77/10; C09K 11/06; C09K 2211/1044; C09K 2211/185; H05B 33/12; H05B 33/22; H05B 33/06; H05B 33/14
USPC ............................................................ 257/40
See application file for complete search history.

(56) References Cited

U.S. PATENT DOCUMENTS

| | | | |
|---|---|---|---|
| 6,120,338 A | 9/2000 | Hirano et al. | |
| 7,211,948 B2 * | 5/2007 | Liao | H10K 85/621 313/506 |
| 8,338,849 B2 * | 12/2012 | Tischler | F21K 9/233 257/98 |
| 8,358,057 B2 | 1/2013 | Oota | |
| 9,079,879 B2 | 7/2015 | Kadoma et al. | |
| 10,263,194 B2 | 4/2019 | Seo et al. | |
| 11,088,335 B2 | 8/2021 | Seo et al. | |
| 11,678,550 B2 | 6/2023 | Kato | |
| 2002/0072139 A1 | 6/2002 | Kashiwabara | |
| 2005/0151466 A1 * | 7/2005 | Liao | H10K 85/621 313/504 |
| 2008/0238297 A1 | 10/2008 | Oota | |
| 2008/0286604 A1 * | 11/2008 | Inoue | H10K 85/342 428/690 |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0088144 A1 * | 4/2013 | Inoue | C09K 11/06 313/504 |
| 2013/0277653 A1 * | 10/2013 | Osaka | H10K 85/615 548/445 |
| 2013/0280839 A1 | 10/2013 | Sonoda et al. | |
| 2013/0281693 A1 * | 10/2013 | Inoue | C09K 11/06 544/225 |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2016/0336519 A1 * | 11/2016 | Seo | H10K 50/166 |
| 2017/0141167 A1 | 5/2017 | Naganuma | |
| 2017/0256754 A1 | 9/2017 | Defranco et al. | |
| 2018/0138416 A1 * | 5/2018 | Seo | C09K 11/06 |
| 2018/0190908 A1 | 7/2018 | Ke et al. | |
| 2020/0161383 A1 * | 5/2020 | Kim | H10K 50/171 |
| 2020/0203662 A1 | 6/2020 | Mollard et al. | |
| 2021/0265432 A1 * | 8/2021 | Kato | H10K 59/873 |
| 2022/0209162 A1 | 6/2022 | Seo et al. | |

FOREIGN PATENT DOCUMENTS

| | | | |
|---|---|---|---|
| CN | 111200068 | A | 5/2020 |
| CN | 112314056 | A | 2/2021 |
| EP | 1704604 | A | 9/2006 |
| EP | 1 704 604 | B1 | 4/2012 |
| JP | 2000-036385 | A | 2/2000 |
| JP | 2003-059663 | A | 2/2003 |
| JP | 2007-525023 | | 8/2007 |
| JP | 2007-258237 | A | 10/2007 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| KR | 2006-0128915 | A | 12/2006 |
| KR | 2015-0038800 | A | 4/2015 |
| KR | 2020-0057922 | A | 5/2020 |
| TW | 200541405 | | 12/2005 |
| WO | WO 2005/071772 | A1 | 8/2005 |
| WO | WO 2020/004086 | A1 | 1/2020 |

OTHER PUBLICATIONS

Written Opinion (Application No. PCT/IB2022/050798) Dated May 17, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007 1010.

(56) References Cited

OTHER PUBLICATIONS

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

<<Structure>> Glass\NBPhen (10 nm)

<<Structure>> Glass\2mpPCBPDBq (10 nm)

<<Structure>> Glass\2mpPCBPDBq:PCBBiF:$Ir(tBuppm)_3$ (0.8:0.2:0.06) (40 nm)

<<Structure>> Glass\2mpPCBPDBq (10 nm)\NBPhen (10 nm)

<<Structure>> Glass\2mpPCBPDBq:PCBBiF:$Ir(tBuppm)_3$ (0.8:0.2:0.06)(40 nm)\2mpPCBPDBq(10 nm)\NBPhen(10 nm)

<<Structure>> Glass＼PCBBiF (40nm)

<<Structure>> Glass＼2mpPCBPDBq :NBPhen(0.5:0.5) (20 nm)

<<Structure>> Glass＼2mpPCBPDBq:PCBBiF:Ir(tBuppm)$_3$ (0.8:0.2:0.06) (40nm)
＼NBPhen(20 nm)

<<Structure>> Glass＼2mpPCBPDBq:PCBBiF:Ir(tBuppm)$_3$ (0.8:0.2:0.06)(40 nm)
＼2mpPCBPDBq :NBPhen(0.5:0.5) (20 nm)

LIGHT-EMITTING DEVICE, LIGHT-EMITTING APPARATUS, ELECTRONIC APPLIANCE, AND LIGHTING DEVICE

This application is a 371 of international application PCT/IB2022/050798 filed on Jan. 31, 2022, which is incorporated herein by reference.

TECHNICAL FIELD

One embodiment of the present invention relates to a light-emitting device, a display device, a light-emitting apparatus, a light-emitting and light-receiving apparatus, an electronic appliance, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is sandwiched between a pair of electrodes. Carriers are injected by application of voltage to the element, and recombination energy of the carriers is used, whereby light emission can be obtained from the light-emitting material.

Such light-emitting devices are of self-light-emitting type and thus have advantages over liquid crystal, such as high visibility and no need for backlight when used in pixels of a display, and are suitable as flat panel display elements. Displays including such light-emitting devices are also highly advantageous in that they can be thin and lightweight. Moreover, such light-emitting devices also have a feature that the response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting and the like.

Displays or lighting devices including light-emitting devices are suitable for a variety of electronic appliances as described above, and research and development of light-emitting devices has progressed for more favorable characteristics.

A variety of methods for manufacturing light-emitting devices are known. As a method for manufacturing a high-resolution light-emitting device, a method of forming a light-emitting layer without using a fine metal mask is known. An example of the method is a manufacturing method of an organic EL display (Patent Document 1). The method includes a step of forming a first light-emitting layer as a continuous film crossing a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film crossing the display region by deposition of a second luminescent organic material, which contains a mixture of a host material and a dopant material but differs from the first luminescent organic material, over the first light-emitting layer; and a step of forming a counter electrode over the second light-emitting layer.

REFERENCE

Patent Document

[Patent Document 1] Japanese Published Patent Application No. 2012-160473

SUMMARY OF THE INVENTION

Problems to be Solved by the Invention

An object of one embodiment of the present invention is to provide a novel light-emitting device that is highly convenient, useful, or reliable. Another object of one embodiment of the present invention is to provide a novel light-emitting apparatus that is highly convenient, useful, or reliable. Another object of one embodiment of the present invention is to provide a novel light-emitting and light-receiving apparatus that is highly convenient, useful, or reliable. Another object of one embodiment of the present invention is to provide a novel electronic appliance that is highly convenient, useful, or reliable. Another object of one embodiment of the present invention is to provide a novel lighting device that is highly convenient, useful, or reliable.

Another object of one embodiment of the present invention is to provide a light-emitting device with high heat resistance. Another object of one embodiment of the present invention is to provide a light-emitting device with high heat resistance in a manufacturing process. Another object of one embodiment of the present invention is to provide a light-emitting device with high reliability. Another object of one embodiment of the present invention is to provide a light-emitting device, a light-emitting apparatus, a light-emitting and light-receiving apparatus, an electronic appliance, a display device, and an electronic device each with low power consumption. Another object of one embodiment of the present invention is to provide a light-emitting device, a light-emitting apparatus, a light-emitting and light-receiving apparatus, an electronic appliance, a display device, and an electronic device each with low power consumption and high reliability.

Note that the description of these objects does not preclude the existence of other objects. One embodiment of the present invention does not have to achieve all of these objects. Note that other objects will be apparent from the description of the specification, the drawings, the claims, and the like, and other objects can be derived from the description of the specification, the drawings, the claims, and the like.

Means for Solving the Problems

One embodiment of the present invention is a light-emitting device including a second electrode over a first electrode with an EL layer sandwiched therebetween; the EL layer includes at least a light-emitting layer, a first electron-transport layer, and a second electron-transport layer; the first electron-transport layer is over the light-emitting layer; the light-emitting device includes an insulating layer in contact with a side surface of the light-emitting layer and a side surface of the first electron-transport layer; the second electron-transport layer is over the first electron-transport layer; the insulating layer is positioned between the second electron-transport layer and the side surface of the light-emitting layer and the side surface of the first electron-transport layer; and the first electron-transport layer contains a heteroaromatic compound including at least one heteroaromatic ring and an organic compound different from the heteroaromatic compound.

Another embodiment of the present invention is a light-emitting device including a second electrode over a first electrode with an EL layer sandwiched therebetween; the EL layer includes at least a light-emitting layer, a first electron-transport layer, and a second electron-transport layer; the first electron-transport layer is over the light-emitting layer; the light-emitting device includes an insulating layer in contact with a side surface of the light-emitting layer and a side surface of the first electron-transport layer; the second electron-transport layer is over the first electron-transport layer; the insulating layer is positioned between the second electron-transport layer and the side surface of the light-emitting layer and the side surface of the first electron-transport layer; the first electron-transport layer contains a first heteroaromatic compound including at least one heteroaromatic ring and an organic compound different from the first heteroaromatic compound; and the second electron-transport layer contains a second heteroaromatic compound including at least one heteroaromatic ring.

In each of the light-emitting devices with the above structure, the organic compound preferably includes at least one heteroaromatic ring.

In each of the light-emitting devices with the above structure, the heteroaromatic ring preferably has any one of a pyridine skeleton, a diazine skeleton, a triazine skeleton, and a polyazole skeleton.

In each of the light-emitting devices with the above structure, the heteroaromatic ring further preferably includes a fused heteroaromatic ring having a fused ring structure.

In the light-emitting device with the above structure, the fused heteroaromatic ring is preferably any one of a quinoline ring, a benzoquinoline ring, a quinoxaline ring, a dibenzoquinoxaline ring, a quinazoline ring, a benzoquinazoline ring, a dibenzoquinoxaline ring, a phenanthroline ring, a furodiazine ring, and a benzimidazole ring.

Another embodiment of the present invention is a light-emitting apparatus including the light-emitting device with the above structure, and a transistor or a substrate.

Another embodiment of the present invention is a light-emitting apparatus including a first light-emitting device and a second light-emitting device that are adjacent to each other; the first light-emitting device includes a second electrode over a first electrode with a first EL layer sandwiched therebetween; the first EL layer includes at least a first light-emitting layer, a first electron-transport layer, and a second electron-transport layer; the first electron-transport layer is over the first light-emitting layer; the first light-emitting device includes a first insulating layer in contact with a side surface of the first light-emitting layer and a side surface of the first electron-transport layer; the second electron-transport layer is over the first electron-transport layer; the first insulating layer is positioned between the second electron-transport layer and the side surface of the first light-emitting layer and the side surface of the first electron-transport layer; the second light-emitting device includes the second electrode over a third electrode with a second EL layer sandwiched therebetween; the second EL layer includes at least a second light-emitting layer, a third electron-transport layer, and the second electron-transport layer; the third electron-transport layer is over the second light-emitting layer; the second light-emitting device includes a second insulating layer in contact with a side surface of the second light-emitting layer and a side surface of the third electron-transport layer; the second electron-transport layer is over the third electron-transport layer; the second insulating layer is positioned between the second electron-transport layer and the side surface of the second light-emitting layer and the side surface of the third electron-transport layer; each of the first electron-transport layer and the third electron-transport layer contains a heteroaromatic compound including at least one heteroaromatic ring and an organic compound different from the heteroaromatic compound.

Another embodiment of the present invention is a light-emitting apparatus including a first light-emitting device and a second light-emitting device that are adjacent to each other; the first light-emitting device includes a second electrode over a first electrode with a first EL layer sandwiched therebetween; the first EL layer includes at least a first light-emitting layer, a first electron-transport layer, and a second electron-transport layer; the first electron-transport layer is over the first light-emitting layer; the first light-emitting device includes a first insulating layer in contact with a side surface of the first light-emitting layer and a side surface of the first electron-transport layer; the second electron-transport layer is over the first electron-transport layer; the first insulating layer is positioned between the second electron-transport layer and the side surface of the first light-emitting layer and the side surface of the first electron-transport layer; the second light-emitting device includes the second electrode over a third electrode with a second EL layer sandwiched therebetween; the second EL layer includes at least a second light-emitting layer, a third electron-transport layer, and the second electron-transport layer; the third electron-transport layer is over the second light-emitting layer; the second light-emitting device includes a second insulating layer in contact with a side surface of the second light-emitting layer and a side surface of the third electron-transport layer; the second electron-transport layer is over the third electron-transport layer; the second insulating layer is positioned between the second electron-transport layer and the side surface of the second light-emitting layer and the side surface of the third electron-transport layer; each of the first electron-transport layer and the third electron-transport layer contains a first heteroaromatic compound including at least one heteroaromatic ring and an organic compound different from the first heteroaromatic compound; and the second electron-transport layer contains a second heteroaromatic compound including at least one heteroaromatic ring.

In each of the light-emitting apparatuses with the above structure, the organic compound preferably includes at least one heteroaromatic ring.

In each of the light-emitting apparatuses with the above structure, the heteroaromatic ring preferably has any one of a pyridine skeleton, a diazine skeleton, a triazine skeleton, and a polyazole skeleton.

In each of the light-emitting apparatuses with the above structure, the heteroaromatic ring preferably includes a fused heteroaromatic ring having a fused ring structure.

In the light-emitting apparatus with the above structure, the fused heteroaromatic ring is preferably any one of a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

In each of the light-emitting apparatuses with the above structure, the second electron-transport layer is preferably positioned between the second electrode and the side surface of the first electron-transport layer and the side surface of the first light-emitting layer and between the second electrode and the side surface of the third electron-transport layer and the side surface of the second light-emitting layer.

In addition to the above-described light-emitting devices, the present invention includes a light-emitting device including a layer (e.g., a cap layer) that is in contact with an electrode and contains an organic compound. In addition to the light-emitting devices, a light-emitting apparatus including a transistor, a substrate, and the like is also included in the scope of the invention. Furthermore, an electronic appliance or a lighting device including any of these light-emitting devices and any of a sensing portion, an input portion, a communication portion, and the like is also included in the scope of the invention.

In addition, the scope of one embodiment of the present invention includes a light-emitting apparatus including a light-emitting device, and a lighting device including the light-emitting apparatus. Accordingly, a light-emitting apparatus in this specification refers to an image display device or a light source (including a lighting device). In addition, a light-emitting apparatus includes a module in which a light-emitting apparatus is connected to a connector such as an FPC (Flexible Printed Circuit) or a TCP (Tape Carrier Package), a module in which a printed wiring board is provided on the tip of a TCP, or a module in which an IC (integrated circuit) is directly mounted on a light-emitting device by a COG (Chip On Glass) method.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the names of the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Effect of the Invention

One embodiment of the present invention can provide a novel light-emitting device that is highly convenient, useful, or reliable. Another embodiment of the present invention can provide a novel light-emitting apparatus that is highly convenient, useful, or reliable. Another embodiment of the present invention can provide a novel light-emitting and light-receiving apparatus that is highly convenient, useful, or reliable. Another embodiment of the present invention can provide a novel electronic appliance that is highly convenient, useful, or reliable. Another embodiment of the present invention can provide a novel lighting device that is highly convenient, useful, or reliable.

One embodiment of the present invention can provide a light-emitting device with high heat resistance. Another embodiment of the present invention can provide a light-emitting device with high heat resistance in a manufacturing process. Another embodiment of the present invention can provide a light-emitting device with high reliability. Another embodiment of the present invention can provide a light-emitting device, a light-emitting apparatus, a light-emitting and light-receiving apparatus, an electronic appliance, a display device, and an electronic device each with low power consumption. Another embodiment of the present invention can provide a light-emitting device, a light-emitting apparatus, a light-emitting and light-receiving apparatus, an electronic appliance, a display device, and an electronic device each with low power consumption and high reliability.

Note that the description of these effects does not preclude the existence of other effects. One embodiment of the present invention does not need to have all of these effects. Note that other effects will be apparent from the description of the specification, the drawings, the claims, and the like, and other effects can be derived from the description of the specification, the drawings, the claims, and the like.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In this embodiment, a structure of a light-emitting device of one embodiment of the present invention will be described with reference to FIG. 1.

Figure 1A:
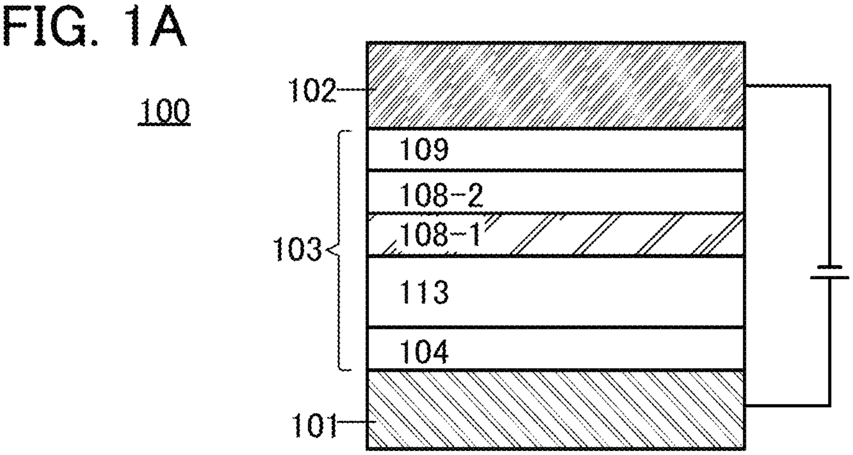
FIG. 1A to FIG. 1C are diagrams each illustrating a structure of a light-emitting device of an embodiment.
Figure 1B:
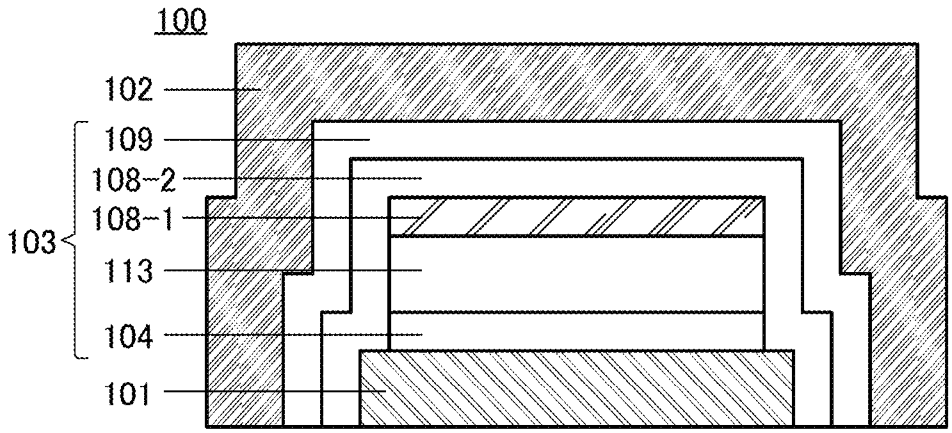
Figure 1C:
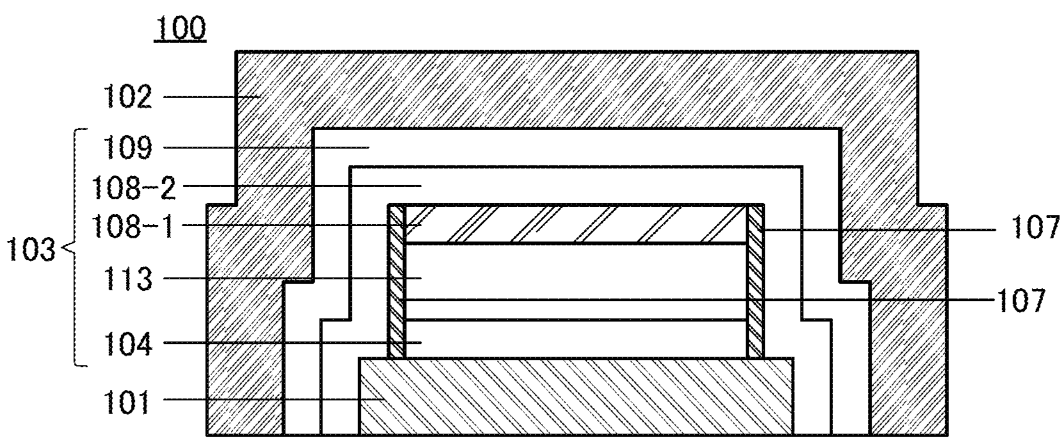

FIG. 1A is a cross-sectional view illustrating a structure of a light-emitting device 100 of one embodiment of the present invention. FIG. 1B and FIG. 1C are cross-sectional views each illustrating a more specific structure of the light-emitting device 100.

As illustrated in FIG. 1A, FIG. 1B, and FIG. 1C, the light-emitting device 100 includes a first electrode 101, a second electrode 102, and has a structure in which a hole-injection/transport layer 104, a light-emitting layer 113, a first electron-transport layer 108-1, a second electron-transport layer 108-2, and an electron-injection layer 109 are sequentially stacked between the first electrode 101 and the second electrode 102.

The first electron-transport layer 108-1 contains a heteroaromatic compound including at least one heteroaromatic ring and an organic compound different from the heteroaromatic compound. Each of the heteroaromatic compound and the organic compound in the first electron-transport layer 108-1 is contained preferably at 10% or higher, further preferably 20% or higher, still further preferably at 30% or higher, in which case an effect of improving heat resistance is noticeably observed. The organic compound preferably includes at least one heteroaromatic ring. In other words, the first electron-transport layer 108-1 contains a heteroaromatic compound and an organic compound or contains a plurality of kinds of heteroaromatic compounds (the first electron-transport layer 108-1 is preferably a film of a mixture of the above compounds). In the case where the heteroaromatic ring included in the heteroaromatic compound is a fused heteroaromatic ring, the thermophysical property such as a glass transition temperature (Tg) is improved; however, in the case of a film containing a single heteroaromatic compound, it has a strong interaction between molecules to have difficulty in forming a complete glass state and accordingly leads to a problem of crystallization occurring easily over time even at a temperature lower than or equal to Tg. In one embodiment of the present invention, even when the heteroaromatic ring is a fused heteroaromatic ring, the effect of the above organic compound on inhibition of the crystallization can be obtained. That is, one embodiment of the present invention enables the improvement in the glass transition temperature and the prevention of a phenomenon where the film is crystallized at Tg or lower.

Note that the heteroaromatic compound is one of organic compounds and includes at least one heteroaromatic ring.

The heteroaromatic ring has any one of a pyridine skeleton, a diazine skeleton, a triazine skeleton, and a polyazole skeleton.

The heteroaromatic ring includes a fused heteroaromatic ring having a fused ring structure.

Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

When the first electron-transport layer 108-1 contains a heteroaromatic compound and an organic compound or contains a plurality of kinds of heteroaromatic compounds, crystallization induced by heating can be inhibited as compared to the case where the first electron-transport layer 108-1 contains a single material. Thus, heat resistance of the first electron-transport layer 108-1 can be improved. Hence, the first electron-transport layer 108-1 has higher heat resistance than the second electron-transport layer 108-2.

Although the second electron-transport layer 108-2 can be any of a layer containing one kind of heteroaromatic compound, a layer containing a heteroaromatic compound and an organic compound, and a layer containing a plurality of kinds of heteroaromatic compounds, it is preferable to contain at least a second heteroaromatic compound including one heteroaromatic ring which is different from the heteroaromatic compound contained in the first electron-transport layer 108-1.

Electron-transport materials such as heteroaromatic compounds and organic compounds that can be used for the first electron-transport layer 108-1 and the second electron-transport layer 108-2 will be described more in detail in the following embodiment. In the light-emitting device of one embodiment of the present invention, it is preferable that a metal complex not be contained in the electron-transport layer. As the metal complex, an alkaline earth metal complex and an alkali metal complex, and in particular, an alkali metal quinolinolato complex and an alkaline earth metal quinolinolato complex can be given.

The electron-transport layer 108-2 and the electron-injection layer 109 are included in the EL layer 103 as part thereof but have shapes different from those of the other layers in the EL layer 103 (the hole-injection/transport layer 104, the light-emitting layer 113, and the first electron-transport layer 108-1). In a general case where some layers in an EL layer have shapes different from those of the other layers, the temperatures during the manufacturing processing of the layers are higher, which causes a problem of crystallization occurring in the other layers. In such a case, the reliability and luminance of a light-emitting device may be reduced. However, in the manufacturing process of the light-emitting device 100, the possibility of high-temperature processing is caused after the first electron-transport layer 108-1 with higher heat resistance is formed. Thus, the reliability and luminance of the light-emitting device 100 can be inhibited from being reduced. Accordingly, in the light-emitting device 100, the electron-transport layer 108-2 and the electron-injection layer 109 can have shapes different from those of the other layers (the hole-injection/transport layer 104, the light-emitting layer 113, and the first electron-transport layer 108-1) in the EL layer 103.

As illustrated in FIG. 1B and FIG. 1C, the electron-transport layer 108-2, the electron-injection layer 109, and the second electrode 102 can be formed in the same shape. The electron-injection layer 109 and the second electrode 102 can be shared by a plurality of light-emitting devices; hence, the fabrication process of the light-emitting device 100 can be simplified and the throughput can be improved.

In the EL layer 103, the electron-transport layer 108-2 and the electron-injection layer 109 are formed using a mask different from a mask used for processing the other layers in the EL layer 103 (the hole-injection/transport layer 104, the light-emitting layer 113, and the first electron-transport layer 108-1), so that the electron-transport layer 108-2 and the electron-injection layer 109 can be formed in shapes different from those of the other layers. In other words, the different shapes mean those seen in the plan view (the top view).

In the case where the layers in the EL layer are formed in the same shape, the layers are processed with use of one mask, whereby the same shape seen in the plan view (the top view) can be obtained.

Accordingly, end portions (side surfaces) of the hole-injection/transport layer 104, the light-emitting layer 113, and the first electron-transport layer 108-1 have substantially the same surface (or are positioned on substantially the same plane). On the other hand, end portions (side surfaces) of the electron-transport layer 108-2 and the electron-injection layer 109 are not positioned on substantially the same plane as the end portions (side surfaces) of the other layers in the EL layer 103 (the hole-injection/transport layer 104, the light-emitting layer 113, and the first electron-transport layer 108-1).

As illustrated in FIG. 1C, the light-emitting device 100 may include an insulating layer 107. The insulating layer 107 is in contact with the side surface of the hole-injection/transport layer 104, the side surface of the light-emitting layer 113, and the side surface of the first electron-transport layer 108-1. The insulating layer 107 is positioned between the second electron-transport layer 108-2 and each of the side surface of the hole-injection/transport layer 104, the side surface of the light-emitting layer 113, and the side surface of the first electron-transport layer 108-1.

With the insulating layer 107, the side surface of the hole-injection/transport layer 104, the side surface of the light-emitting layer 113, and the side surface of the first electron-transport layer 108-1 can be protected. As illustrated in FIG. 1C, even in a structure where the second electrode 102 is close to the side surface of the hole-injection/transport layer 104, the side surface of the light-emitting layer 113, and the side surface of the first electron-transport layer 108-1, electrical continuity between the second electrode 102 and the hole-injection/transport layer 104 can be prevented in some cases. Furthermore, electrical continuity between the second electrode 102 and the first electrode 101 can be prevented in some cases. Consequently, the light-emitting device 100 can employ a variety of structures. For example, when a plurality of light-emitting devices 100 are arranged, the electron-injection layers 109 included in the adjacent light-emitting devices 100 can be connected to each other, and the second electrodes 102 included in the adjacent light-emitting devices 100 can be connected to each other.

As illustrated in FIG. 1B, the light-emitting device 100 without the insulating layer 107 may be employed in some cases. For example, when electrical continuity between the second electrode 102 and the hole-injection/transport layer 104 is sufficiently low, the light-emitting device 100 does not necessarily include the insulating layer 107. Furthermore, when electrical continuity between the second electrode 102 and the first electrode 101 is sufficiently low, the light-emitting device 100 does not necessarily include the insulating layer 107.

Materials that can be used for the first electrode 101, the second electrode 102, the hole-injection/transport layer 104, the light-emitting layer 113, the electron-injection layer 109, and the insulating layer 107 will be described in the following embodiment.

The structures described in this embodiment can be used in an appropriate combination with the structures described in the other embodiments.

Embodiment 2

In this embodiment, a light-emitting device using the organic compound described in Embodiment 1 will be described with reference to FIG. 2A and FIG. 2B.

<<Specific Structure of Light-Emitting Device>>

Figure 2A:
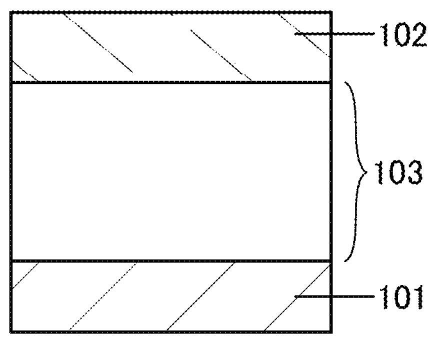
FIG. 2A and FIG. 2B are diagrams each illustrating a structure of a light-emitting device of an embodiment.
Figure 2B:
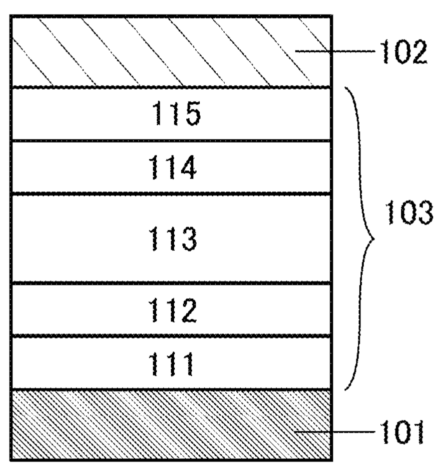

The light-emitting device illustrated in FIG. 2A and FIG. 2B has a structure in which an EL layer is sandwiched between a pair of electrodes (single structure).

<<First Electrode and Second Electrode>>

As materials for forming the first electrode 101 and the second electrode 102, any of the following materials can be used in an appropriate combination as long as the functions of the electrodes described above can be fulfilled. For example, a metal, an alloy, an electrically conductive compound, and a mixture of these can be used as appropriate. Specifically, an In—Sn oxide (also referred to as ITO), an In—Si—Sn oxide (also referred to as ITSO), an In—Zn oxide, or an In—W—Zn oxide can be given. It is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (e.g., lithium (Li), cesium (Cs), calcium (Ca), or strontium (Sr)), a rare earth element such as europium (Eu) or ytterbium (Yb), an alloy containing an appropriate combination of any of these elements, graphene, or the like.

In the light-emitting device illustrated in FIG. 2A and FIG. 2B, the EL layer 103 is formed over the first electrode 101 by a vacuum evaporation method. Specifically, as illustrated in FIG. 2B, a hole-injection layer 111, a hole-transport layer 112, the light-emitting layer 113, an electron-transport layer 114, and an electron-injection layer 115 are sequentially stacked as the EL layer 103 between the first electrode 101 and the second electrode by a vacuum evaporation method when the first electrode 101 is an anode.

<Hole-Injection Layer>

The hole-injection layer 111 is a layer injecting holes from the first electrode 101 that is an anode to the EL layer 103, and is a layer containing an organic acceptor material or a material with a high hole-injection property.

The organic acceptor material in one organic compound allows holes to be generated in another organic compound whose HOMO level is close to the LUMO (lowest unoccupied molecular orbital) level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, or a hexaazatriphenylene derivative, can be used. For example, it is possible to use, 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), 2-(7-dicyanomethylen-1,3,4,5,6,8,9,10-octafluoro-7H-pyren-2-ylidene)malononitrile, or the like can be used. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. Alternatively, a [3]radialene derivative having an electron-withdrawing group (in particular, a cyano group or a halogen group such as a fluoro group) has a very high electron-accepting property and thus is preferable. Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

As the material having a high hole-injection property, an oxide of a metal belonging to Group 4 to Group 8 in the periodic table (e.g., a transition metal oxide such as a molybdenum oxide, a vanadium oxide, a ruthenium oxide, a tungsten oxide, or a manganese oxide) can be used. As specific examples, molybdenum oxide, vanadium oxide, niobium oxide, tantalum oxide, chromium oxide, tungsten oxide, manganese oxide, and rhenium oxide can be given. In particular, molybdenum oxide is preferable because it is stable in the air, has a low hygroscopic property, and is easily handled. It is also possible to use a phthalocyanine-based compound such as phthalocyanine (abbreviation: $H_2Pc$) or copper phthalocyanine (abbreviation: CuPc), or the like.

In addition to the above materials, it is also possible to use an aromatic amine compound, which is a low molecular compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), or poly[N,N-bis(4-butylphenyl)-N,N-bis(phenyl)benzidine] (abbreviation: Poly-TPD). It is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS).

Alternatively, as the material having a high hole-injection property, a composite material containing a hole-transport material and the above-described organic acceptor material (electron-accepting material) can be used. In this case, the organic acceptor material extracts electrons from a hole-transport material, so that holes are generated in the hole-injection layer 111 and the holes are injected into the light-emitting layer 113 through the hole-transport layer 112. Note that the hole-injection layer 111 may be formed as a single layer made of a composite material containing a hole-transport material and an organic acceptor material (electron-accepting material), or may be formed by stacking a layer containing a hole-transport material and a layer containing an organic acceptor material (electron-accepting material).

The hole-transport material is preferably a substance having a hole mobility higher than or equal to $1\times10^{-6}$ $cm^2/Vs$ in the case where the square root of the electric field strength [V/cm] is 600. Note that other substances can be used as long as they have a property of transporting more holes than electrons.

As the hole-transport material, a material having a high hole-transport property, such as a π-electron rich heteroaromatic compound (e.g., a carbazole derivative, a furan derivative, or a thiophene derivative) or an aromatic amine (an organic compound having an aromatic amine skeleton), is preferable.

Examples of the above carbazole derivative (an organic compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the above aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N'-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N-diphenyl-9,9-dimethylfluorene-2,7-diamine (abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (the organic compound having a furan skeleton) include 4,4',4"-(benzene-1,3,5-triyl)tri(dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the thiophene derivative (the organic compound having a thiophene skeleton) include 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)-triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N-bis(4-butylphenyl)-N,N-bis(phenyl)benzidine] (abbreviation: Poly-TPD) as a hole-transport material. It is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS).

Note that the hole-transport material is not limited to the above, and one or a combination of various known materials may be used as the hole-transport material.

Note that the hole-injection layer 111 can be formed by any of various known deposition methods, and can be formed by a vacuum evaporation method, for example.

<Hole-Transport Layer>

The hole-transport layer 112 is a layer transporting holes, which are injected from the first electrode 101 through the hole-injection layer 111, to the light-emitting layer 113. Note that the hole-transport layer 112 is a layer containing a hole-transport material. Thus, for the hole-transport layer 112, a hole-transport material that can be used for the hole-injection layer 111 can be used.

Note that in the light-emitting device of one embodiment of the present invention, the same organic compound can be used for the hole-transport layer 112 and the light-emitting layer 113. This is preferable because the use of the same organic compounds for the hole-transport layer 112 and the light-emitting layer 113 allows efficient hole transport from the hole-transport layer 112 to the light-emitting layer 113.

<Light-Emitting Layer>

The light-emitting layer 113 is a layer containing a light-emitting substance. For the light-emitting substance that can be used for the light-emitting layer 113, it is possible to use a substance that exhibits emission color of blue, purple, bluish purple, green, yellowish green, yellow, orange, red, or the like can be used as appropriate. When different light-emitting substances are used for a plurality of light-emitting layers, different emission colors can be exhibited (for example, complementary emission colors are combined to obtain white light emission). Furthermore, a stacked-layer structure in which one light-emitting layer contains different light-emitting substances may be employed.

The light-emitting layer 113 may each contain one or more kinds of organic compounds (a host material and the like) in addition to a light-emitting substance (a guest material).

In the case where a plurality of host materials are used in the light-emitting layer 113, a second host material that is additionally used is preferably a substance having a larger energy gap than those of a known guest material and a first host material. Preferably, the lowest singlet excitation energy level (S1 level) of the second host material is higher than that of the first host material, and the lowest triplet excitation energy level (T1 level) of the second host material is higher than that of the guest material. Furthermore, the lowest triplet excitation energy level (T1 level) of the second host material is preferably higher than the T1 level of the first host material. With such a structure, an exciplex can be formed by the two kinds of host materials. In order to form an exciplex efficiently, it is particularly preferable to combine a compound that easily accepts holes (a hole-transport material) and a compound that easily accepts electrons (an electron-transport material). With the structure, high efficiency, low voltage, and a long lifetime can be achieved at the same time.

As an organic compound used as the host material (including the first host material and the second host material), organic compounds such as the hole-transport material usable for the hole-transport layer 112 described above and an electron-transport material usable for the electron-transport layer 114 described later can be used as long as they satisfy requirements for the host material used in the light-emitting layer. Another example is an exciplex formed by two or more kinds of organic compounds (the first host material and the second host material). An exciplex (also referred to as Exciplex) whose excited state is formed by a plurality of kinds of organic compounds has an extremely small difference between the S1 level and the T1 level and functions as a TADF material that can convert triplet excitation energy into singlet excitation energy. As a combination of the plurality of kinds of organic compounds forming an exciplex, for example, it is preferable that one have a π-electron deficient heteroaromatic compound and the other have a π-electron rich heteroaromatic compound. A phosphorescent substance such as an iridium-, rhodium-, or platinum-based organometallic complex or a metal complex may be used as one of the combination forming an exciplex.

There is no particular limitation on the light-emitting substance that can be used for the light-emitting layer 113, and it is possible to use a light-emitting substance that converts singlet excitation energy into light in the visible light range or a light-emitting substance that converts triplet excitation energy into light in the visible light range.

<<Light-Emitting Substance that Converts Singlet Excitation Energy into Light>>

The following substances emitting fluorescent light (fluorescent substances) are given as the light-emitting substance that can be used for the light-emitting layer 113 and convert singlet excitation energy into light emission. Examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis [3-(9-phenyl-9H-fluoren-9-yl)phenyl]pyrene-1,6-diamine (abbreviation: 1,6mMemFLPAPrn), N,N-diphenyl-N,N-bis [4-(9-phenyl-9H-fluoren-9-yl)phenyl]pyrene-1,6-diamine (abbreviation: 1,6FLPAPrn), N,N-bis(dibenzofuran-2-yl)-N, N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl) bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl) bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8, 11-tetra-tert-butylperylene (abbreviation: TBP), N,N'-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), or the like.

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N,N-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis (1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1, 1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1, 7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino) phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPrn-03, 3,10-bis[N-(9-phenyl-9H-carbazol-2-yl)-N-phenylamino]naphtho[2,3-b;6, 7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf (IV)-02). In particular, pyrenediamine compounds such as 1,6FLPAPrn, 1,6mMemFLPAPrn, and 1,6BnfAPrn-03 can be used, for example.

<<Light-Emitting Substance that Converts Triplet Excitation Energy into Light>>

Next, as examples of the light-emitting substance that converts triplet excitation energy into light and can be used for the light-emitting layer 113, a substance that emits phosphorescent light (a phosphorescent substance) and a thermally activated delayed fluorescent (TADF) material that exhibits thermally activated delayed fluorescence are given.

A phosphorescent substance refers to a compound that exhibits phosphorescence but does not exhibit fluorescence at a temperature higher than or equal to low temperatures (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), a rare earth metal complex, or the like. Specifically, a transition metal element is preferable and it is particularly preferable that a platinum group element (ruthenium (Ru), rhodium (Rh), palladium (Pd), osmium (Os), iridium (Ir), or platinum (Pt)), especially iridium, be contained, in which case the transition probability relating to direct transition between the singlet ground state and the triplet excited state can be increased.

<<Phosphorescent Substance (from 450 nm to 570 nm: Blue or Green)>>

As a phosphorescent substance that emits blue or green light and whose emission spectrum has a peak wavelength greater than or equal to 450 nm and less than or equal to 570 nm, the following substances can be given.

The examples include: organometallic complexes having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir (iPrptz-3b)$_3$]), and tris[3-(5-biphenyl)-5-isopropyl-4-phenyl-4H-1,2,4-triazolato]iridium(III) (abbreviation: [Ir (iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir (Mptz1-mp)$_3$]) and tris(1-methyl-5-phenyl-3-propyl-1H-1, 2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris [3-(2,6-dimethylphenyl)-7-methylimidazo[1,2-f] phenanthridinato]iridium(III) (abbreviation: [Ir(dmpimpt- Me)$_3$]); and organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$] iridium(III) picolinate (abbreviation: FIrpic), bis{2-[3',5'-bis (trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

<<Phosphorescent Substance (from 495 nm to 590 nm: Green or Yellow)>>

As a phosphorescent substance that exhibits green or yellow and whose emission spectrum has a peak wavelength greater than or equal to 495 nm and less than or equal to 590 nm, the following substances can be given.

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN$^3$]phenyl-κC}iridium (III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato) bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir (ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir (bzq)$_2$(acac)]), tris(benzo[h]quinolinato)iridium(III) (abbreviation: [Ir(bzq)$_3$]), tris(2-phenylquinolinato-N,C$^{2'}$)iridium (III) (abbreviation: [Ir(pq)$_3$]), bis(2-phenylquinolinato-N,C$^{2'}$)iridium(III) acetylacetonate (abbreviation: [Ir(pq)$_2$(acac)]), bis[2-(2-pyridinyl-κN)phenyl-κC][2-(4-phenyl-2-pyridinyl-AN)phenyl-κC]iridium(III) (abbreviation: [Ir (ppy)$_2$(4dppy)]), bis[2-(2-pyridinyl-AN)phenyl-κC][2-(4-methyl-5-phenyl-2-pyridinyl-AN)phenyl-κC], [2-d$_3$-methyl-8-(2-pyridinyl-κN)benzofuro[2,3-b]pyridine-κC]bis [2-(5-d$_3$-methyl-pyridinyl-κN$^2$)phenyl-κC]iridium(III) (abbreviation: Ir(5mppy-d$_3$)$_2$(mbfpypy-d$_3$)), 2-(methyl-d$_3$)-8-[4-(1-methylethyl-1-d)-2-pyridinyl-κN]benzofuro[2,3-b] pyridin-7-yl-κC]bis[5-(2-methyl-d$_3$)-2-[5-(methyl-d$_3$)-2-[5-(methyl-d$_3$)-2-pyridinyl-κN]phenyl-κC]iridium(III) (abbreviation: Ir(5mtpy-d$_5$)$_2$(mbfpypy-iPr-d$_4$)), [2-d$_3$-methyl-(2-pyridinyl-κN)benzofuro[2,3-b]pyridine-κC]bis [2-(2-pyridinyl-κN)phenyl-κC]iridium(III) (abbreviation: Ir(ppy)$_2$(mbfpypy-d$_3$)), and [2-(4-methyl-5-phenyl-2-pyridinyl-κN)phenyl-κC]bis[2-(2-pyridinyl-κN)phenyl-κC] iridium (abbreviation: [Ir(ppy)$_2$(mdppy)]); organometallic complexes such as bis(2,4-diphenyl-1,3-oxazolato-N,C$^{2'}$) iridium(III) acetylacetonate (abbreviation: [Ir(dpo)$_2$(acac)]), bis{2-[4'-(perfluorophenyl)phenyl]pyridinato-N,C$^{2'}$} iridium(III) acetylacetonate (abbreviation: [Ir(p-PF-ph)$_2$(acac)]), and bis(2-phenylbenzothiazolato-N,C$^{2'}$)iridium (III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

<<Phosphorescent Substance (from 570 nm to 750 nm: Yellow or Red)>>

As a phosphorescent substance that exhibits yellow or red and whose emission spectrum has a peak wavelength greater than or equal to 570 nm and less than or equal to 750 nm, the following substances can be given.

For example, organometallic complexes having a pyrimidine skeleton, such as (diisobutyrylmethanato)bis[4,6-bis(3-methylphenyl)pyrimidinato]iridium(III) (abbreviation: [Ir (5mdppm)$_2$(dibm)]), bis[4,6-bis(3-methylphenyl)pyrimidinato](dipivaloylmethanato)iridium(III) (abbreviation: [Ir (5mdppm)$_2$(dpm)]), and (dipivaloylmethanato)bis[4,6-di (naphthalen-1-yl)pyrimidinato]iridium(III) (abbreviation: [Ir(d1npm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium (III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), bis[2-[5-(2,6-dimethylphenyl)-3-(3,5-dimethylphenyl)-2-pyrazinyl-κN]-4,6-dimethylphenyl-κC] (2,2',6,6'-tetramethyl-3,5-heptadionato-κ2O,O')iridium(III) (abbreviation: [Ir(dmdppr-dmp)$_2$(dpm)]), (acetylacetonato) bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir (dpq)$_2$(acac)]), and (acetylacetonato)bis[2,3-bis(4-fluorophenyl)quinoxalinato]iridium(III) (abbreviation: [Ir (Fdpq)$_2$(acac)]); organometallic complexes having a pyridine skeleton, such as tris(1-phenylisoquinolinato-N, C$^{2'}$)iridium(III) (abbreviation: [Ir(piq)$_3$]), bis(1-phenylisoquinolinato-N,C$^{2'}$)iridium(III) acetylacetonate (abbreviation: [Ir(piq)$_2$(acac)]), and bis[4,6-dimethyl-2-(2-quinolinyl-κN)phenyl-κC](2,4-pentanedionato-κ$^2$O,O')iridium(III) (abbreviation: [Ir(dmpqn)$_2$(acac)]); platinum complexes such as 2,3,7,8,12,13,17,18-octaethyl-21H,23H-porphyrin-platinum(II) (abbreviation: [PtOEP]); and rare earth metal complexes such as tris(1,3-diphenyl-1,3-propanedionato) (monophenanthroline)europium(III) (abbreviation: [Eu (DBM)$_3$(Phen)]) and tris[1-(2-thenoyl)-3,3,3-trifluoroacetonato](monophenanthroline)europium(III) (abbreviation: [Eu (TTA)$_3$(Phen)]) can be given.

<<TADF Material>>

Any of materials shown below can be used as the TADF material. The TADF material refers to a material that has a small energy difference (preferably, less than or equal to 0.2 eV) between the S1 level and the T1 level, can up-convert triplet excited state into singlet excited state (reverse intersystem crossing) using a little thermal energy, and efficiently exhibits light emission (fluorescence) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Note that delayed fluorescence by the TADF material refers to light emission having a spectrum similar to that of normal fluorescence and an extremely long lifetime. The lifetime is $1\times10^{-6}$ seconds or longer, preferably $1\times10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical Formula 1]

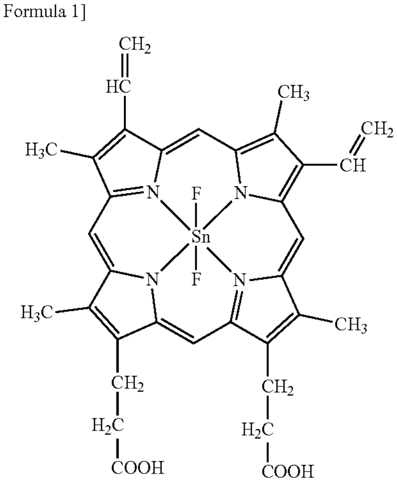

$SnF_2$(Proto IX)

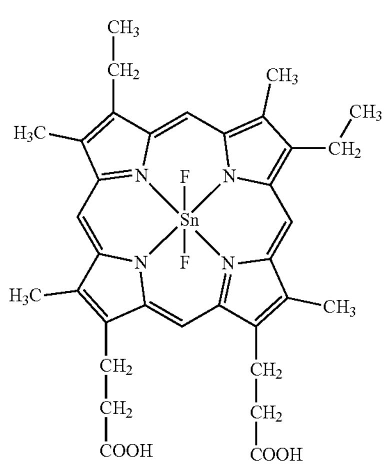

$SnF_2$(Meso IX)

-continued

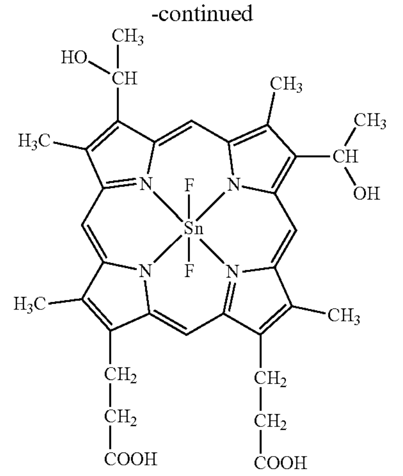

$SnF_2$(Hemato IX)

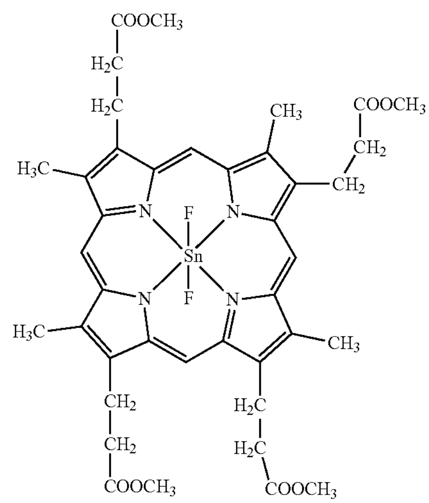

$SnF_2$(Copro III-4Me)

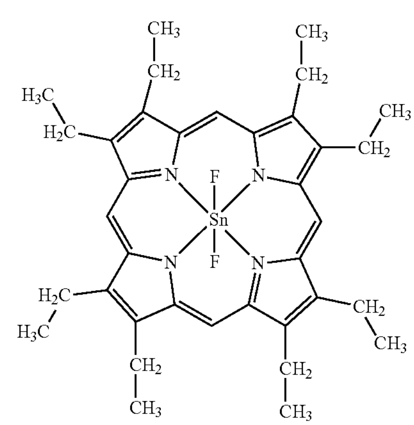

$SnF_2$(OEP)

-continued

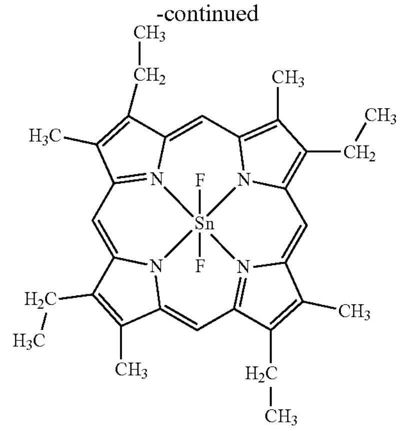

$SnF_2$(Etio I)

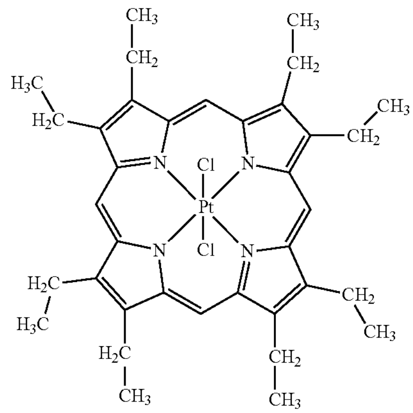

$PtCl_2$OEP

Alternatively, a heteroaromatic compound having a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), and 9-[3-(4,6-diphenyl-1,3,5-triazin-2-yl)phenyl]-9'-phenyl-2,3'-bi-9H-carbazole (abbreviation: mPCCzPTzn-02), may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small.

[Chemical Formula 2]

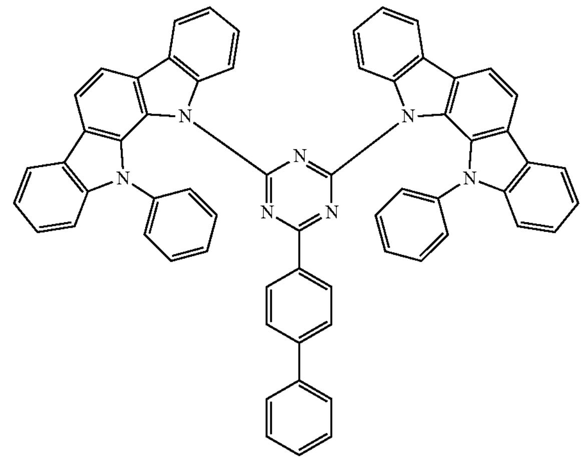

PIC-TRZ

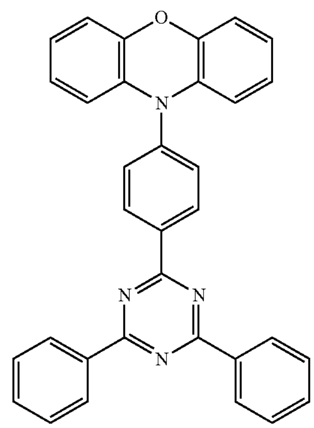

PXZ-TRZ

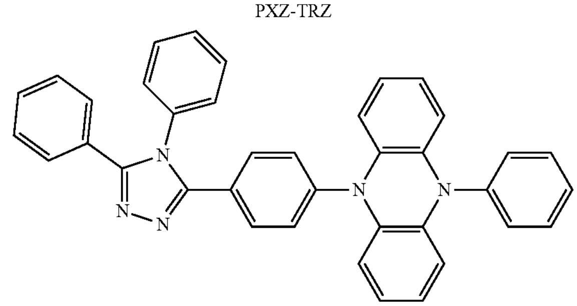

PPZ-3TPT

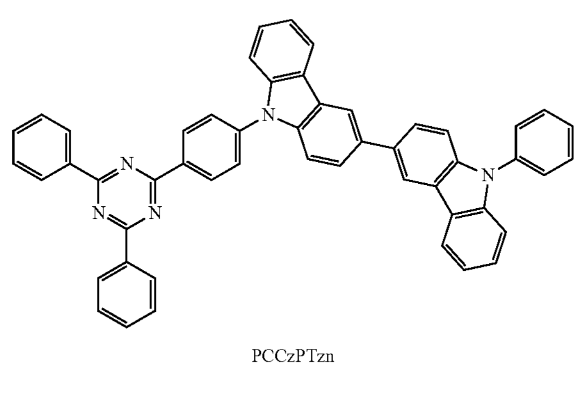

PCCzPTzn

-continued

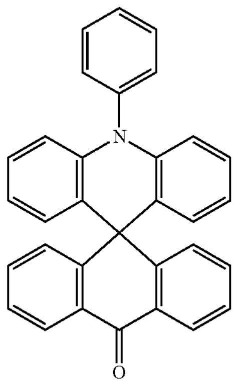

ACRSA

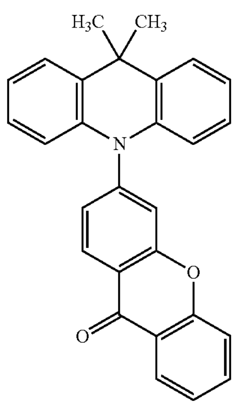

ACRXTN

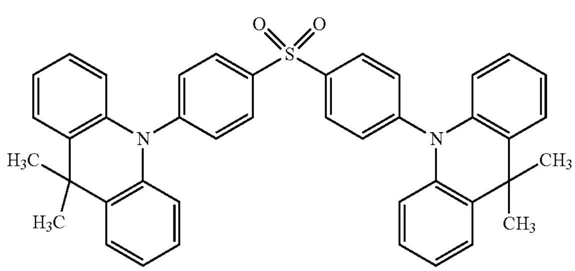

DMAC-DPS

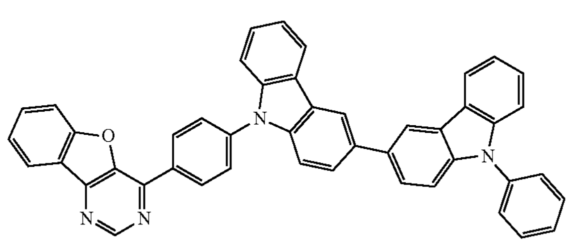

4PCCzPBfpm

-continued

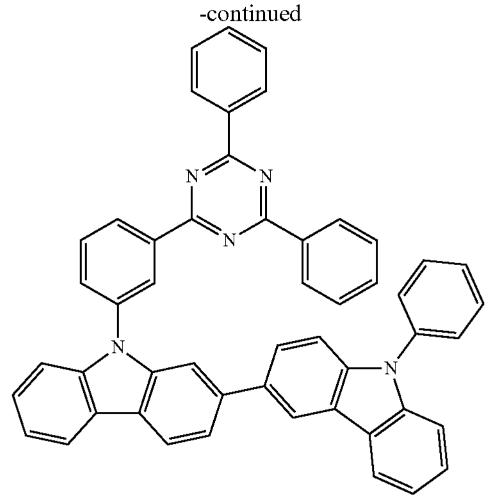

mPCCzPTzn-02

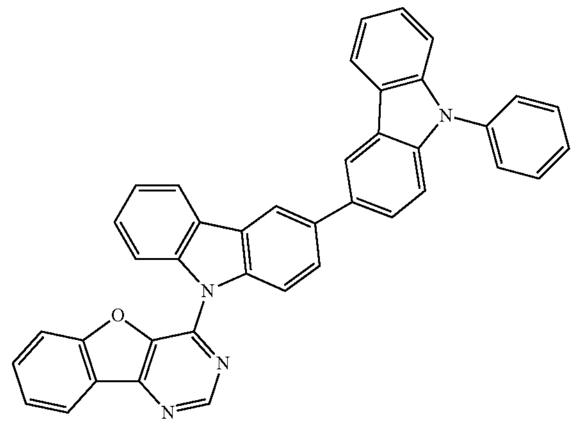

4PCCzBfpm

In addition to the above, as the material that has a function of converting triplet excitation energy into light emission, a nanostructure of a transition metal compound having a perovskite structure is also given. In particular, a nanostructure of a metal-halide perovskite material is preferable. The nanostructure is preferably a nanoparticle or a nanorod.

As the organic compounds (the host material and the like) used in combination with any of the above light-emitting substances (guest material) in the light-emitting layer 113, one or more kinds of substances having a larger energy gap than the light-emitting substance (the guest material) are selected to be used.

<<Host Material for Fluorescent Light>>

In the case where the light-emitting substance used in the light-emitting layer 113 is a fluorescent light-emitting material, an organic compound (a host material) used in combination with the light-emitting substance is preferably an organic compound that has a high energy level in a singlet excited state and has a low energy level in a triplet excited state or an organic compound having a fluorescence quantum yield. Therefore, the hole-transport material (described above) or the electron-transport material (described below) in this embodiment, for example, can be used as long as it is an organic compound that satisfies such a condition.

Examples of the organic compound in terms of a combination with a light-emitting substance (fluorescent light-emitting substance) include condensed polycyclic aromatic compounds such as an anthracene derivative, a tetracene derivative, a phenanthrene derivative, a pyrene derivative, a chrysene derivative, and a dibenzo[g,p]chrysene derivative, part of which are the same as the above-described compounds.

Specific examples of the organic compound (the host materials) preferably used in combination with a fluorescent light-emitting material include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N',N',N'',N''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9-(1-naphthyl)-10-(2-naphthyl)anthracene (abbreviation: α,βADN), 2-(10-phenyl-9-anthracen-9-yl)dibenzofuran, 2-(10-phenyl-9-anthracenyl)-benzo[b]naphtho[2,3-d]furan (abbreviation: Bnf(II)PhA), 9-(1-naphthyl)-10-[4-(2-naphthyl)phenyl]anthracene (abbreviation: αN-βNAnth), 9-2-(naphthyl)-10-[3-(2-naphthyl)phenyl]anthracene (abbreviation: βN-mβNPAnth), 1-[4-[10-(1,1'-biphenyl-4-yl-9-anthracenyl)phenyl]-2-ethyl-1H-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and 5,12-diphenyltetracene, 5,12-bis(biphenyl-2-yl)tetracene.

<<Host Material for Phosphorescent Light>>

In the case where the light-emitting substance used for the light-emitting layer 113 is a phosphorescent material, an organic compound having triplet excitation energy (energy difference between a ground state and a triplet excited state) which is higher than that of the light-emitting substance is preferably selected as the organic compound (the host material) used in combination with the light-emitting substance. Note that in the case where a plurality of organic compounds (e.g., a first host material and a second host material (or an assist material)) are used in combination with a light-emitting substance in order to form an exciplex, the plurality of organic compounds are preferably mixed with a phosphorescent material.

Such a structure makes it possible to efficiently obtain light emission utilizing ExTET (Exciplex-Triplet Energy Transfer), which is energy transfer from an exciplex to a light-emitting substance. Note that a combination of the plurality of organic compounds that easily forms an exciplex is preferably employed, and it is particularly preferable to combine a compound that easily accepts holes (a hole-transport material) and a compound that easily accepts electrons (an electron-transport material).

From the viewpoint of a preferred combination with the light-emitting substance (phosphorescent substance), the examples of the organic compounds (the host material and the assist material), but some of them partly overlapping the above specific examples, include an aromatic amine (an organic compound having an aromatic amine skeleton), a carbazole derivative (an organic compound having a carbazole skeleton), a dibenzothiophene derivative (an organic compound having a dibenzothiophene skeleton), a dibenzofuran derivative (an organic compound having a dibenzofuran skeleton), an oxadiazole derivative (an organic compound having an oxadiazole skeleton), a triazole derivative (an organic compound having an triazole skeleton), a benzimidazole derivative (an organic compound having an benzimidazole skeleton), a quinoxaline derivative (an organic compound having a quinoxaline skeleton), a dibenzoquinoxaline derivative (an organic compound having a dibenzoquinoxaline skeleton), a pyrimidine derivative (an organic compound having a pyrimidine skeleton), a triazine derivative (an organic compound having a triazine skeleton), a pyridine derivative (an organic compound having a pyridine skeleton), a bipyridine derivative (an organic compound having a bipyridine skeleton), a phenanthroline derivative (an organic compound having a phenanthroline skeleton), a furodiazine derivative (an organic compound having a furodiazine skeleton), and zinc- and aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II), which are preferably used as a host material.

In addition to the above, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used as a preferable host material.

Among the above organic compounds, specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property (electron-transport material), include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-5-(4-tert-butylphenyl)-4-phenyl-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOS), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f;h]quinoxaline (abbreviation: 6mDBTPDBq-II), 2-{4-[9,10-di(2-naphthyl)-2-anthryl]phenyl}-1-phenyl-1H-benzoimidazole (abbreviation: ZADN), and 2-[4'-(9-phenyl-9H-carbazole-3-yl)-3,1'-biphenyl-1-yl] dibenzo[f;h]quinoxaline (abbreviation: 2mpPCBPDBq). These materials are preferably used as a host material.

Among the above organic compounds, specific examples of the pyridine derivative, the diazine derivative (including the pyrimidine derivative, the pyrazine derivative, and the pyridazine derivative), the triazine derivative, and the furodiazine derivative, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl) phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3'-(9,9-dimethyl-9H-fluoren-2-yl)-1,1'-biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-[3'-(dibenzothiophen-4-yl)biphenyl-3-yl]naphtho[1',2':4,5]furo[2,3-b]pyrazine (abbreviation: 9mDBtBPNfpr), 9-[(3'-dibenzothiophen-4-yl)biphenyl-4-yl]naphtho[1',2':4,5]furo[2,3-b]pyrazine (abbreviation: 9pmDBtBPNfpr), 5-[3-(4,6-diphenyl-1,3,5-triazin-2-yl) phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl]-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm). Such organic compounds are preferable as the host material.

Among the above organic compounds, specific examples of the metal complexes, which are organic compounds having a high electron-transport property, include zinc- and aluminum-based metal complexes, such as tris(8-quinolinolato)aluminum(III) (abbreviation: $Alq_3$), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato) aluminum(III) (abbreviation: BAlq), and bis(8-quinolinolato)zinc(II) (abbreviation: Znq), and metal complexes having a quinoline skeleton or a benzoquinoline skeleton. Any of these is preferable as the host material.

Furthermore, a high molecular compound such as poly (2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy), or the like is preferably used as a host material.

Furthermore, organic compounds having bipolar properties, a high hole-transport property and a high electron-transport property can be used as the host material. Examples thereof include 9-phenyl-9'-(4-phenyl-2-quinazolinyl)-3,3'-bi-9H-carbazole (abbreviation: PCCzQz), 2-[4'-(9-phenyl-9H-carbazol-3-yl)-3,1'-biphenyl-1-yl] dibenzo[f,h]quinoxaline (abbreviation: 2mpPCBPDBq), 5-[3-(4,6-diphenyl-1,3,5-triazin-2-yl)phenyl]-7,7-dimethyl-5H,7H-indeno[2,1-b]carbazole (abbreviation: mINc(II) PTzn), 11-(4-[1,1'-biphenyl]-4-yl-6-phenyl-1,3,5-triazin-2-yl)-11,12-dihydro-12-phenyl-indolo[2,3-a]carbazole (abbreviation: BP-Icz(II)Tzn), and 7-[4-(9-phenyl-9H-carbazol-2-yl)quinazolin-2-yl]-7H-dibenzo[c,g]carbazole (abbreviation: PC-cgDBCzQz).

<Electron-Transport Layer>

The electron-transport layer 114 is a layer transporting electrons, which are injected from the second electrode 102 through the electron-injection layer 115 to be described later, to the light-emitting layer 113. Note that the electron-transport layer 114 is a layer containing an electron-transport material. It is preferable that the electron-transport materials used in the electron-transport layer 114 be substances with an electron mobility higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. The electron-transport layer 114 can function in a form of a single layer, but preferably has a stacked-layer structure including two or more layers in one embodiment of the present invention. Assuming that the electron-transport layer 114 has a stacked-layer structure, a photolithography process is performed over the electron-transport layer containing a heteroaromatic compound and an organic compound or containing a plurality of kinds of heteroaromatic compounds, in which case a heating step can be less likely to affect the device characteristics. This is because heat resistance of the electron-transport layer containing a heteroaromatic compound and an organic compound or containing a plurality of kinds of heteroaromatic compounds (preferably having a film of a mixture of the compounds) is higher than that of the electron-transport layer having different composition, as described in Embodiment 1.

<<Electron-Transport Material>>

As the electron-transport material that can be used for the electron-transport layer 114, an organic compound having a high electron-transport property, i.e., a heteroaromatic compound can be used. The term "heteroaromatic compound" refers to a cyclic compound containing at least two different kinds of elements in a ring. Examples of cyclic structures include a three-membered ring, a four-membered ring, a five-membered ring, a six-membered ring, and the like, among which a five-membered ring and a six-membered ring are particularly preferred. The elements contained in the heteroaromatic compound are preferably one or more of nitrogen, oxygen, and sulfur, in addition to carbon. In particular, a heteroaromatic compound containing nitrogen (a nitrogen-containing heteroaromatic compound) is preferred, and any of materials having a high electron-transport property (electron-transport materials), such as a nitrogen-containing heteroaromatic compound and a π-electron deficient heteroaromatic compound including the nitrogen-containing heteroaromatic compound, is preferably used.

Note that the heteroaromatic compound is one of organic compounds and includes at least one heteroaromatic ring.

The heteroaromatic ring has any one of a pyridine skeleton, a diazine skeleton, a triazine skeleton, and a polyazole skeleton.

The heteroaromatic ring includes a fused heteroaromatic ring having a fused ring structure.

Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound including carbon and one or more of nitrogen, oxygen, and sulfur, include an organic compound having an imidazole skeleton, an organic compound having a triazole skeleton, an organic compound having an oxazole skeleton, an organic compound having an oxadiazole skeleton, an organic compound having a thiazole skeleton, an organic compound having a benzimidazole skeleton, and the like.

Examples of the heteroaromatic compound having a six-membered ring structure, which is a heteroaromatic compound including carbon and one or more of nitrogen, oxygen, and sulfur, include an organic compound having a heteroaromatic ring, such as a pyridine skeleton, a diazine skeleton (a pyrimidine skeleton, a pyrazine skeleton, a pyridazine skeleton, or the like), a triazine skeleton, or a polyazole skeleton. Other examples include an organic compound having a bipyridine structure, an organic compound having a terpyridine structure, and the like, although they are included in examples of a heteroaromatic compound in which pyridine skeletons are connected.

Examples of the heteroaromatic compound having a fused ring structure including the above six-membered ring structure as a part include an organic compound having a fused heteroaromatic ring such as a quinoline ring, a benzoquinoline ring, a quinoxaline ring, a dibenzoquinoxaline ring, a phenanthroline ring, a furodiazine ring (including a skeleton in which an aromatic ring is fused to a furan ring of a furodiazine skeleton), or a benzimidazole ring.

Specific examples of the above-described heteroaromatic compound having a five-membered ring structure (including an imidazole skeleton, a triazole skeleton, an oxadiazole skeleton, an oxadiazole skeleton, a thiazole skeleton, a benzimidazole skeleton, or the like) include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl) stilbene (abbreviation: BzOS).

Specific examples of the above-described heteroaromatic compound having a six-membered ring structure (e.g., a pyridine skeleton, a diazine skeleton (a pyrimidine skeleton, a pyrazine skeleton, a pyridazine skeleton, or the like), a triazine skeleton, or a polyazole skeleton) 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl) phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 4,6mCzBP2Pm, mFBPTzn, 8BP-4mDBtPBfpm, 9mDBtBPNfpr, 9pmDBtBPNfpr, 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl)-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm).

Other examples include 2-{3-[3-(dibenzothiophen-4-yl) phenyl]phenyl}-4,6-diphenyl-1,3,5-triazine (abbreviation: mDBtBPTzn), 8-(naphthalene-2-yl)-4-[3-(dibenzothiophene-4-yl)phenyl]-[1]benzofuro[3,2-d]pyrimidin (abbreviation: 8βN-4mDBtPBfpm), 3,8-bis[3-(dibenzothiophene-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)biphenyl-3-yl]naphtho[1',2':4,5]furo[3,2-d]pyrimidine (abbreviation: 8mDBtBPNfpm), and 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm).

Other examples include 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), or 6-(1,1'-biphenyl-3-yl)-4-[3,5-bis(9H-carbazol-9-yl)phenyl]-2-phenylpyrimidine (abbreviation: 6mBP-4Cz2PPm), 2,4,6-tris (3'-(pyridin-3-yl)biphenyl-3-yl)-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridyl)-5-(9-phenanthryl)phenyl]-4,6-diphenyl-1,3,5-triazine (abbreviation: mPn-mDMePyPTzn).

Specific examples of the above-described heteroaromatic compound having a fused ring structure including the above six-membered ring structure as a part include bathophenanthroline (abbreviation: Bphen), bathocuproine (abbreviation: BCP), 2,9-di(2-naphthyl)-4,7-diphenyl-1,10-phenanthroline (abbreviation: NBphen), 2-[3'-

(dibenzothiophen-4-yl)biphenyl-3-yl]dibenzo[f,h]quinoxaline (abbreviation: 2mDBTPDBq-II), 2-[3'-(9H-carbazol-9-yl)biphenyl-3-yl]dibenzo[f,h]quinoxaline (abbreviation: 2mCzBPDBq), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), or 2mpPCBPDBq.

For the electron-transport layer, any of the metal complexes given below as well as the heteroaromatic compounds given above can be used. A metal complex having a quinoline skeleton or a benzoquinoline skeleton, such as tris(8-quinolinolato)aluminum(III) (abbreviation: $Alq_3$), $Almq_3$, 8-quinolinolato-lithium(I) (abbreviation: Liq), $BeBq_2$, bis(2-methyl-8-quinolinolato)(4-phenylphenolato)aluminum(III) (abbreviation: BAlq), or bis(8-quinolinolato)zinc(II) (abbreviation: Znq); a metal complex having an oxazole skeleton or a thiazole skeleton, such as bis[2-(2-benzoxazolyl)phenolato]zinc(II) (abbreviation: ZnPBO) or bis[2-(2-benzothiazolyl)phenolato]zinc(II) (abbreviation: ZnBTZ); or the like can be used.

Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used as the electron-transport material.

<Electron-Injection Layer>

The electron-injection layer 115 is a layer that contains a substance having a high electron-injection property. The electron-injection layer 115 is a layer for increasing the efficiency of electron injection from the second electrode 102; thus, the electron-injection layer 115 is preferably formed using a material whose LUMO level energy value has a small difference (0.5 eV or less) from the work function value of the material of the second electrode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. A rare earth metal compound like erbium fluoride ($ErF_3$) or ytterbium (Yb) can also be used. In addition, an electride may be used for the electron-injection layer 115. Examples of the electride include a substance in which electrons are added at high concentration to a mixed oxide of calcium and aluminum. Note that any of the above-described substances for forming the electron-transport layer 114 can also be used.

A composite material in which an organic compound and an electron donor (donor) are mixed may also be used for the electron-injection layer 115. Such a composite material is excellent in an electron-injection property and an electron-transport property because electrons are generated in the organic compound due to the electron donor. The organic compound here is preferably a material excellent in transporting the generated electrons; specifically, for example, the above-described electron-transport materials used for the electron-transport layer 114 (e.g., a metal complex or a heteroaromatic compound) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can be used. Furthermore, an organic compound such as tetrathiafulvalene (abbreviation: TTF) can be used. Alternatively, a stack of these materials may be used.

Moreover, a composite material in which an organic compound and a metal are mixed may also be used in the electron-injection layer 115. Note that the organic compound used here preferably has a LUMO (Lowest Unoccupied Molecular Orbital) level higher than or equal to −3.6 eV and lower than or equal to −2.3 eV. Moreover, a material having an unshared electron pair is preferable.

Thus, as the organic compound used for the above composite material, a composite material obtained by mixing a metal and the heteroaromatic compound given above as the material that can be used for the electron-transport layer may be used. Preferred examples of the heteroaromatic compound include materials having an unshared electron pair, such as a heteroaromatic compound having a five-membered ring structure (e.g., an imidazole skeleton, a triazole skeleton, an oxazole skeleton, an oxadiazole skeleton, a thiazole skeleton, or a benzimidazole skeleton), a heteroaromatic compound having a six-membered ring structure (e.g., a pyridine skeleton, a diazine skeleton (including a pyrimidine skeleton, a pyrazine skeleton, a pyridazine skeleton, or the like), a triazine skeleton, a bipyridine skeleton, or a terpyridine skeleton), and a heteroaromatic compound having a fused ring structure including a six-membered ring structure as a part (e.g., a quinoline skeleton, a benzoquinoline skeleton, a quinoxaline skeleton, a dibenzoquinoxaline skeleton, or a phenanthroline skeleton). Since the materials are specifically described above, description thereof is omitted here.

As a metal used for the above composite material, a transition metal that belongs to Group 5, Group 7, Group 9, or Group 11 or a material that belongs to Group 13 in the periodic table is preferably used, and examples include Ag, Cu, Al, and In. In this case, the organic compound forms a singly occupied molecular orbital (SOMO) with the transition metal.

<Substrate>

The light-emitting device described in this embodiment can be formed over any of a variety of substrates. Note that the type of the substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base material film.

Note that examples of the glass substrate include barium borosilicate glass, aluminoborosilicate glass, and soda lime glass. Examples of the flexible substrate, the attachment film, and the base material film include plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

For fabrication of the light-emitting device in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, layers having a variety of functions (the hole-injection layer 111, the hole-transport layer 112, the light-emitting layer 113, the electron-transport layer 114, and the electron-injection layer 115) included in the EL layer of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a deposition method such as the coating method or the printing method is employed, a high-molecular compound (e.g., an oligomer, a dendrimer, or a polymer), a middle-molecular compound (a compound between a low-molecular compound and a high-molecular compound with a molecular weight of 400 to 4000), an inorganic compound (e.g., a quantum dot material), or the like can be used. Note that as the quantum dot material, a colloidal quantum dot material, an alloyed quantum dot material, a core-shell quantum dot material, a core quantum dot material, or the like can be used.

Materials that can be used for the layers (the hole-injection layer 111, the hole-transport layer 112, the light-emitting layer 113, the electron-transport layer 114, and the electron-injection layer 115) included in the EL layer 103 of the light-emitting device described in this embodiment are not limited to the materials described in this embodiment, and other materials can be used in combination as long as the functions of the layers are fulfilled.

The structure described in this embodiment can be used in an appropriate combination with any of the structures described in the other embodiments.

Embodiment 3

In this embodiment, a specific structure example of a light-emitting apparatus (also referred to as display panel) of one embodiment of the present invention and a manufacturing method thereof will be described.

<Structure Example 1 of Light-Emitting Apparatus 700>

Figure 3A:
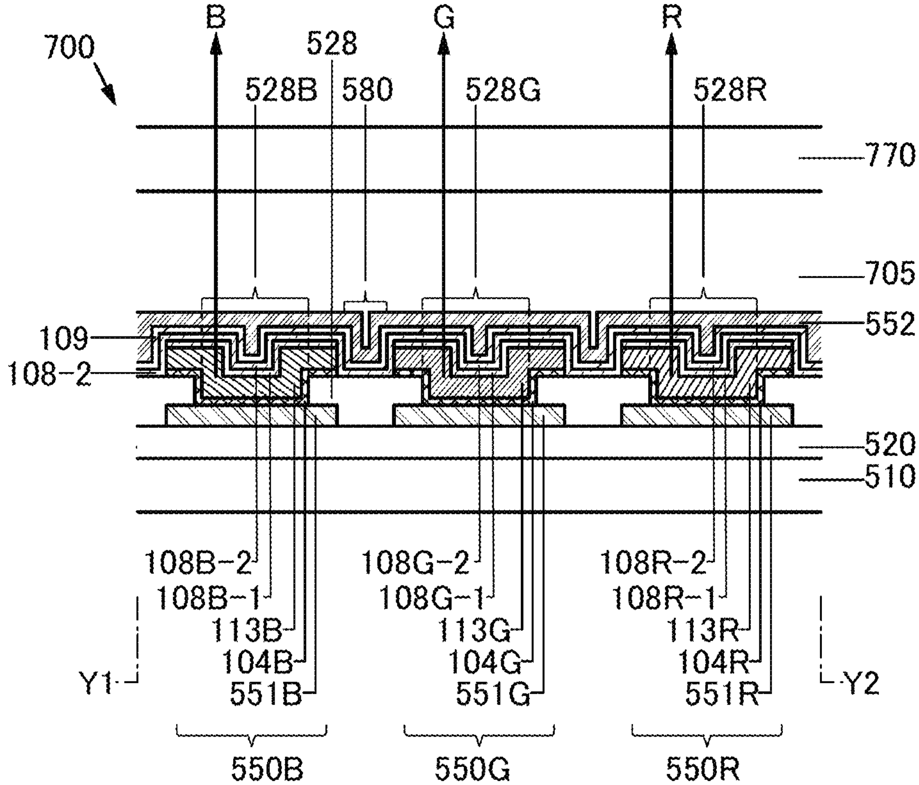
FIG. 3A and FIG. 3B are diagrams illustrating a light-emitting apparatus of an embodiment.

A light-emitting apparatus 700 illustrated in FIG. 3A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The light-emitting apparatus 700 includes an insulating layer 705 over the functional layer 520 and the light-emitting devices, and the insulating layer 705 has a function of attaching a second substrate 770 and the functional layer 520. The driver circuit GD and the driver circuit SD will be described in Embodiment 4.

The light-emitting device 550B, the light-emitting device 550G, and the light-emitting device 550R each have the device structure described in Embodiment 2. In other words, the case is described in which the EL layer 103 in the structure illustrated in FIG. 2A differs between the light-emitting devices.

In this specification and the like, a structure in which light-emitting layers in light-emitting devices of different colors (for example, blue (B), green (G), and red (R)) are separately formed or separately patterned may be referred to as an SBS (Side By Side) structure. Note that in the light-emitting apparatus 700 illustrated in FIG. 3A, the light-emitting device 550B, the light-emitting device 550G, and the light-emitting device 550R are arranged in this order; however, one embodiment of the present invention is not limited thereto. For example, in the light-emitting apparatus 700, the light-emitting device 550B, the light-emitting device 550R, and the light-emitting device 550G may be arranged in this order.

As illustrated in FIG. 3A, the light-emitting device 550B includes an electrode 551B, an electrode 552, and the EL layer 103B. Note that a specific structure of each layer is as described in Embodiment 2. The EL layer 103B has a stacked-layer structure of layers having different functions and including a light-emitting layer. Although FIG. 3A illustrates only a hole-injection/transport layer 104B, a light-emitting layer 113B, a first electron-transport layer 108B-1, a second electron-transport layer 108B-2, and the electron-injection layer 109 in the layers included in the EL layer 103B, which includes the light-emitting layer, the present invention is not limited thereto. Note that the hole-injection/transport layer 104B represents the layer having the functions of the hole-injection layer and the hole-transport layer described in Embodiment 2 and may have a stacked-layer structure. Note that in this specification, a hole-injection/transport layer in any light-emitting device can be interpreted in the above manner.

Note that a region corresponding to the second electron-transport layer 108-2 in the EL layer 103B is referred to as the second electron-transport layer 108B-2 in some cases. Similarly, a region corresponding to the second electron-transport layer 108-2 in an EL layer 103G is referred to as a second electron-transport layer 108G-2, and a corresponding region in an EL layer 103R is referred to as a second electron-transport layer 108R-2, in some cases.

The electron-transport layer has a stacked-layer structure including at least the first electron-transport layer 108B-1 and the second electron-transport layer 108B-2, in which the first electron-transport layer 108B-1 is in contact with the light-emitting layer 113B and the second electron-transport layer 108B-2 is in contact with the electron-injection layer 109. The first electron-transport layer 108B-1 is a layer formed using a heteroaromatic compound and an organic compound or a layer formed using a plurality of kinds of heteroaromatic compounds (preferably a layer formed using a mixture of the compounds) as described in Embodiment 1. The second electron-transport layer 108QB-2 is preferably formed using an electron-transport material and may be a layer containing one kind of heteroaromatic compound or organic compound, a layer containing an organic compound and a heteroaromatic compound, or a layer containing a plurality of kinds of heteroaromatic compounds. The first electron-transport layer 108B-1 may have a function of blocking holes moving from the anode side to the cathode side through the light-emitting layer. The electron-injection layer 109 may have a stacked-layer structure in which some or all of layers are formed using different materials.

As illustrated in FIG. 1C, the insulating layer 107 may be formed on side surfaces (or end portions) of the hole-injection/transport layer 104, the light-emitting layer 113, and the first electron-transport layer 108-1, which are included in the EL layer 103 including the light-emitting layer. When the insulating layer 107 is added to the structure component of the light-emitting device in FIG. 3A, the insulating layer 107 is formed while a sacrificial layer formed over some of the layers of the EL layer 103B (in this embodiment, indicating that formation of the layers is done up to the formation of the first electron-transport layer 108B-1 over the light-emitting layer) remains over the electrode 551B. Thus, the insulating layer 107 is formed in contact with part (described above) of the side surface (or the end portion) of the EL layer 103B. This can inhibit entry of oxygen, moisture, or constituent elements thereof into the inside through the side surface of the EL layer 103B. For an insulating layer 107B, aluminum oxide, magnesium oxide, hafnium oxide, gallium oxide, indium gallium zinc oxide, silicon nitride, silicon nitride oxide, or the like can be used, for example. The insulating layer 107B can be formed by a sputtering method, a CVD method, an MBE method, a PLD method, an ALD method, or the like and is formed preferably by an ALD method, which achieves favorable coverage.

In addition, the second electron-transport layer 108B-2 is formed to cover some of the layers of the EL layer 103B (including the light-emitting layer, which corresponds to the hole-injection/transport layer 104B and the first electron-transport layer 108B-1); note that when the insulating layer 107B is formed, the second electron-transport layer 108B-2 is formed to cover some of the layers of the EL layer 103B (including the light-emitting layer, which corresponds to the hole-injection/transport layer 104B and the first electron-transport layer 108B-1) and the insulating layer 107B. The second electron-transport layer 108B-2 is preferably formed using an electron-transport material described in Embodiment 2 and may be a layer formed using one kind of heteroaromatic compound or a layer formed using a plurality of kinds of heteroaromatic compounds. The electron-injection layer 109 is formed over the second electron-transport layer 108B-2. The electron-injection layer 109 may have a stacked-layer structure of two or more layers having different electric resistances. For example, the electron-injection layer 109 may have one of the following structures: a structure in which a first layer in contact with the second electron-transport layer 108B-2 is formed using only an electron-transport material, and a second layer formed using an electron-transport material containing a metal material is stacked over the first layer; or the aforementioned structure including a third layer formed using an electron-transport material containing a metal material, between the first layer and the second electron-transport layer 108B-2.

The electrode 552 is formed over the electron-injection layer 109. Note that the electrode 551B and the electrode 552 have an overlap region. The EL layer 103B is positioned between the electrode 551B and the electrode 552. Thus, the electron-injection layer 109 has a structure in contact with the side surface (or the end portion) of part of the EL layer 103B (including the light-emitting layer, which corresponds to the hole-injection/transport layer 104B and the first electron-transport layer 108B-1) with the second electron-transport layer 108B-2 provided therebetween, or the second electrode 552 has a structure in contact with the side surface (or the end portion) of part of the EL layer 103B (including the light-emitting layer, which corresponds to the hole-injection/transport layer 104B and the first electron-transport layer 108B-1) with the electron-injection layer 109 and the second electron-transport layer 108B-2 provided therebetween. Accordingly, the electrical short circuit between the part of the EL layer 103B (including the light-emitting layer, which corresponds to the hole-injection/transport layer 104B and the first electron-transport layer 108B-1) and the electrode 552, more specifically, the electrical short circuit between the hole-injection/transport layer 104B included in the EL layer 103B and the electrode 552 can be prevented.

The EL layer 103B illustrated in FIG. 3A has a structure similar to that of the EL layer 103 described in Embodiment 2. The EL layer 103B is capable of emitting blue light, for example.

As illustrated in FIG. 3A, the light-emitting device 550G includes an electrode 551G, the electrode 552, and the EL layer 103G. Note that a specific structure of each layer is as described in Embodiment 2. The EL layer 103G has a stacked-layer structure of layers having different functions and including a light-emitting layer. Although FIG. 3A illustrates only a hole-injection/transport layer 104G, a light-emitting layer 113G, a first electron-transport layer 108G-1, the second electron-transport layer 108G-2, and the electron-injection layer 109 as layers included in the EL layer 103G, which includes the light-emitting layer, the present invention is not limited thereto. Note that the hole-injection/transport layer 104G represents the layer having the functions of the hole-injection layer and the hole-transport layer described in Embodiment 2 and may have a stacked-layer structure.

The electron-transport layer has a stacked-layer structure including at least the first electron-transport layer 108G-1 and the second electron-transport layer 108G-2, in which the first electron-transport layer 108G-1 is in contact with the light-emitting layer and the second electron-transport layer 108G-2 is in contact with the electron-injection layer 109. Note that the first electron-transport layer 108G-1 is a layer formed using a heteroaromatic compound and an organic compound or a layer formed using a plurality of kinds of heteroaromatic compounds (preferably a layer formed using a mixture of the compounds) as described in Embodiment 1. The second electron-transport layer 108G-2 is preferably formed using an electron-transport material and may be a layer formed using one kind of heteroaromatic compound or organic compound, a layer formed using an organic compound and a heteroaromatic compound, or a layer containing a plurality of kinds of heteroaromatic compounds. The first electron-transport layer 108G-1 may have a function of blocking holes moving from the anode side to the cathode side through the light-emitting layer. The electron-injection layer 109 may have a stacked-layer structure in which some or all of layers are formed using different materials.

As illustrated in FIG. 1C, the insulating layer 107 may be formed on side surfaces (or end portions) of the hole-injection/transport layer 104, the light-emitting layer 113, and the first electron-transport layer 108-1, which are included in the EL layer 103 including the light-emitting layer. When the insulating layer 107 is added to a structure component of the light-emitting device in FIG. 3A, the insulating layer 107 is formed while a sacrificial layer formed over some of the layers of the EL layer 103G (in this embodiment, indicating that formation of the layers is done up to the formation of the first electron-transport layer 108G-1 over the light-emitting layer) remains over the electrode 551G. Thus, the insulating layer 107 is formed in contact with part (described above) of the side surface (or the end portion) of the EL layer 103G. Accordingly, entry of oxygen, moisture, or constituent elements thereof through the side surface of the EL layer 103G into the inside of the EL layer 103G can be inhibited. For the insulating layer 107, aluminum oxide, magnesium oxide, hafnium oxide, gallium oxide, indium gallium zinc oxide, silicon nitride, silicon nitride oxide, or the like can be used, for example. The insulating layer 107 can be formed by a sputtering method, a CVD method, an MBE method, a PLD method, an ALD method, or the like and is formed preferably by an ALD method, which achieves favorable coverage.

The second electron-transport layer 108G-2 is formed to cover some of the layers of the EL layer 103G (including the light-emitting layer, which corresponds to the hole-injection/transport layer 104G and the first electron-transport layer 108G-1); note that when the insulating layer 107G is formed, the second electron-transport layer 108G-2 is formed to cover some of the layers of the EL layer 103G (including the light-emitting layer, which corresponds to the hole-injection/transport layer 104G and the first electron-transport layer 108G-1) and the insulating layer 107G. The second electron-transport layer 108G-2 is preferably formed using the electron-transport material described in Embodiment 2 and may be a layer formed using one kind of heteroaromatic compound or a layer formed using a plurality of kinds of heteroaromatic compounds. The electron-injection layer 109 is formed over the second electron-transport layer 108G-2. The electron-injection layer 109 preferably has a stacked-layer structure of two or more layers having different electric resistances. For example, the electron-injection layer 109 may have one of the following structures: a structure in which a first layer in contact with the second electron-transport layer 108G-2 is formed using only an electron-transport material, and a second layer formed using an electron-transport material containing a metal material is stacked over the first layer; or the aforementioned structure including a third layer formed using an electron-transport material containing a metal material, between the second electron-transport layer 108G-2.

The electrode 552 is formed over the electron-injection layer 109. Note that the electrode 551G and the electrode 552 have an overlap region. The EL layer 103G is positioned between the electrode 551G and the electrode 552. Thus, the electron-injection layer 109 has a structure in contact with the side surface (or the end portion) of the part of the EL layer 103G (including the light-emitting layer, which corresponds to the hole-injection/transport layer 104G and the first electron-transport layer 108G-1) with the second electron-transport layer 108G-2 provided therebetween, or the electrode 552 has a structure in contact with the side surface (or the end portion) of the part of the EL layer 103G (including the light-emitting layer, which corresponds the hole-injection/transport layer 104G and the first electron-transport layer 108G-1) with the electron-injection layer 109 and the second electron-transport layer 108G-2 provided therebetween. Accordingly, the electrical short circuit between the part of the EL layer 103G (including the light-emitting layer, which corresponds the hole-injection/transport layer 104G and the first electron-transport layer 108G-1) and the electrode 552, more specifically, the electrical short circuit between the hole-injection/transport layer 104G included in the EL layer 103G and the electrode 552 can be prevented.

The EL layer 103G illustrated in FIG. 3A has a structure similar to that of the EL layer 103 described in Embodiment 2. The EL layer 103G is capable of emitting green light, for example.

As illustrated in FIG. 3A, the light-emitting device 550R includes an electrode 551R, the electrode 552, and the EL layer 103R. Note that a specific structure of each layer is as described in Embodiment 2. The EL layer 103R has a stacked-layer structure of layers having different functions and including a light-emitting layer. Although FIG. 3A illustrates only a hole-injection/transport layer 104R, the light-emitting layer 113R, a first electron-transport layer 108R-1, the second electron-transport layer 108R-2, and the electron-injection layer 109 as the layers including in the EL layer 103G, which includes the light-emitting layer, the present invention is not limited thereto. Note that the hole-injection/transport layer 104R represents the layer having the functions of the hole-injection layer and the hole-transport layer described in Embodiment 2 and may have a stacked-layer structure.

The electron-transport layer has a stacked-layer structure including at least the first electron-transport layer 108R-1 and the second electron-transport layer 108R-2, in which the first electron-transport layer 108R-1 is in contact with the light-emitting layer and the second electron-transport layer 108R-2 is in contact with the electron-injection layer 109. The first electron-transport layer 108R-1 is a layer formed using a heteroaromatic compound and an organic compound or a layer formed using a plurality of kinds of heteroaromatic compounds (preferably a layer formed using a mixture of the above compounds). The second electron-transport layer 108R-2 is preferably formed using an electron-transport material and may be a layer formed using one kind of heteroaromatic compound or organic compound, a layer formed using an organic compound and a heteroaromatic compound, or a layer containing a plurality of kinds of heteroaromatic compounds. The first electron-transport layer 108R-1 may have a function of blocking holes moving from the anode side to the cathode side through the light-emitting layer. The electron-injection layer 109 may have a stacked-layer structure in which some or all of layers are formed using different materials.

As illustrated in FIG. 1C, the insulating layer 107 may be formed on side surfaces (or end portions) of the hole-injection/transport layer 104, the light-emitting layer 113, and the first electron-transport layer 108-1, which are included in the EL layer 103 including the light-emitting layer. When the insulating layer 107 is added to a structure component of the light-emitting device in FIG. 3A, the insulating layer 107 is formed while a sacrificial layer formed over some of the layers of the EL layer 103R (in this embodiment, indicating that formation of the layers is done up to formation of the first electron-transport layer 108R-1 over the light-emitting layer) remains over the electrode 551R. Thus, the insulating layer 107 is formed in contact with part (described above) of the side surface (or the end portion) of the EL layer 103R. Accordingly, entry of oxygen, moisture, or constituent elements thereof through the side surface of the EL layer 103R into the inside of the EL layer 103R can be inhibited. For the insulating layer 107, aluminum oxide, magnesium oxide, hafnium oxide, gallium oxide, indium gallium zinc oxide, silicon nitride, silicon nitride oxide, or the like can be used, for example. The insulating layer 107 can be formed by a sputtering method, a CVD method, an MBE method, a PLD method, an ALD method, or the like and is formed preferably by an ALD method, which achieves favorable coverage.

The second electron-transport layer 108R-2 is formed to cover some of the layers of the EL layer 103R (including the light-emitting layer, which corresponds to the hole-injection/transport layer 104R and the first electron-transport layer 108R-1); note that when the insulating layer 107R is formed, the second electron-transport layer 108R-2 is formed to cover some of the layers of the EL layer 103R (including the light-emitting layer, which corresponds to the hole-injection/transport layer 104R and the first electron-transport layer 108R-1) and the insulating layer 107R. The second electron-transport layer 108R-2 is preferably formed using the electron-transport material described in Embodiment 2 and may be a layer formed using one kind of heteroaromatic compound or a layer formed using a plurality of kinds of heteroaromatic compounds. The electron-injection layer 109 is formed over the second electron-transport layer 108R-2. The electron-injection layer 109 preferably has a stacked-layer structure of two or more layers having different electric resistances. For example, the electron-injection layer 109 may have one of the following structures: a structure in which a first layer in contact with the second electron-transport layer 108R-2 is formed using only an electron-transport material, and a second layer formed using an electron-transport material containing a metal material is stacked over the first layer; or the aforementioned structure including a third layer formed using an electron-transport material containing a metal material, between the first layer and the second electron-transport layer 108R-2.

The electrode 552 is formed over the electron-injection layer 109. Note that the electrode 551R and the electrode 552 have an overlap region. The EL layer 103R is positioned between the electrode 551R and the electrode 552. Thus, the electron-injection layer 109 has a structure in contact with the side surface (or the end portion) of the part of the EL layer 103R (including the light-emitting layer, which corresponds to the hole-injection/transport layer 104R and the first electron-transport layer 108R-1) with the second electron-transport layer 108R-2 provided therebetween, or the electrode 552 has a structure in contact with the side surface (or the end portion) of the part of the EL layer 103R (including the light-emitting layer, which corresponds to the hole-injection/transport layer 104R and the first electron-transport layer 108R-1) with the electron-injection layer 109 and the second electron-transport layer 108R-2 provided therebetween. Accordingly, the electrical short circuit between the part of the EL layer 103R (including the light-emitting layer, which corresponds to the hole-injection/transport layer 104R and the first electron-transport layer 108R-1) and the electrode 552, more specifically, the electrical short circuit between the hole-injection/transport layer 104R included in the EL layer 103R and the electrode 552 can be prevented.

The EL layer 103R illustrated in FIG. 3A has a structure similar to that of the EL layer 103 described in Embodiment 2. The EL layer 103R is capable of emitting red light, for example.

A space 580 is provided between the EL layer 103B, the EL layer 103G, and the EL layer 103R. In each of the EL layers, particularly the hole-injection layer, which is included in the hole-transport region between the anode and the light-emitting layer, often has high conductivity; therefore, a hole-injection layer formed as a layer shared by adjacent light-emitting devices might cause crosstalk. Thus, providing the space 580 between the EL layers as shown in this structure example can inhibit occurrence of crosstalk between adjacent light-emitting devices.

When electrical continuity is established between the EL layer 103B, the EL layer 103G, and the EL layer 103R in a light-emitting apparatus (display panel) with a high resolution exceeding 1000 ppi, a crosstalk phenomenon occurs, resulting in a narrower color gamut that the light-emitting apparatus is capable of reproducing. Providing the space 580 in a high-resolution display panel with more than 1000 ppi, preferably more than 2000 ppi, or further preferably in an ultrahigh-resolution display panel with more than 5000 ppi allows the display panel to express vivid colors.

Figure 3B:
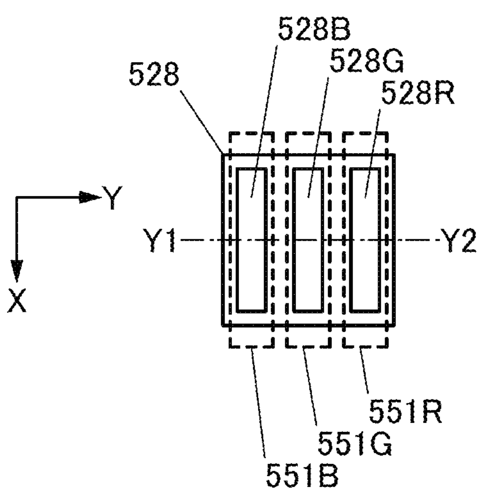

As illustrated in FIG. 3B, the partition 528 has an opening 528B, an opening 528G, and an opening 528R. As illustrated in FIG. 3A, the opening 528B overlaps with the electrode 551*n*, the opening 528G overlaps with the electrode 551G, and the opening 528R overlaps with the electrode 551R. Note that a cross-sectional view taken along the dashed-dotted line Y1-Y2 in FIG. 3B corresponds to a schematic cross-sectional view of the light-emitting apparatus illustrated in FIG. 3A.

The EL layers (the EL layer 103B, the EL layer 103G, and the EL layer 103R) are processed to be separated by patterning using a photolithography method; hence, a high-resolution light-emitting apparatus (display panel) can be fabricated. End portions (side surfaces) of the EL layer processed by patterning using a photolithography method have substantially one surface (or are positioned on substantially the same plane). In this case, the space 580 between the EL layers is preferably 5 μm or less, further preferably 1 μm or less.

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as shown in this structure example can inhibit occurrence of crosstalk between adjacent light-emitting devices.

<Manufacturing Method Example 1 of Light-Emitting Apparatus>

Figure 4A:
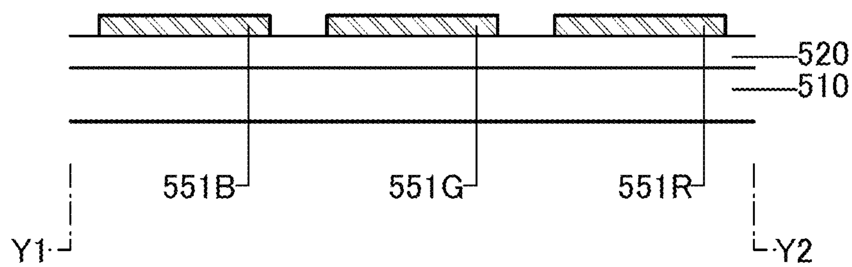
FIG. 4A and FIG. 4B are diagrams illustrating a method for manufacturing a light-emitting apparatus of an embodiment.

The electrode 551B, the electrode 551G, and the electrode 551R are formed as illustrated in FIG. 4A. For example, a conductive film is formed over the functional layer 520 over the first substrate 510 and processed into predetermined shapes by a photolithography method.

The conductive film can be formed by a sputtering method, a chemical vapor deposition (CVD) method, a molecular beam epitaxy (MBE) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. As an example of the thermal CVD method, a metal organic chemical vapor deposition (MOCVD: Metal Organic CVD) method can be given.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask. Here, "island shape" refers to a state in which layers formed using the same material in the same step are separated from each other when seen from above.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as pre-applied bake (PAB) after resist application and post-exposure bake (PEB) after light exposure. In one embodiment of the present invention, a lithography method is used not only for processing of a conductive film but also for processing of a thin film used for formation of an EL layer (a film made of an organic compound or a film partly including an organic compound).

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. Light exposure may be performed by liquid immersion exposure technique. As the light for exposure, extreme ultraviolet (EUV) light or X-rays may also be used. Instead of the light for exposure, an electron beam can be used. It is preferable to use EUV light, X-rays, or an electron beam because they can perform extremely minute processing. Note that a photomask is not needed when light exposure is performed by scanning with a beam such as an electron beam.

For etching of a thin film using a resist mask, a dry etching method, a wet etching method, a sandblast method, or the like can be used.

Figure 4B:
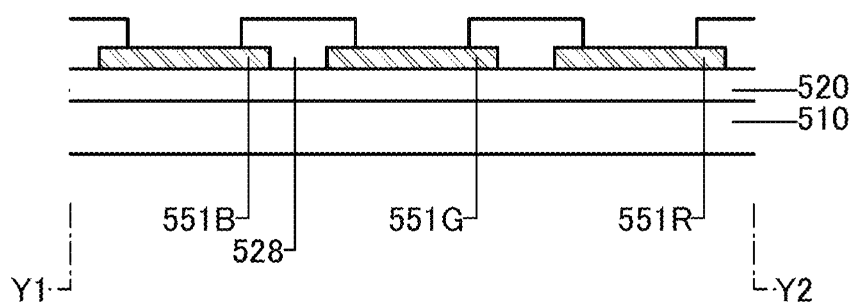

Next, as illustrated in FIG. 4B, the partition 528 is formed between the electrode 551B and the electrode 551G. For example, the partition 528 can be formed in such a manner that an insulating film covering the electrode 551*i*, the electrode 551G, and the electrode 551R is formed, and openings are formed by a photolithography method to partly expose the electrode 551B, the electrode 551G, and the electrode 551R. Examples of a material that can be used for the partition 528 include an inorganic material, an organic material, and a composite material of an inorganic material and an organic material. Specifically, it is possible to use an inorganic oxide film, an inorganic nitride film, an inorganic oxynitride film, or the like, or a layered material in which two or more films selected from the above are stacked. More specifically, it is possible to use a silicon oxide film, a film containing acrylic, a film containing polyimide, or the like, or a layered material in which two or more films selected from the above are stacked.

Figure 5A:
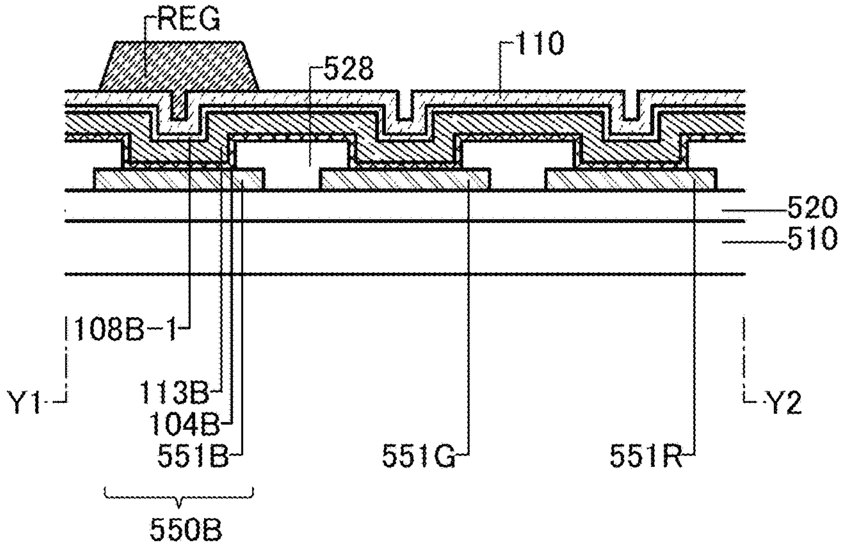
FIG. 5A to FIG. 5C are diagrams illustrating a method for manufacturing a light-emitting apparatus of an embodiment.

Then, as illustrated in FIG. 5A, the EL layer 103B is formed over the electrode 551*i*, the electrode 551G, the electrode 551R, and the partition 528. Note that in the EL layer 103B in FIG. 5A, the hole-injection/transport layer 104B, the light-emitting layer, and the first electron-transport layer 108B-1 are formed. For example, the EL layer 103B is formed by a vacuum evaporation method over the electrode 551B, the electrode 551G, the electrode 551R, and the partition 528 so as to cover them. Furthermore, a sacrificial layer 110 is formed over the EL layer 103B.

As the sacrificial layer 110, it is possible to use a film highly resistant to etching treatment performed on the EL layer 103B, i.e., a film having high etching selectivity. The sacrificial layer 110 preferably has a stacked-layer structure of a first sacrificial layer and a second sacrificial layer which have different etching selectivities. Moreover, for the sacrificial layer 110, it is possible to use a film that can be removed by a wet etching method less likely to cause damage to the EL layer 103B. In wet etching, oxalic acid or the like can be used as an etching material.

The sacrificial layer 110 can be formed using an inorganic film such as a metal film, an alloy film, a metal oxide film, a semiconductor film, or an inorganic insulating film, for example. The sacrificial layer 110 can be formed by any of a variety of film formation methods such as a sputtering method, an evaporation method, a CVD method, and an ALD method.

For the sacrificial layer 110, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, the sacrificial layer 110 can be formed using a metal oxide such as an indium gallium zinc oxide (In—Ga—Zn oxide, also referred to as IGZO) or the like. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an oxide using an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

For the sacrificial layer 110, an inorganic insulating material such as aluminum oxide, hafnium oxide, or silicon oxide can be used.

The sacrificial layer 110 is preferably formed using a material that can be dissolved in a solvent chemically stable with respect to at least the uppermost film of the EL layer 103B (the electron-transport layer 108B-1). Specifically, a material that will be dissolved in water or alcohol can be suitably used for the sacrificial layer 110. In deposition of the sacrificial layer 110, it is preferable that application of such a material dissolved in a solvent such as water or alcohol be performed by the aforementioned wet process and followed by heat treatment for evaporating the solvent. At this time, the heat treatment is preferably performed in a reduced-pressure atmosphere, in which case the solvent can be removed at a low temperature in a short time and thermal damage to the EL layer 103B can be reduced accordingly.

In the case where the sacrificial layer 110 having a stacked-layer structure is formed, the stacked-layer structure can include the first sacrificial layer formed using any of the above-described materials and the second sacrificial layer formed therebelow.

The second sacrificial layer in that case is a film used as a hard mask for etching of the first sacrificial layer. In processing the second sacrificial layer, the first sacrificial layer is exposed. Thus, a combination of films having greatly different etching rates is selected for the first sacrificial layer and the second sacrificial layer. Thus, a film that can be used for the second sacrificial layer can be selected in accordance with the etching conditions of the first sacrificial layer and those of the second sacrificial layer.

For example, in the case where dry etching using a gas containing fluorine (also referred to as a fluorine-based gas) is performed for the etching of the second sacrificial layer, silicon, silicon nitride, silicon oxide, tungsten, titanium, molybdenum, tantalum, tantalum nitride, an alloy containing molybdenum and niobium, or an alloy containing molybdenum and tungsten can be used for the second sacrificial layer. Here, a metal oxide film such as IGZO or ITO is given as a film having high etching selectivity (that is, enabling low etching rate) in dry etching using the fluorine-based gas, and such a film can be used as the first sacrificial layer.

Note that the material for the second sacrificial layer is not limited to the above and can be selected from a variety of materials in accordance with the etching conditions of the first sacrificial layer and those of the second sacrificial layer. For example, any of the films that can be used for the first sacrificial layer can be used.

As the second sacrificial layer, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used as the second sacrificial layer. Typically, an oxide film or an oxynitride film such as silicon oxide, silicon oxynitride, aluminum oxide, aluminum oxynitride, hafnium oxide, or hafnium oxynitride can be used.

Next, a resist mask REG is formed into a desired shape over the sacrificial layer 110 as illustrated in FIG. 5A by a photolithography method. Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures. In the light-emitting device of one embodiment of the present invention, the layer with high heat resistance, which contains the heteroaromatic compound and the organic compound described in Embodiment 1, in specific terms, is used and subjected to the photolithography step. This enables a light-emitting apparatus including the highly reliable light-emitting device which is less affected by the heat treatment.

Figure 5B:
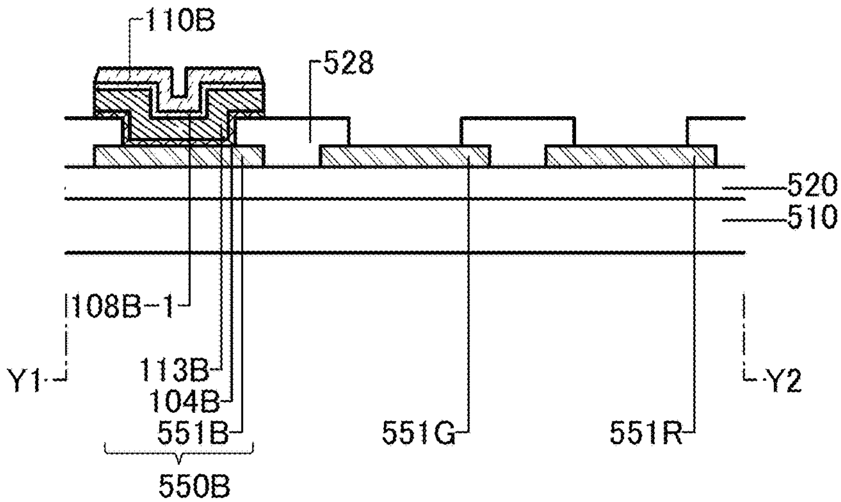

Next, as illustrated in FIG. 5B, part of the sacrificial layer 110B not covered with the resist mask REG is removed by etching using the obtained resist mask REG; the resist mask REG is removed; and part of the EL layer 103B not covered with the sacrificial layer is then removed by etching, i.e., the EL layer 103B over the electrode 551G and the EL layer 103B over the electrode 551R are removed by etching, so that the EL layer 103B over the electrode 551B is processed to have side surfaces (or have their side surfaces exposed) or have a belt-like shape that extends in the direction intersecting the sheet of the diagram. Specifically, dry etching is performed using the patterned sacrificial layer 110B over the EL layer 103B overlapping with the electrode 551B. Note that in the case where the sacrificial layer 110B has the aforementioned stacked-layer structure of the first sacrificial layer and the second sacrificial layer, the following steps may be performed to process the EL layer 103B into a predetermined shape. Part of the first sacrificial layer is etched with use of the resist mask REG, the resist mask REG is then removed, and part of the second sacrificial layer is etched with use of the second sacrificial layer as a mask. The partition 528 can be used as an etching stopper.

Figure 5C:
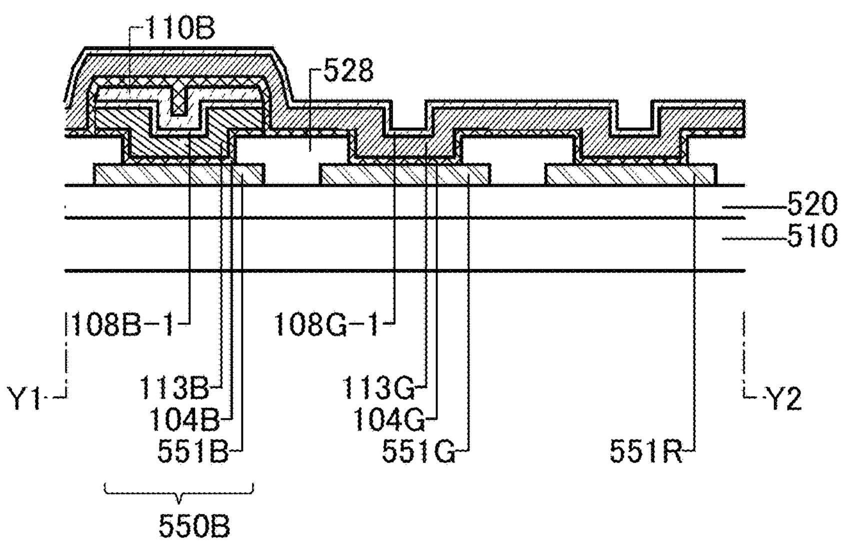

Next, as illustrated in FIG. 5C, in a state where the sacrificial layer 110B remains, the EL layer 103G is formed over the sacrificial layer 110B, the electrode 551G, the electrode 551R, and the partition 528. Note that in the EL layer 103G in FIG. 5C, the hole-injection/transport layer 104G, the light-emitting layer 113G, and the first electron-transport layer 108G-1 are formed. For example, the EL layer 103G is formed by a vacuum evaporation method over the electrode 551G, the electrode 551R, and the partition 528 so as to cover them. Furthermore, a sacrificial layer 110 is formed over the EL layer 103G.

Figure 6A:
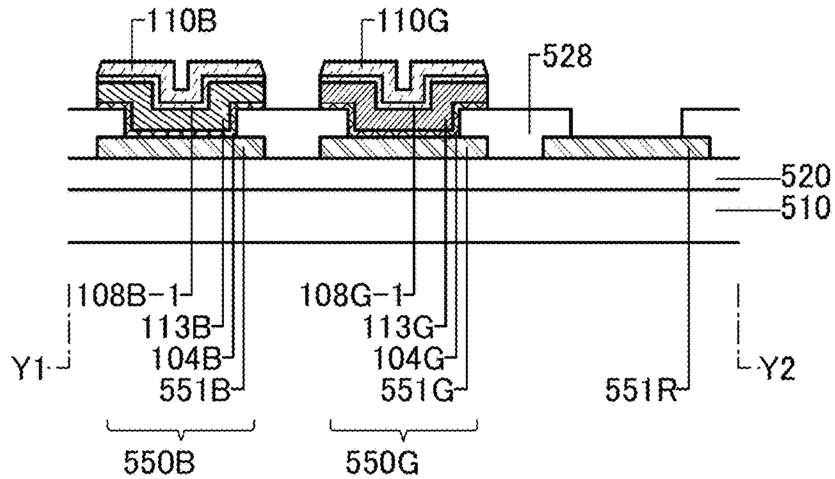
FIG. 6A to FIG. 6C are diagrams illustrating a method for manufacturing a light-emitting apparatus of an embodiment.

Then, the EL layer 103G over the electrode 551G is processed to have a predetermined shape as illustrated in FIG. 6A. For example, a sacrificial layer 110G is formed over the EL layer 103G; a resist is formed to have a desired shape over the sacrificial layer 110G by a photolithography method as a resist mask; part of the sacrificial layer 110G not covered with the resist mask is removed by etching; the resist mask is removed; and part of the EL layer 103G not covered with the sacrificial layer is then removed by etching, i.e., the EL layer 103G over the electrode 551B and the EL layer 103G over the electrode 551R are removed by etching, so that the EL layer 103G over the electrode 551G is processed to have side surfaces (or have their side surfaces exposed) or have a belt-like shape that extends in the direction intersecting the sheet of the diagram. Specifically, dry etching is performed using the patterned sacrificial layer 110G over the EL layer 103G overlapping with the electrode 551G. Note that in the case where the sacrificial layer 110G has the aforementioned stacked-layer structure of the first sacrificial layer and the second sacrificial layer, the following steps may be performed to process the EL layer 103G into a predetermined shape. Part of the second sacrificial layer is etched with use of the resist mask, the resist mask is then removed, and part of the first sacrificial layer is etched with use of the second sacrificial layer as a mask. The partition 528 can be used as an etching stopper.

Figure 6B:
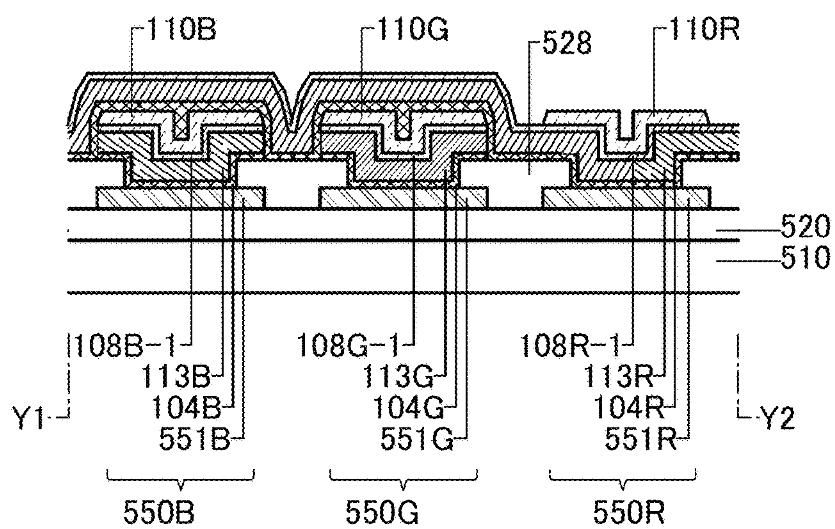

Next, as illustrated in FIG. 6B, with the sacrificial layer 110B and the sacrificial layer 110G respectively over the electron-transport layer 108B-1 and the electron-transport layer 108G-1 remaining, the EL layer 103R is formed over the sacrificial layer 110B, the sacrificial layer 110G, the electrode 551R, and the partition 528. Note that in the state of the EL layer 103R in FIG. 6B, the hole-injection/transport layer 104R, the light-emitting layer 113R, and the first electron-transport layer 108R-1 are formed. For example, the EL layer 103R is formed by a vacuum evaporation method over the sacrificial layer 110B, the sacrificial layer 110G, the electrode 551R, and the partition 528 so as to cover them. Then, the EL layer 103R over the electrode 551R is processed into a predetermined shape. For example, a sacrificial layer is formed over the EL layer 103R, and a resist is formed thereover to have a desired shape as a resist mask by a photolithography method. Part of the sacrificial layer not covered with the obtained resist mask is removed by etching, and then the resist mask is removed, so that a sacrificial layer 110R is formed.

Figure 6C:
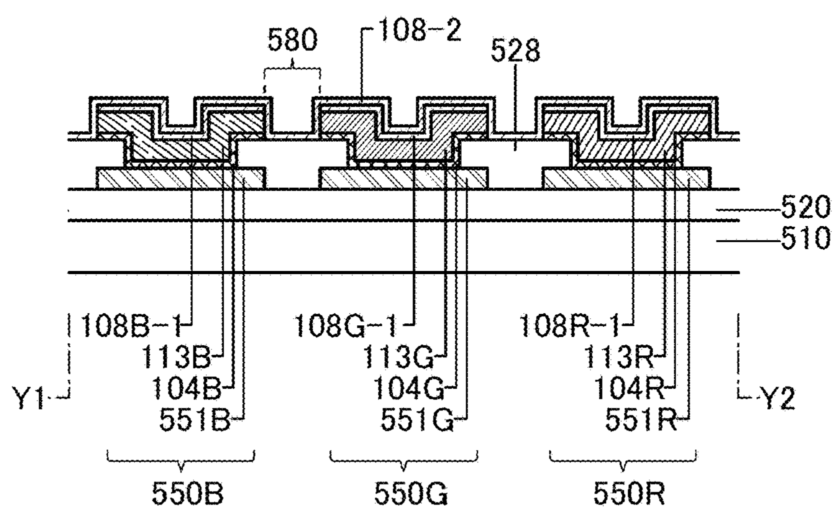

Next, as illustrated in FIG. 6C, part of the EL layer 103R not covered with the sacrificial layer 110R is removed by etching, and the EL layer 103R over the electrode 551B and the EL layer 103R over the electrode 551G are removed by etching, so that the EL layer 103R over the electrode 551R is processed to have side surfaces (or have their side surfaces exposed) or have a belt-like shape that extends in the direction intersecting the sheet of the diagram. Specifically, dry etching is performed using the patterned sacrificial layer 110R over the EL layer 103R overlapping with the electrode 551R. Note that in the case where the sacrificial layer 110R has the aforementioned stacked-layer structure of the first sacrificial layer and the second sacrificial layer, the following steps may be performed to process the EL layer 103R into a predetermined shape. Part of the second sacrificial layer is etched with use of the resist mask, the resist mask is then removed, and part of the first sacrificial layer is etched with use of the second sacrificial layer as a mask. The partition 528 can be used as an etching stopper.

Next, the sacrificial layers (110B, 110G, and 110R) are removed, and the second electron-transport layer 108-2 is formed over the first electron-transport layer 108-1 and the partition 528. For example, the second electron-transport layer 108-2 is formed to be over and cover the second electron-transport layer 108-2, the EL layers (103B, 103G, and 103R), and the partition 528. In this case, the second electron-transport layer 108-2 is formed in contact with the side surfaces of the EL layers (103B, 103G, and 103R) as illustrated in FIG. 6C. This can inhibit entry of oxygen, moisture, or constituent elements thereof into the inside through the side surfaces of the EL layers (103B, 103G, and 103R).

Figure 7A:
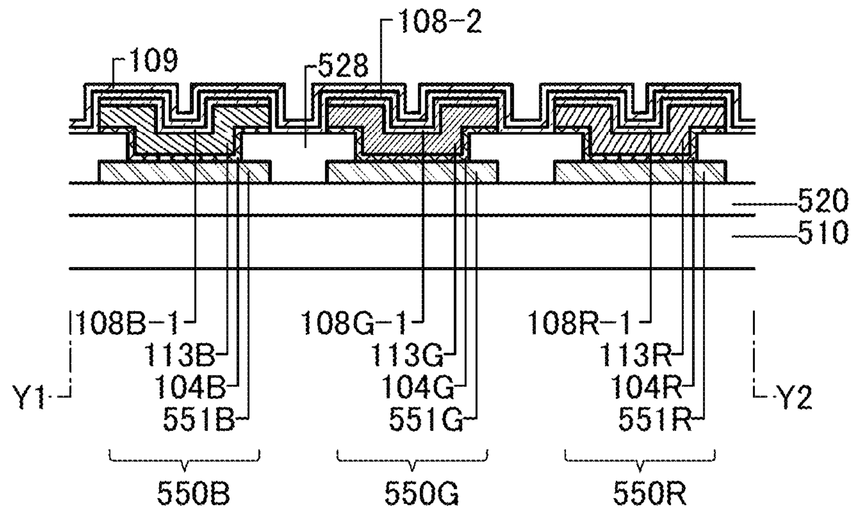
FIG. 7A and FIG. 7B are diagrams illustrating a method for manufacturing a light-emitting apparatus of an embodiment.

Then, as illustrated in FIG. 7A, the electron-injection layer 109 is formed over the second electron-transport layer 108-2. The electron-injection layer 109 is formed by a vacuum evaporation method, for example. Note that the electron-injection layer 109 is formed over the second electron-transport layer 108-2. The electron-injection layer 109 has a structure in contact with the EL layers (103B, 103G, and 103R) with the second electron-transport layer 108-2 therebetween; not that the EL layers (103B, 103G, and 103R) illustrated in FIG. 7A include the hole-injection/transport layers (104R, 104G, and 104B), the light-emitting layers (113B, 113G, and 113R), and the first electron-transport layers (108B-1, 108G-1, and 108R-1).

Figure 7B:
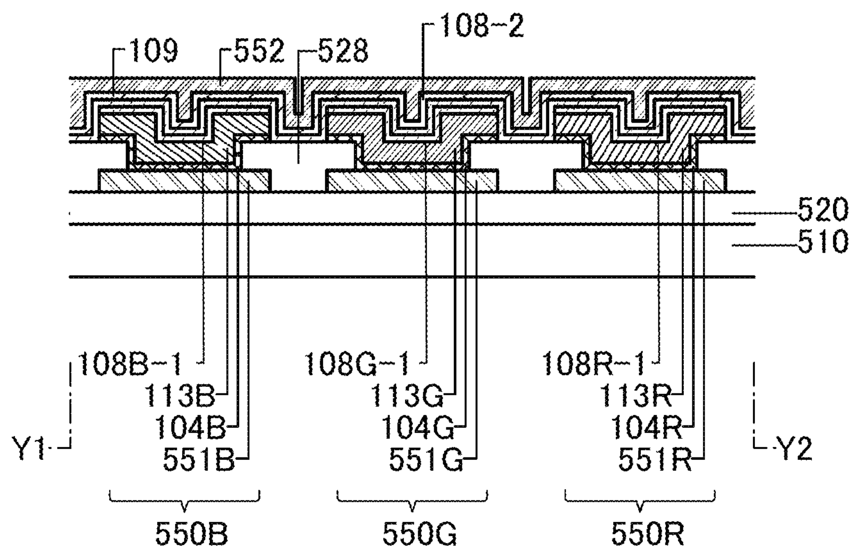

Next, as illustrated in FIG. 7B, the electrode 552 is formed. The electrode 552 is formed by a vacuum evaporation method, for example. The electrode 552 is formed over the electron-injection layer 109. The electrode 552 has a structure in contact with the side surfaces (or end portions) of the EL layers (103B, 103G, and 103R) with the electron-injection layer 109 and the second electron-transport layer 108-2 therebetween; note that the EL layers (103B, 103G, and 103R) illustrated in FIG. 7B include the hole-injection/transport layers (104R, 104G, and 104B), the light-emitting layers (113B, 113G, and 113R), and the first electron-transport layers (108B-1, 108G-1, and 108R-1). Thus, the EL layers (103B, 103G, and 103R) and the electrode 552, specifically the hole-injection/transport layers (104B, 104G, and 104R) in the EL layers (103B, 103G, and 103R) and the electrode 552 can be prevented from being electrically short-circuited.

Through the above steps, the EL layer 103B, the EL layer 103G, and the EL layer 103R in the light-emitting device 550B, the light-emitting device 550G, and the light-emitting device 550R can be processed to be separated from each other.

The EL layers (the EL layer 103B, the EL layer 103G, and the EL layer 103R) are processed to be separated by patterning using a photolithography method; hence, a high-resolution light-emitting apparatus (display panel) can be fabricated. End portions (side surfaces) of the EL layer processed by patterning using a photolithography method have substantially one surface (or are positioned on substantially the same plane).

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as shown in this structure example can inhibit occurrence of crosstalk between adjacent light-emitting devices.

<Structure Example 2 of Light-Emitting Apparatus 700>

Figure 8:
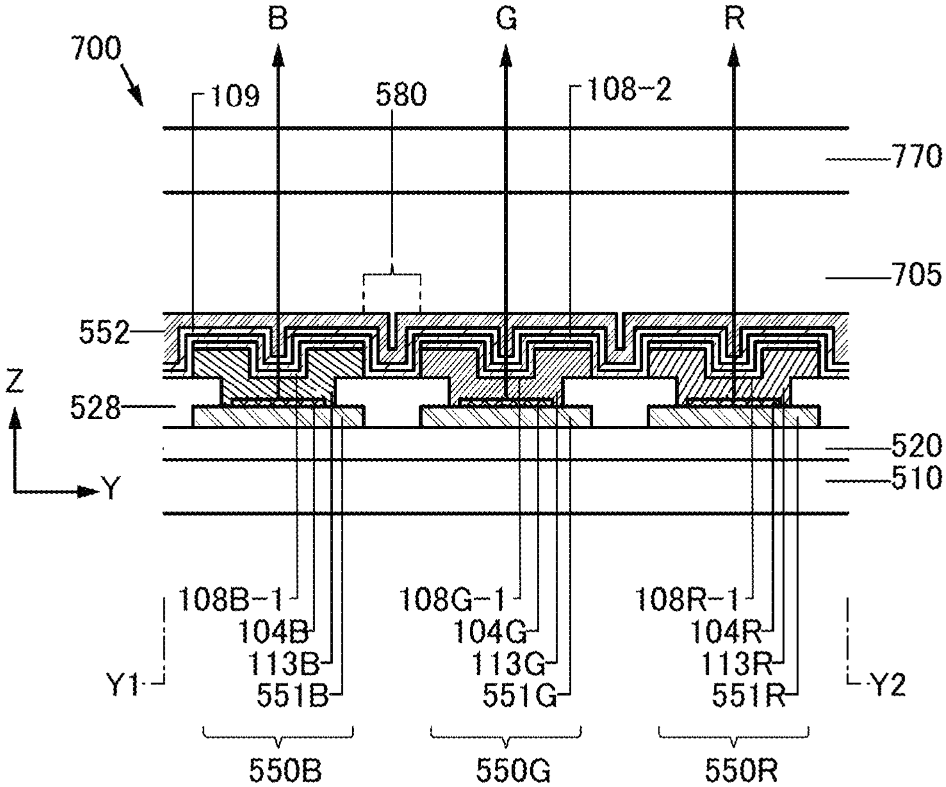
FIG. 8 is a diagram illustrating a light-emitting apparatus of an embodiment.

The light-emitting apparatus 700 illustrated in FIG. 8 includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, a driver circuit GD, a driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The driver circuit GD and the driver circuit SD will be described in Embodiment 4.

The light-emitting device 550B, the light-emitting device 550G, and the light-emitting device 550R each have the device structure described in Embodiment 2. Specifically, the case is described in which the EL layer 103 in the structure illustrated in FIG. 1A differs between the light-emitting devices.

Note that specific structures of the light-emitting devices illustrated in FIG. 8 are the same as the structures of the light-emitting device 550B, the light-emitting device 550G, and the light-emitting device 550R illustrated in FIG. 3.

As illustrated in FIG. 8, the hole-injection/transport layers (104B, 104G, and 104R) in the EL layers (103B, 103G, and 103R) of the light-emitting devices (550B, 550G, and 550R) are smaller than the other functional layers in the EL layers and are covered with the functional layers stacked over the hole-injection/transport layers.

In this structure, the hole-injection/transport layers (104B, 104G, and 104R) in the EL layers are completely separated from each other by being covered with the other functional layers; thus, the insulating layers (107 in FIG. 1C) for preventing a short circuit between the hole-injection/transport layers and the electrode 552, which are described in Structure example 1, are unnecessary.

The EL layers (103B, 103G, and 103R) in this structure are processed to be separated by patterning using a photolithography method; hence, end portions (side surfaces) of the processed EL layers have substantially one surface (or are positioned on substantially the same plane).

The EL layers (103B, 103G, and 103R) in the light-emitting devices are each provided with the space 580 between one light-emitting device and the adjacent light-emitting device. When the space 580 is denoted by a distance SE between the EL layers in the adjacent light-emitting devices, decreasing the distance SE can increase the aperture ratio and resolution. By contrast, as the distance SE is increased, the effect of the difference in the manufacturing steps between the adjacent light-emitting devices becomes permissible, which leads to an increase in manufacturing yield. Since the light-emitting device manufactured according to this specification is suitable for a miniaturization process, the distance SE between the EL layers in the adjacent light-emitting devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, and still further preferably longer than or equal to 1 μm and shorter than or equal to 2 μm. Typically, the distance SE is preferably greater than or equal to 1 μm and less than or equal to 2 μm (e.g., 1.5 μm or a neighborhood thereof).

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as shown in this structure example can inhibit occurrence of crosstalk between adjacent light-emitting devices.

In this specification and the like, a device formed using a metal mask or an FMM (fine metal mask, high-resolution metal mask) is sometimes referred to as a device having an MM (metal mask) structure. In this specification and the like, a device formed without using a metal mask or an FMM may be referred to as a device having an MML (metal maskless) structure. A light-emitting apparatus having an MML structure is formed without using a metal mask and thus has higher flexibility in designing the pixel arrangement, the pixel shape, and the like than a light-emitting apparatus having an FMM structure or an MM structure.

Note that in the method for manufacturing a light-emitting apparatus having an MML structure, an island-shaped EL layer is formed not by patterning with use of a metal mask but by processing after formation of an EL layer over an entire surface. Accordingly, a light-emitting apparatus with a higher resolution or a higher aperture ratio than a conventional one can be achieved. Moreover, EL layers can be formed separately for the respective colors, enabling the light-emitting apparatus to perform extremely clear display with high contrast and high display quality. Moreover, providing the sacrificial layer over the EL layer can reduce damage to the EL layer in the manufacturing process of the light-emitting apparatus, resulting in an increase in the reliability of the light-emitting device.

As a way of processing the light-emitting layer into an island shape, there is performing processing by a photolithography method on the EL layer in which the functional layers up to the light-emitting layer are formed. In that case, damage to the light-emitting layer (e.g., processing damage) might significantly degrade the reliability. In view of the above, in the manufacture of the display panel of one embodiment of the present invention, a sacrificial layer or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable display panel.

The structure described in this embodiment can be used in an appropriate combination with any of the structures described in the other embodiments.

Embodiment 4

In this embodiment, a light-emitting apparatus of one embodiment of the present invention will be described with reference to FIG. 9A to FIG. 11B. The light-emitting apparatus 700 illustrated in FIG. 9A to FIG. 11B includes the light-emitting device described in Embodiment 2. The light-emitting apparatus 700 described in this embodiment can be referred to as a display panel because it can be used in a display portion of an electronic appliance and the like.

Figure 9A:
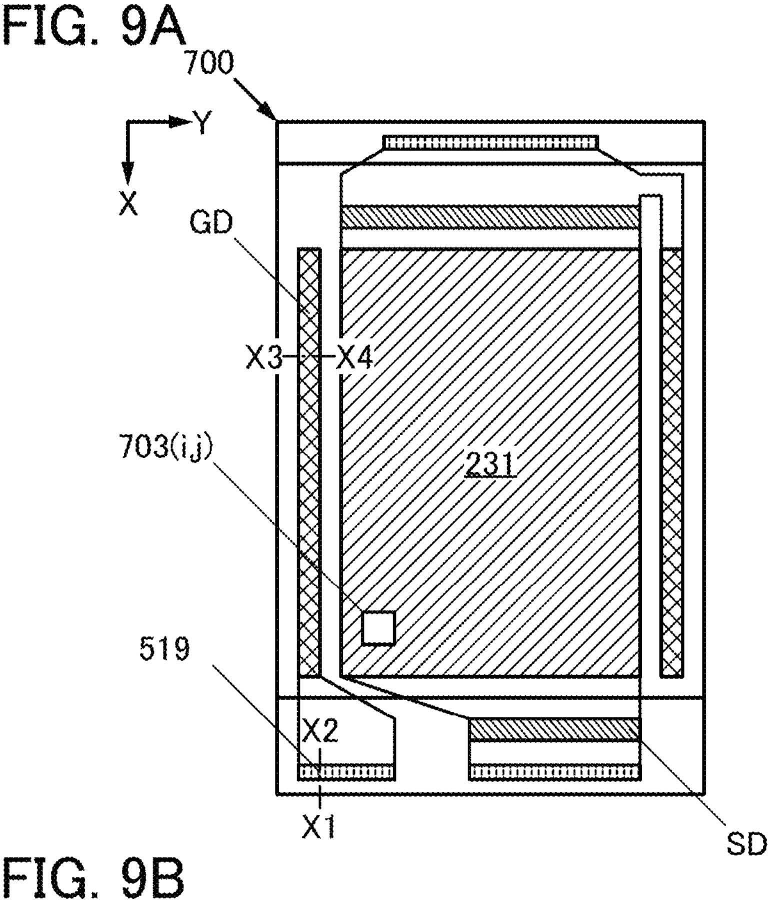
FIG. 9A and FIG. 9B are diagrams illustrating a light-emitting apparatus of an embodiment.
Figure 9B:
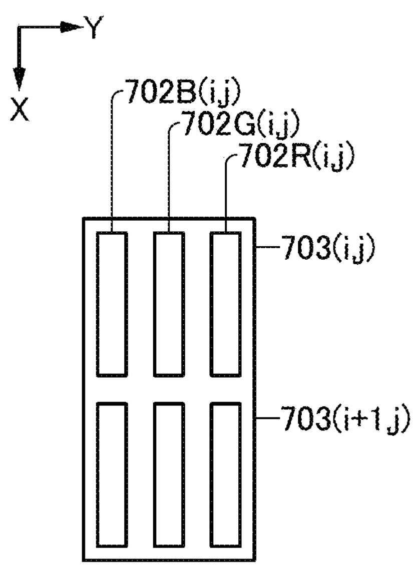

As illustrated in FIG. 9A, the light-emitting apparatus 700 described in this embodiment includes a display region 231, and the display region 231 includes a pixel set 703(*i,j*). A pixel set 703(*i*+1,j) adjacent to the pixel set 703(*i,j*) is provided as illustrated in FIG. 9B.

Note that a plurality of pixels can be used as the pixel 703(*i,j*). For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that an individual pixel cannot display.

Specifically, a pixel 702B(i,j) displaying blue, a pixel 702G(i,j) displaying green, and a pixel 702R(i,j) displaying red can be used in the pixel 703(*i,j*). The pixel 702B(i,j), the pixel 702G(i,j), and the pixel 702R(i,j) can each be referred to as a subpixel.

A pixel displaying white or the like may be used in addition to the above set in the pixel 703(*i,j*), for example. A pixel displaying cyan, a pixel displaying magenta, and a pixel displaying yellow may be used in the pixel 703(*i,j*) as subpixels.

A pixel that emits infrared light in addition to the above set may be used in the pixel 703(*i,j*). Specifically, a pixel that emits light including light with a wavelength greater than or equal to 650 nm and less than or equal to 1000 nm can be used in the pixel 703(*i,j*).

The driver circuit GD and the driver circuit SD are provided around the display region 231 in FIG. 9A. In addition, a terminal 519 electrically connected to the driver circuit GD, the driver circuit SD, and the like is provided. The terminal 519 can be electrically connected to a flexible printed circuit FPC1, for example, as illustrated in FIG. 11A.

The driver circuit GD has a function of supplying a first selection signal and a second selection signal. For example, the driver circuit GD is electrically connected to a conductive film G1(*i*) described later to supply the first selection signal, and is electrically connected to a conductive film G2(*i*) described later to supply the second selection signal. The driver circuit SD has a function of supplying an image signal and a control signal, and the control signal includes a first level and a second level. For example, the driver circuit SD is electrically connected to a conductive film S1*g*(*j*) described later to supply the image signal, and is electrically connected to a conductive film S2*g*(*j*) described later to supply the control signal.

Figure 11A:
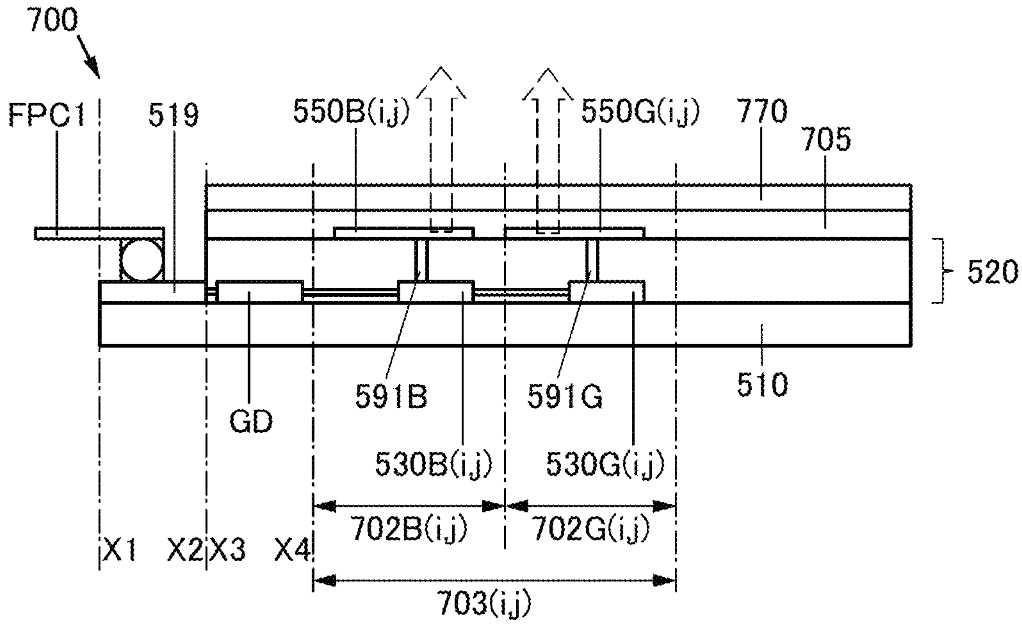
FIG. 11A and FIG. 11B are diagrams each illustrating a light-emitting apparatus of an embodiment.

FIG. 11A shows a cross-sectional view of the light-emitting apparatus taken along each of the dashed-dotted line X1-X2 and the dashed-dotted line X3-X4 in FIG. 9A. As illustrated in FIG. 11A, the light-emitting apparatus 700 includes the functional layer 520 between the first substrate 510 and the second substrate 770. The functional layer 520 includes, for example, the driver circuit GD, the driver circuit SD, and the like that are described above and wirings that electrically connect these circuits. The structure of the functional layer 520 illustrated in FIG. 11A includes a pixel circuit 530B(i,j), a pixel circuit 530G(i,j), and the driver circuit GD; however, it is not limited thereto.

Each pixel circuit (e.g., the pixel circuit 530B(i,j) and the pixel circuit 530G(i,j) in FIG. 11A) included in the functional layer 520 is electrically connected to light-emitting devices (e.g., a light-emitting device 550B(i,j) and a light-emitting device 550G(i,j) in FIG. 11A) formed over the functional layer 520. Specifically, the light-emitting device 550B(i,j) is electrically connected to the pixel circuit 530B (i,j) through a conductive layer provided in an opening 591B, and the light-emitting device 550G(i,j) is electrically connected to the pixel circuit 530G(i,j) through a conductive layer provided in an opening 591G. An insulating layer 705 is provided over the functional layer 520 and the light-emitting devices, and has a function of attaching the second substrate 770 and the functional layer 520.

As the second substrate 770, a substrate where touch sensors are arranged in a matrix can be used. For example, a substrate provided with a capacitive touch sensor or an optical touch sensor can be used for the second substrate 770. Thus, the light-emitting apparatus of one embodiment of the present invention can be used as a touch panel.

Figure 10A:
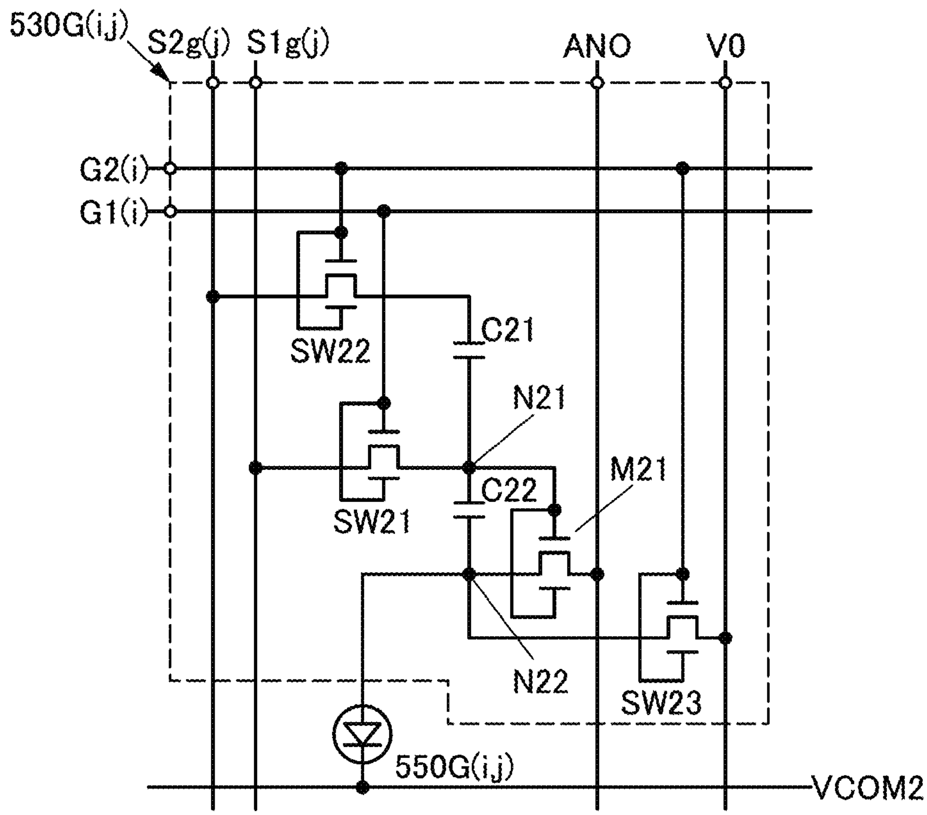
FIG. 10A and FIG. 10B are diagrams illustrating a light-emitting apparatus of an embodiment.

FIG. 10A illustrates a specific configuration of the pixel circuit 530G(i,j).

The pixel circuit 530G(i,j) includes a switch SW21, a switch SW22, a transistor M21, a capacitor C21, and a node N21 as illustrated in FIG. 10A. In addition, the pixel circuit 530G(i,j) includes a node N22, a capacitor C22, and a switch SW23.

The transistor M21 includes a gate electrode electrically connected to the node N21, a first electrode electrically connected to the light-emitting device 550G(i,j), and a second electrode electrically connected to a conductive film ANO.

The switch SW21 includes a first terminal electrically connected to the node N21 and a second terminal electrically connected to the conductive film S1$g(j)$. The switch SW21 has a function of controlling its on/off state on the basis of the potential of the conductive film G1($i$).

The switch SW22 includes a first terminal electrically connected to the conductive film S2$g(j)$ and a second terminal. The switch SW22 has a function of controlling its on/off state on the basis of the potential of the conductive film G2($i$).

The capacitor C21 includes a conductive film electrically connected to the node N21 and a conductive film electrically connected to a second terminal of the switch SW22.

Thus, the image signal can be stored in the node N21. A potential of the node N21 can be changed using the switch SW22. Alternatively, the intensity of light emitted from the light-emitting device 550G(i,j) can be controlled with the potential of the node N21.

Figure 10B:
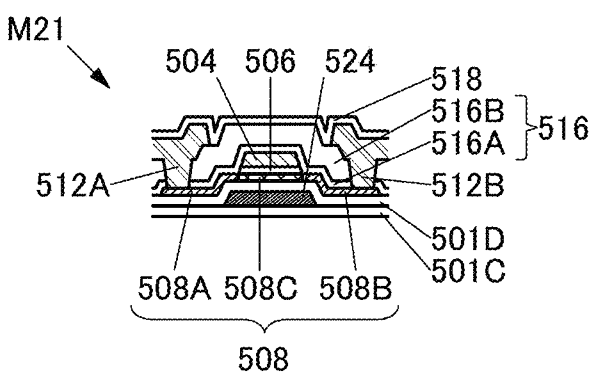

FIG. 10B illustrates an example of a specific structure of the transistor M21 described in FIG. 10A. As the transistor M21, a bottom-gate transistor, a top-gate transistor, or the like can be used as appropriate.

The transistor illustrated in FIG. 10B includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

The insulating film 506 includes a region sandwiched between the semiconductor film 508 and the conductive film 504. The insulating film 506 has a function of a first gate insulating film.

The conductive film 512A has one of a function of a source electrode and a function of a drain electrode, and the conductive film 512B has a function of the other of the source electrode and the function of the drain electrode.

A conductive film 524 can be used for the transistor. The conductive film 524 includes a region where the semiconductor film 508 is sandwiched between the conductive film 524 and the conductive film 504. The conductive film 524 has a function of a second gate electrode. An insulating film 501D is sandwiched between the semiconductor film 508 and the conductive film 524, and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516.

For example, a material having a function of inhibiting diffusion of oxygen, hydrogen, water, an alkali metal, an alkaline earth metal, and the like is preferably used for the insulating film 518. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that the semiconductor film used in the transistor of the driver circuit can be formed in the step of forming the semiconductor film used in the transistor of the pixel circuit. A semiconductor film having the same composition as the semiconductor film used in the transistor of the pixel circuit can be used in the transistor for the driver circuit, for example.

For the semiconductor film 508, a semiconductor containing a Group 14 element can be used. Specifically, a semiconductor containing silicon can be used for the semiconductor film 508.

Hydrogenated amorphous silicon can be used for the semiconductor film 508. Alternatively, microcrystalline silicon or the like can be used for the semiconductor film 508. Thus, a light-emitting apparatus having less display unevenness than a light-emitting apparatus (or a display panel) using polysilicon for the semiconductor film 508, for example, can be provided. It also facilitates the increase in size of the light-emitting apparatus.

Polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for fabrication of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic appliance can be reduced.

Single crystal silicon can be used for the semiconductor film 508. In this case, the resolution higher than that of a light-emitting apparatus (or a display panel) using hydrogenated amorphous silicon for the semiconductor film 508, for example, can be provided. A light-emitting apparatus having less display unevenness than a light-emitting apparatus using polysilicon for the semiconductor film 508, for example, can be provided. Smart glasses or a head-mounted display can be provided, for example.

A metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Thus, cumulative fatigue stored in a user of an electronic appliance can be reduced. Moreover, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having lower leakage current in the off state than a transistor using amorphous silicon for the semiconductor film. Specifically, a transistor using an oxide semiconductor for a semiconductor film is preferably used as a switch or the like. Note that a circuit in which a transistor using an oxide semiconductor for the semiconductor film is used as a switch is capable of retaining the potential of a floating node for a longer time than a circuit in which a transistor using amorphous silicon for the semiconductor film is used as a switch.

Figure 11B:
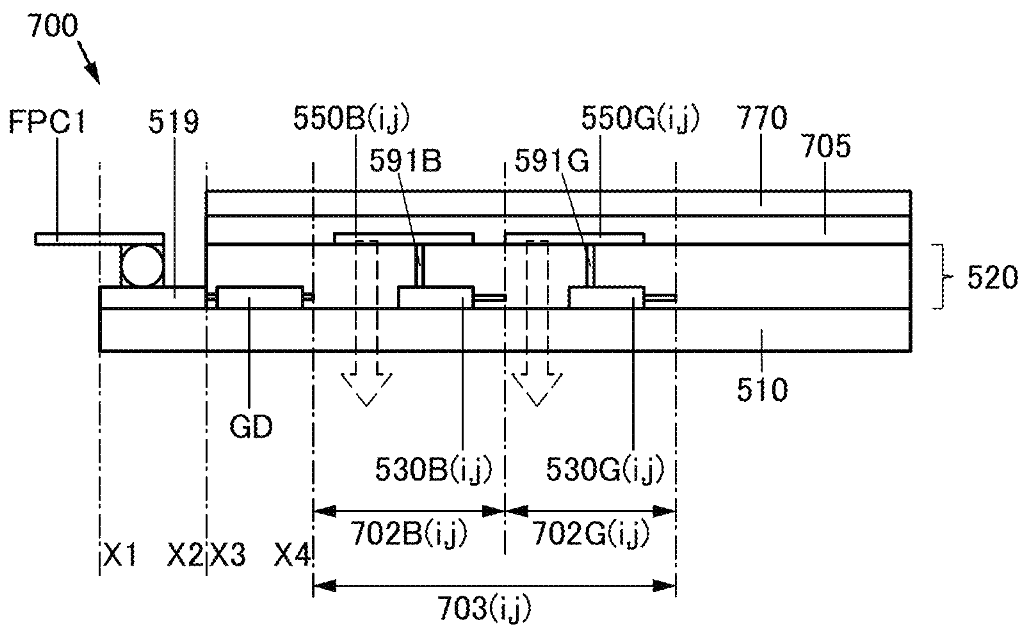

Although the light-emitting apparatus in FIG. 11A has a structure in which light is extracted from the second substrate 770 side (a top-emission structure), the light-emitting apparatus may have a structure in which light is extracted from the first substrate 510 side (a bottom-emission structure) as illustrated in FIG. 11B. In a bottom-emission light-emitting apparatus, the first electrode 101 is formed as a transflective electrode and the second electrode 102 is formed as a reflective electrode.

Figure 12A:
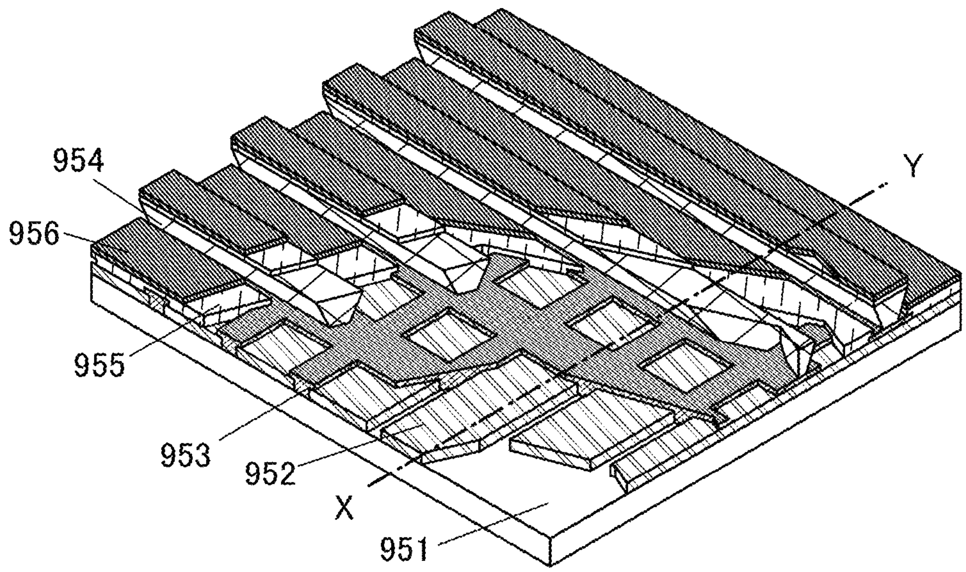
FIG. 12A and FIG. 12B are diagrams illustrating a light-emitting apparatus of an embodiment.
Figure 12B:
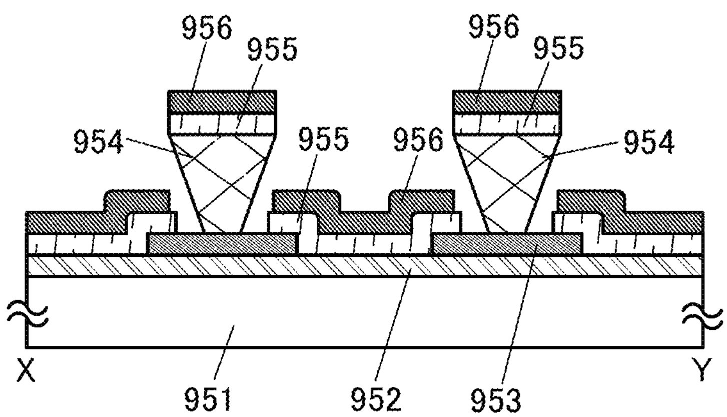

Although FIGS. 11A and 11B illustrate active-matrix light-emitting apparatuses, the structure of the light-emitting device described in Embodiment 2 may be applied to a passive-matrix light-emitting apparatus illustrated in FIGS. 12A and 12B.

Note that FIG. 12A is a perspective view of a passive matrix light-emitting apparatus, and FIG. 12B is a cross-sectional view taken along the line X-Y in FIG. 12A. In FIG. 12A and FIG. 12B, an electrode 952 and an electrode 956 are provided over a substrate 951, and an EL layer 955 is provided between the electrode 952 and the electrode 956. An end portion of the electrode 952 is covered with an insulating layer 953. A partition layer 954 is provided over the insulating layer 953. Sidewalls of the partition layer 954 are aslope such that the distance between one sidewall and the other sidewall is gradually narrowed toward the surface of the substrate. That is, a cross section in the short side direction of the partition layer 954 is a trapezoidal shape, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). By providing the partition layer 954 in this manner, defects of the light-emitting device due to static charge or the like can be prevented.

Note that the structure described in this embodiment can be used in an appropriate combination with any of the structures described in the other embodiments.

Embodiment 5

In this embodiment, electronic appliances of one embodiment of the present invention will be described with reference to FIG. 13A to FIG. 15B.

Figure 13A:
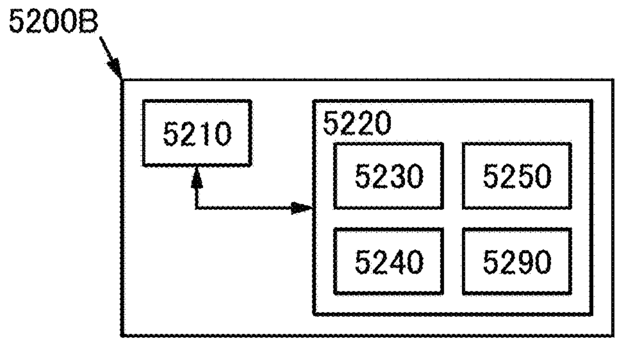
FIG. 13A to FIG. 13E are diagrams illustrating electronic appliances of an embodiment.
Figure 13B:
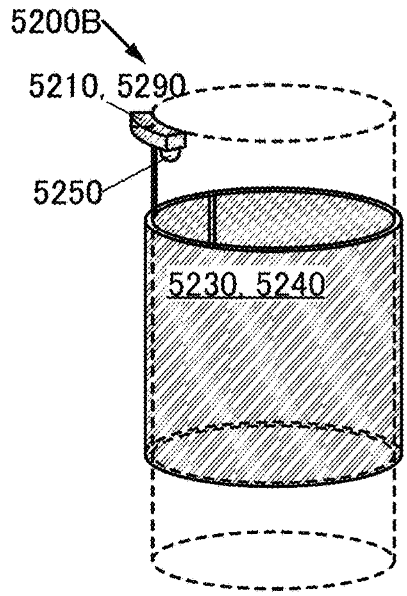
Figure 13C:
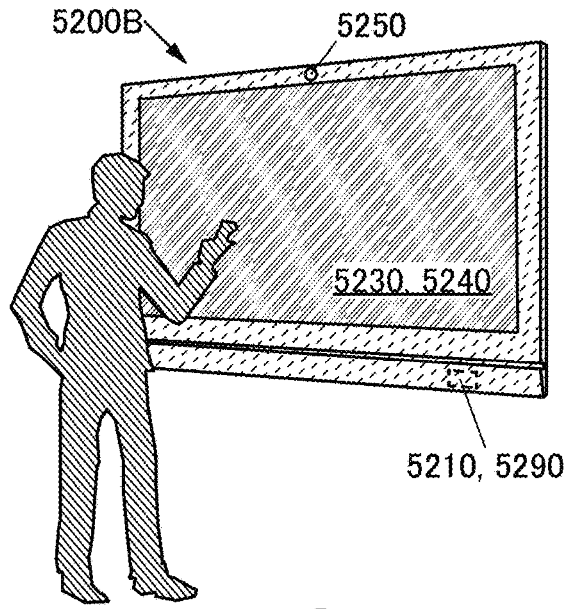
Figure 13D:
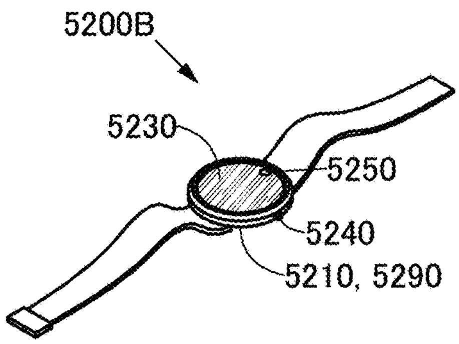
Figure 13E:
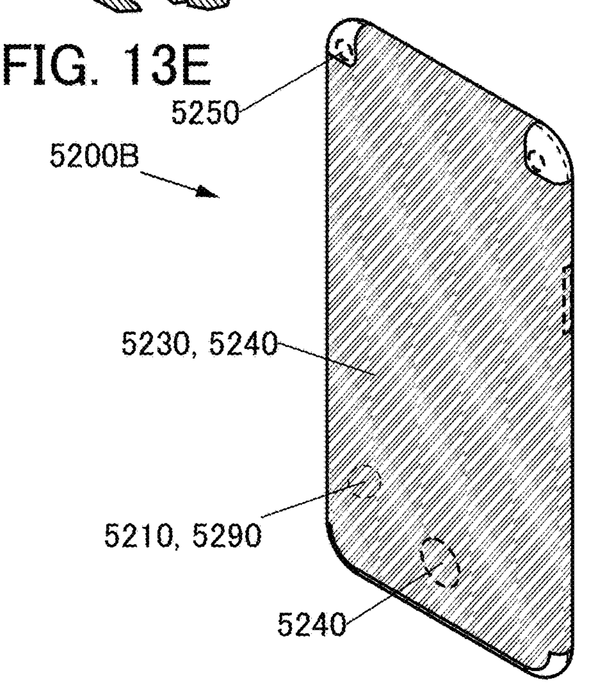
Figure 14A:
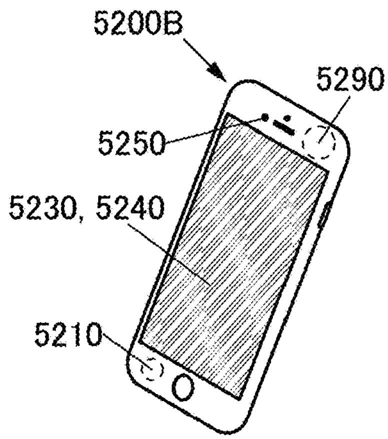
FIG. 14A to FIG. 14E are diagrams illustrating electronic appliances of an embodiment.
Figure 14B:
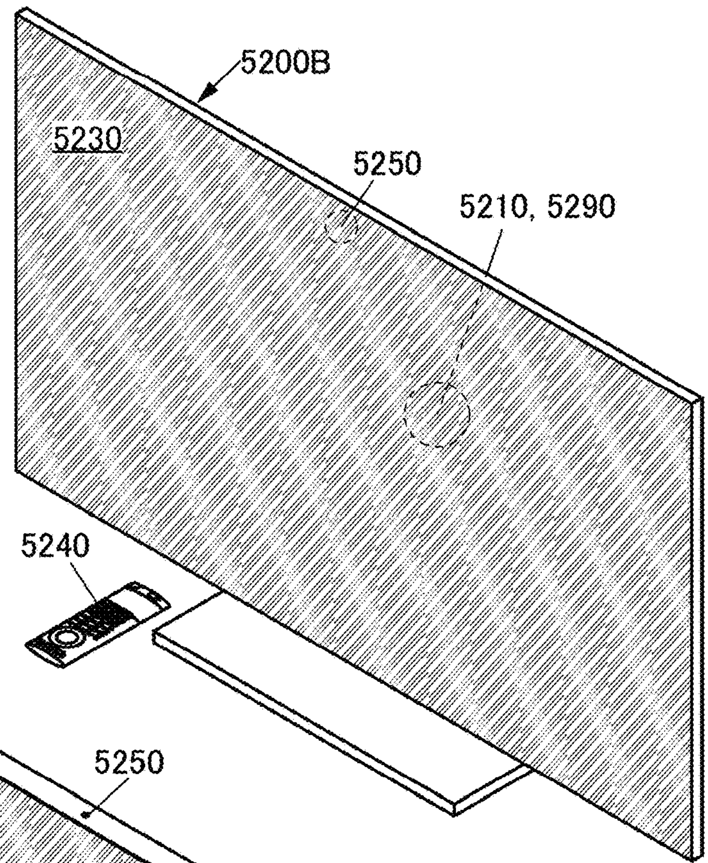
Figure 14C:
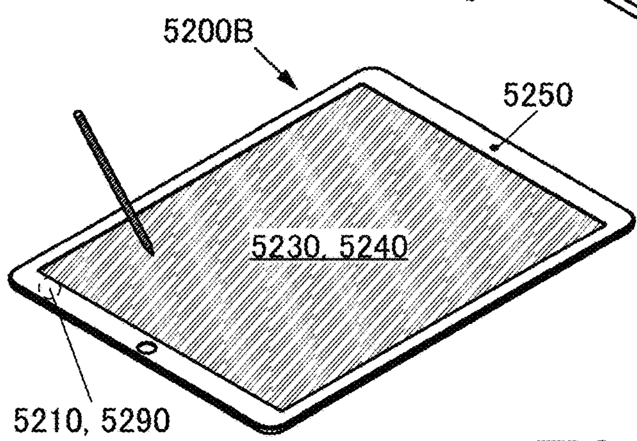
Figure 14D:
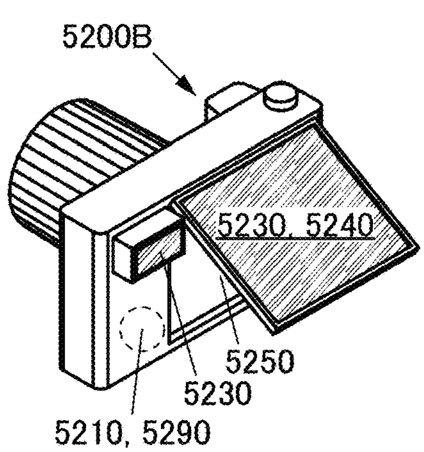
Figure 14E:
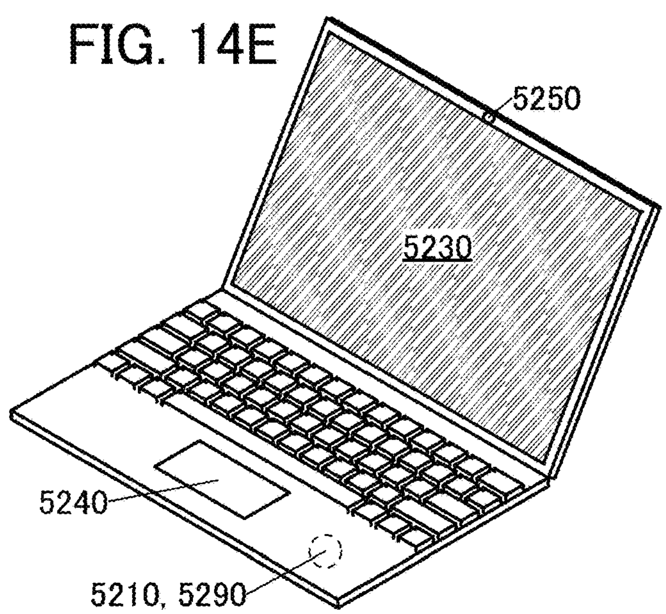
Figure 15A:
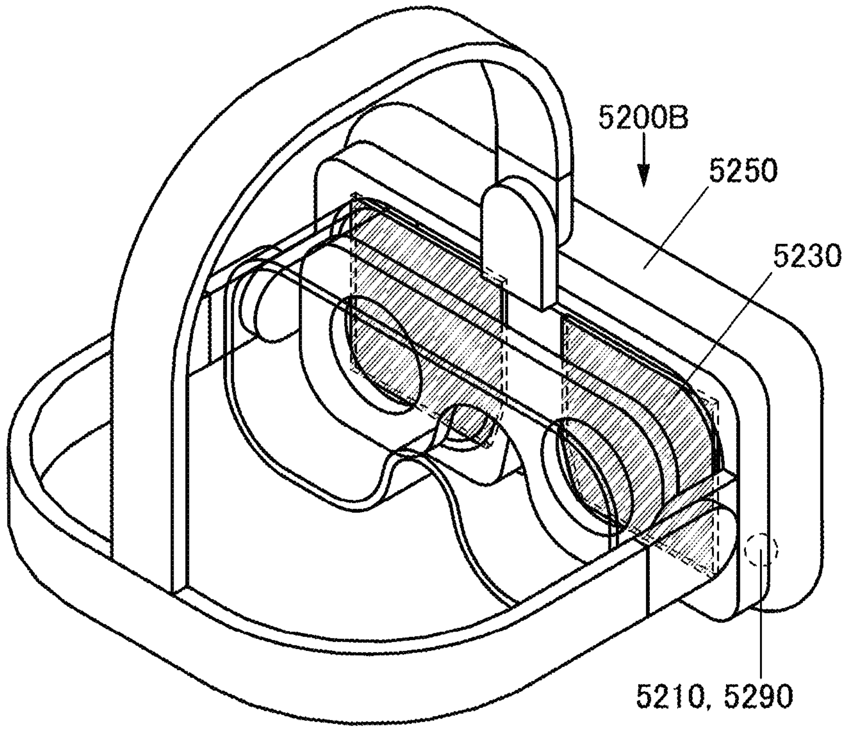
FIG. 15A and FIG. 15B are diagrams illustrating electronic appliances of an embodiment.
Figure 15B:
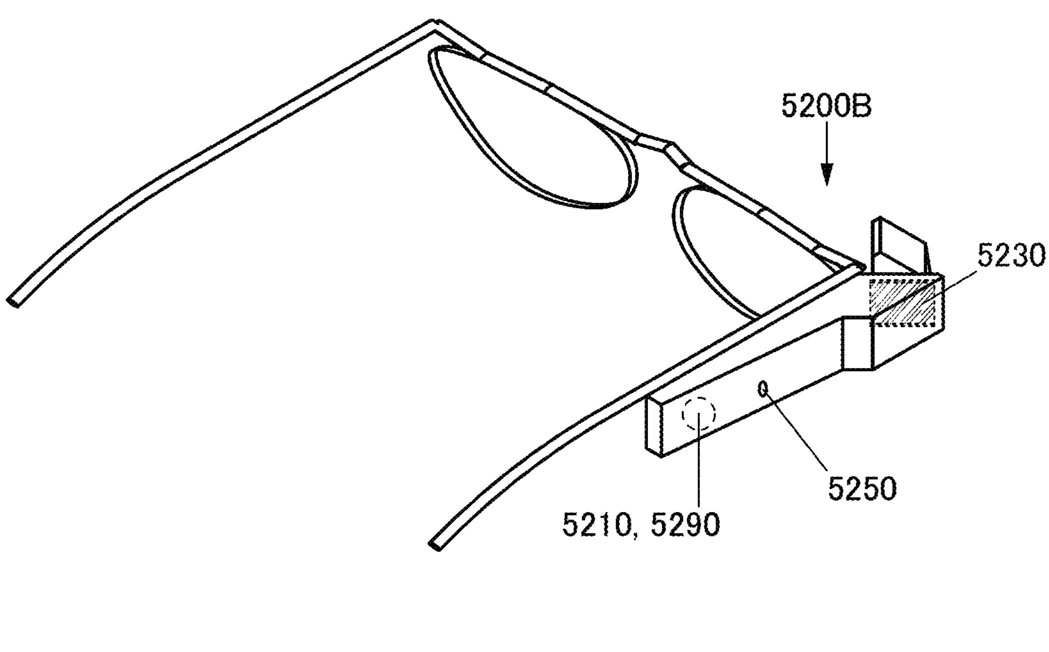

FIG. 13A to FIG. 15B are diagrams illustrating structures of electronic appliances of one embodiment of the present invention. FIG. 13A is a block diagram of the electronic appliance and FIG. 13B to FIG. 13E are perspective views illustrating structures of the electronic appliances. FIG. 14A to FIG. 14E are perspective views illustrating structures of electronic appliances. FIG. 15A and FIG. 15B are perspective views illustrating structures of an electronic appliance.

An electronic appliance 5200B described in this embodiment includes an arithmetic device 5210 and an input/output device 5220 (see FIG. 13A).

The arithmetic device 5210 has a function of receiving operation information and a function of supplying image information on the basis of the operation information.

The input/output device 5220 includes the display portion 5230, an input portion 5240, a sensing portion 5250, and a communication portion 5290. The input/output device 5220 has a function of supplying operation information, a function of receiving image information, a function of supplying sensing information, a function of supplying communication information, and a function of receiving communication information.

The input portion 5240 has a function of supplying operation information. For example, the input portion 5240 supplies operation information on the basis of operation by a user of the electronic appliance 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image information. For example, the display panel described in Embodiment 2 can be used for the display portion 5230.

The sensing portion 5250 has a function of supplying sensing information. For example, the sensing portion 5250 has a function of sensing a surrounding environment where the electronic appliance is used and supplying sensing information.

Specifically, an illuminance sensor, an imaging device, an attitude detection device, a pressure sensor, a human motion sensor, or the like can be used as the sensing portion 5250.

The communication portion 5290 has a function of receiving communication information and a function of supplying communication information. For example, the communication portion 5290 has a function of being connected to another electronic appliance or a communication network through wireless communication or wired communication. Specifically, the communication portion 5290 has a function of wireless local area network communication, telephone communication, near field communication, or the like.

FIG. 13B illustrates an electronic appliance having an outer shape along a cylindrical column or the like. An example of such an electronic appliance is digital signage. The display panel of one embodiment of the present invention can be used for a display portion 5230. In addition, the electronic appliance may have a function of changing its display method in accordance with the illuminance of a usage environment. Furthermore, the electronic appliance has a function of changing displayed content in response to sensed existence of a person. This allows the electronic appliance to be provided on a column of a building, for example. The electronic appliance can display advertising, guidance, or the like.

FIG. 13C illustrates an electronic appliance having a function of generating image data on the basis of the path of a pointer used by the user. Examples of such an electronic appliance include an electronic blackboard, an electronic bulletin board, and digital signage. Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen.

FIG. 13D illustrates an electronic appliance that is capable of receiving data from another device and displaying the data on the display portion 5230. An example of such an electronic appliance is a wearable electronic appliance. Specifically, the electronic appliance can display several options, and the user can choose some from the options and send a reply to the data transmitter. For example, the electronic appliance has a function of changing its display method in accordance with the illuminance of a usage environment. Thus, for example, the power consumption of a wearable electronic appliance can be reduced. Alternatively, for example, a wearable electronic appliance can display an image so as to be suitably used even in an environment under strong external light, e.g., outdoors in fine weather.

FIG. 13E illustrates an electronic appliance including the display portion 5230 having a surface gently curved along a side surface of a housing. An example of such an electronic appliance is a mobile phone. The display portion 5230 includes a display panel, and the display panel has a function of performing display on the front surface, the side surfaces, the top surface, and the rear surface, for example. Thus, for example, a mobile phone can display information not only on its front surface but also on its side surfaces, its top surface, and its rear surface.

FIG. 14A illustrates an electronic appliance that is capable of receiving data via the Internet and displaying the data on the display portion 5230. An example of such an electronic appliance is a smartphone. A created message can be checked on the display portion 5230, for example. The created message can be sent to another device. For example, the electronic appliance has a function of changing its display method in accordance with the illuminance of a usage environment. Thus, the power consumption of a smartphone can be reduced. Alternatively, for example, a smartphone can display an image so as to be suitably used even in an environment under strong external light, e.g., outdoors in fine weather.

FIG. 14B illustrates an electronic appliance that can use a remote controller as the input portion 5240. An example of such an electronic appliance is a television system. For example, the electronic appliance can receive data from a broadcast station or via the Internet and display the data on the display portion 5230. An image of a user can be captured using the sensing portion 5250. The image of the user can be transmitted. The electronic appliance can acquire a viewing history of the user and provide it to a cloud service. The electronic appliance can acquire recommendation information from a cloud service and display the information on the display portion 5230. A program or a moving image can be displayed on the basis of the recommendation information. For example, the electronic appliance has a function of changing its display method in accordance with the illuminance of a usage environment. Accordingly, for example, a television system can display an image to be suitably used even when irradiated with strong external light that enters a room in fine weather.

FIG. 14C illustrates an electronic appliance that is capable of receiving educational materials via the Internet and displaying them on the display portion 5230. An example of such an electronic appliance is a tablet computer. An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another electronic appliance. When the electronic appliance is placed on a stand or the like, the display portion 5230 can be used as a sub-display. Thus, for example, a tablet computer can display an image to be suitably used even in an environment under strong external light, e.g., outdoors in fine weather.

FIG. 14D illustrates an electronic appliance including a plurality of display portions 5230. An example of such an electronic appliance is a digital camera. For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The electronic appliance has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

FIG. 14E illustrates an electronic appliance in which the electronic appliance of this embodiment is used as a master to control another electronic appliance used as a slave. An example of such an electronic appliance is a portable personal computer. As another example, part of image data can be displayed on the display portion 5230 and another part of the image data can be displayed on a display portion of another electronic appliance. An image signal can be supplied. With the communication portion 5290, information to be written can be obtained from an input portion of another electronic appliance. Thus, a large display region can be utilized by using a portable personal computer, for example.

FIG. 15A illustrates an electronic appliance including the sensing portion 5250 that senses an acceleration or a direction. An example of such an electronic appliance is a goggles-type electronic appliance. The sensing portion 5250 can supply data on the position of the user or the direction in which the user faces. The electronic appliance can generate image information for the right eye and image information for the left eye in accordance with the position of the user or the direction in which the user faces. The display portion 5230 includes a display region for the right eye and a display region for the left eye. Thus, a virtual reality image that gives the user a sense of immersion can be displayed on a goggles-type electronic appliance, for example.

FIG. 15B illustrates an electronic appliance including an imaging device and the sensing portion 5250 that senses an acceleration or a direction. An example of such an electronic appliance is a glasses-type electronic appliance. The sensing portion 5250 can supply data on the position of the user or the direction in which the user faces. The electronic appliance can generate image information in accordance with the position of the user or the direction in which the user faces. Accordingly, the information can be shown together with a real-world scene, for example. An augmented reality image can be displayed on a glasses-type data electronic appliance.

Note that this embodiment can be combined with any of the other embodiments described in this specification as appropriate.

Embodiment 6

Figure 16A:
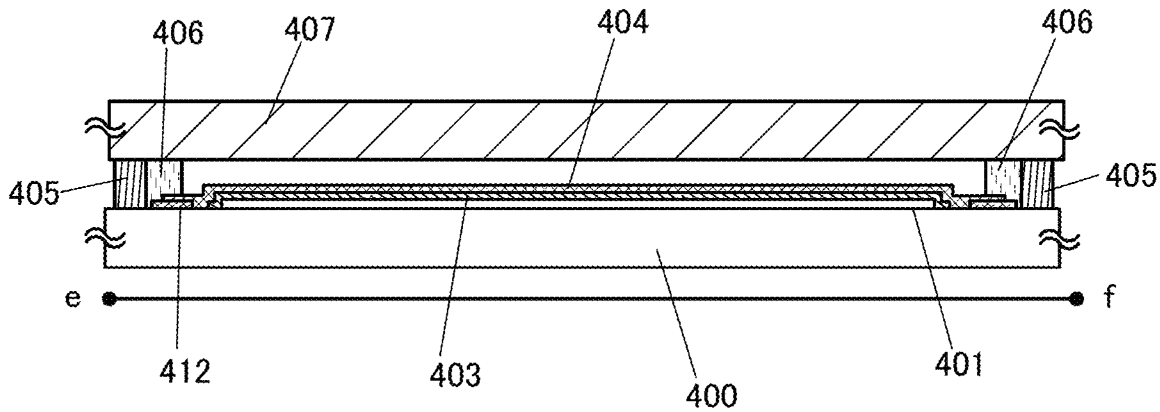
FIG. 16A and FIG. 16B are diagrams illustrating an electronic appliance of an embodiment.
Figure 16B:
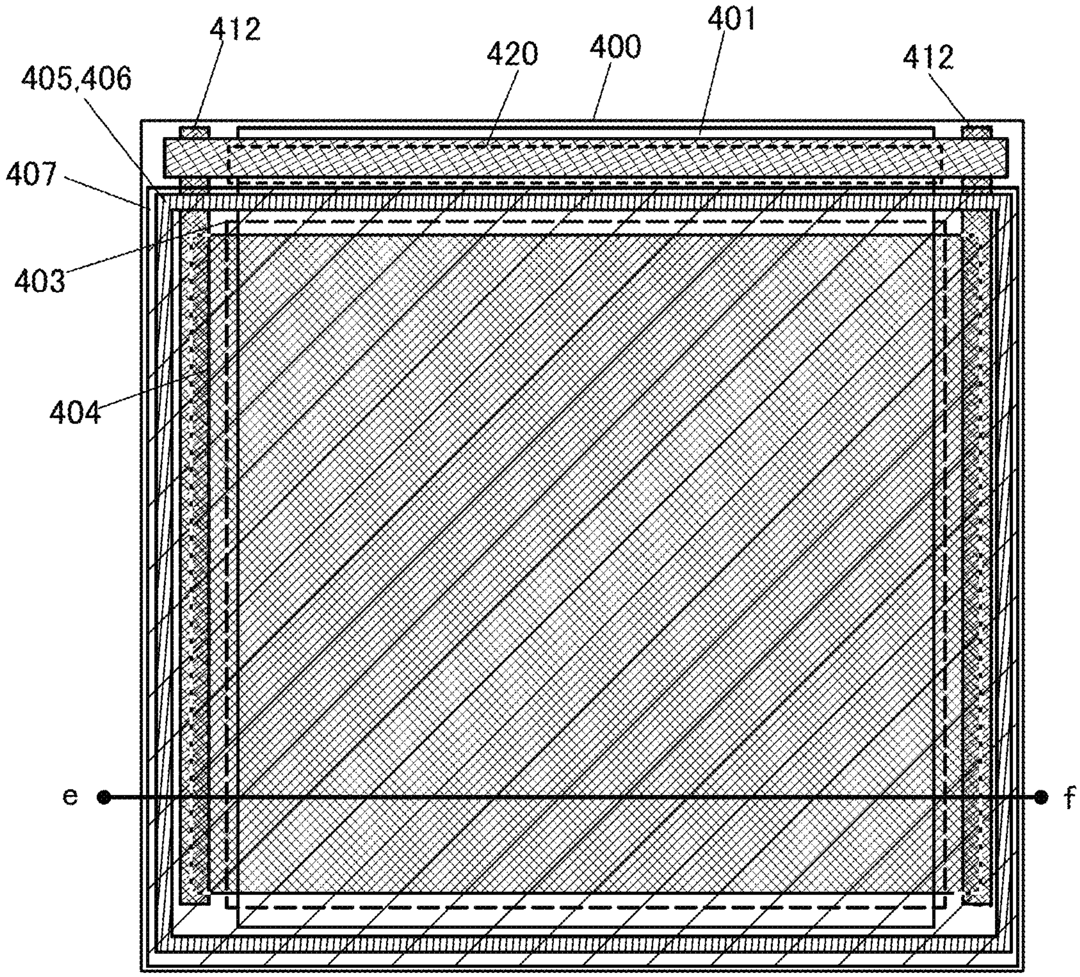

In this embodiment, a structure in which the light-emitting device described in Embodiment 2 is used for a lighting device will be described with reference to FIG. 16. FIG. 16A is a cross-sectional view taken along Line e-f in FIG. 16B which is a top view of a lighting device.

In the lighting device in this embodiment, a first electrode 401 is formed over a substrate 400 which is a support and has a light-transmitting property. The first electrode 401 corresponds to the first electrode 101 in Embodiment 2. In the case where light emission is extracted from the first electrode 401 side, the first electrode 401 is formed with a material having a light-transmitting property.

A pad 412 for supplying a voltage to a second electrode 404 is formed over the substrate 400.

An EL layer 403 is formed over the first electrode 401. The structure of the EL layer 403 corresponds to the structure of the EL layer 103 in Embodiment 2. Note that for these structures, the corresponding description can be referred to.

The second electrode 404 is formed to cover the EL layer 403. The second electrode 404 corresponds to the second electrode 102 in Embodiment 2. In the case where light-emission is extracted from the first electrode 401 side, the second electrode 404 is formed with a material having high reflectivity. The second electrode 404 is supplied with a voltage when connected to the pad 412.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can be a lighting device with low power consumption.

The substrate 400 over which the light-emitting device having the above structure is formed is fixed to a sealing substrate 407 with sealants 405 and 406 and sealing is performed, whereby the lighting device is completed. It is possible to use only either the sealant 405 or 406. In addition, the inner sealant 406 (not illustrated in FIG. 16B) can be mixed with a desiccant, which enables moisture to be adsorbed, resulting in improved reliability.

When parts of the pad 412 and the first electrode 401 are provided to extend to the outside of the sealants 405 and 406, those can serve as external input terminals. An IC chip 420 mounted with a converter or the like may be provided over the external input terminals.

Embodiment 7

Figure 17:
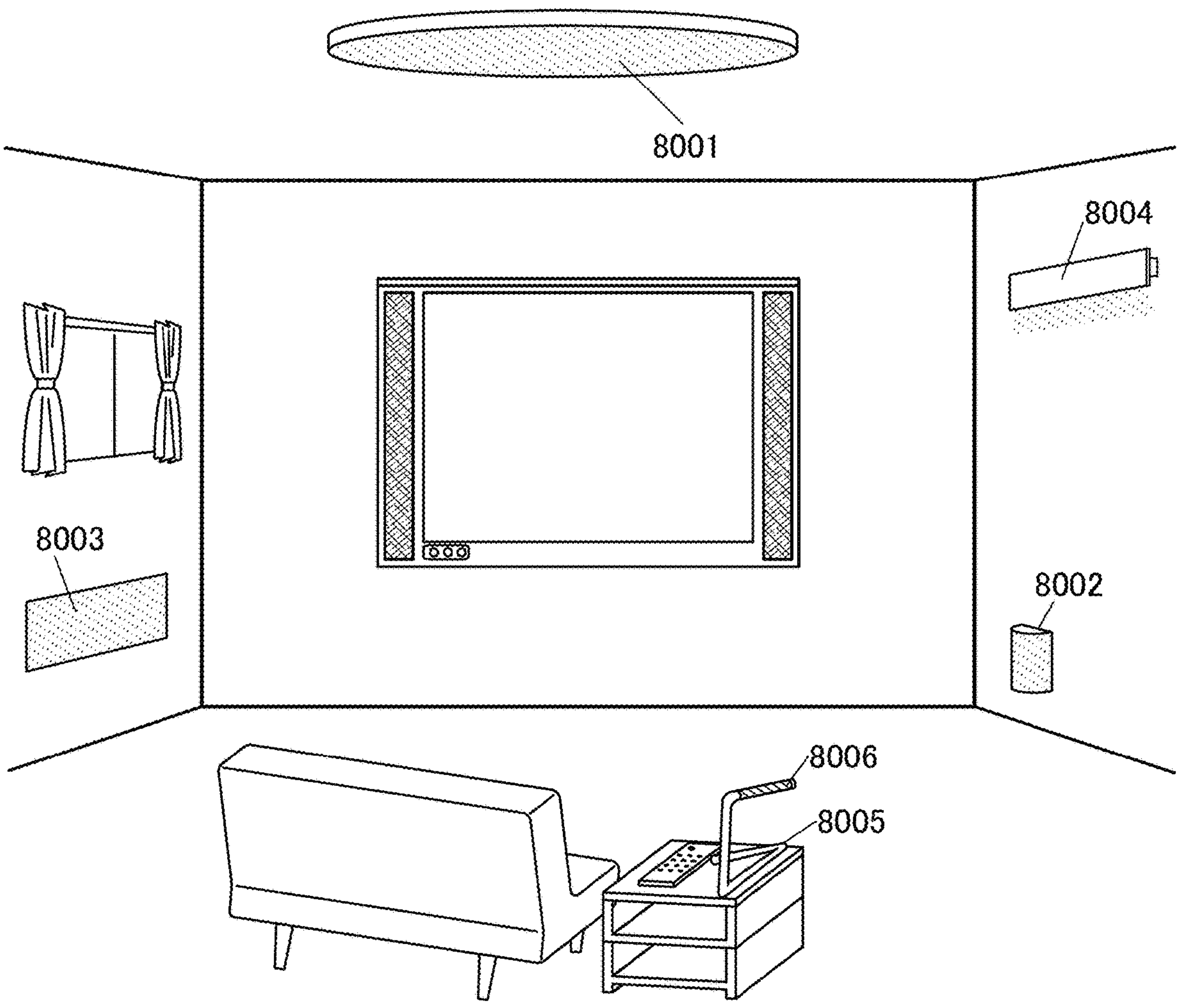
FIG. 17 is a diagram illustrating electronic appliances of an embodiment.
Figure 18A:
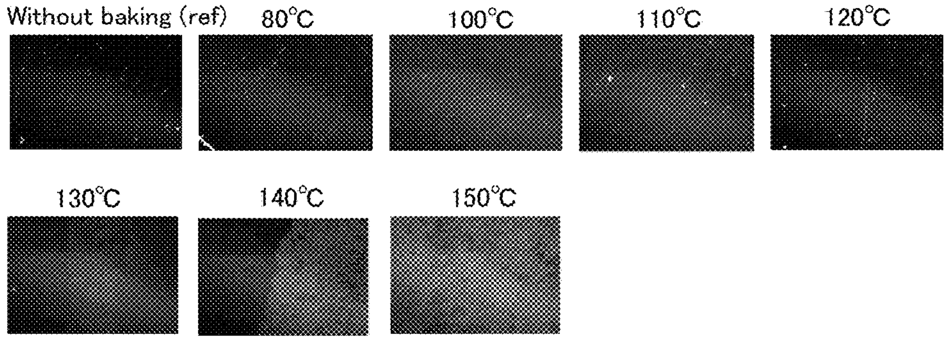
FIGS. 18A to 18E show photographs according to an example.
Figure 18B:
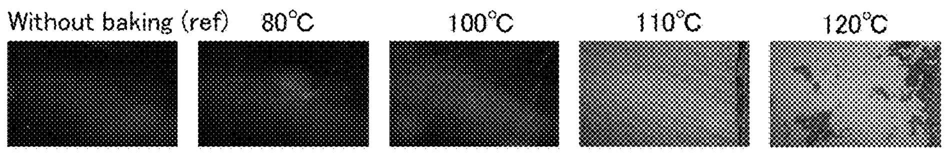
Figure 18C:
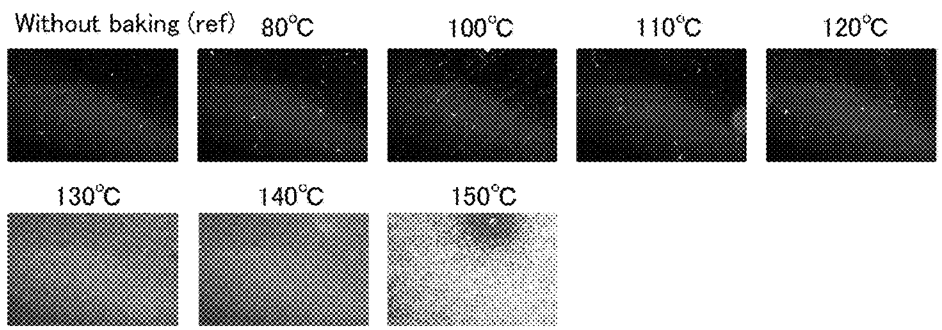
Figure 18D:
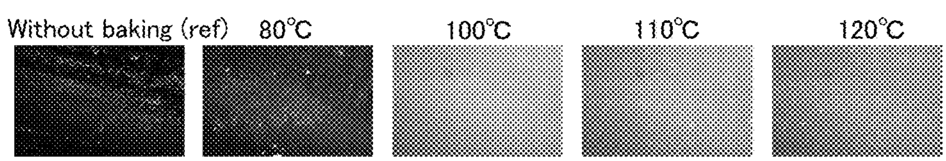
Figure 18E:
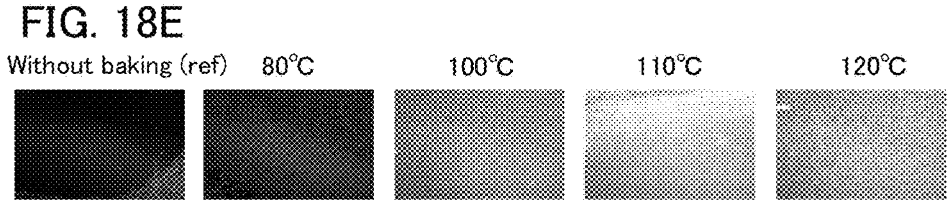
Figure 19A:
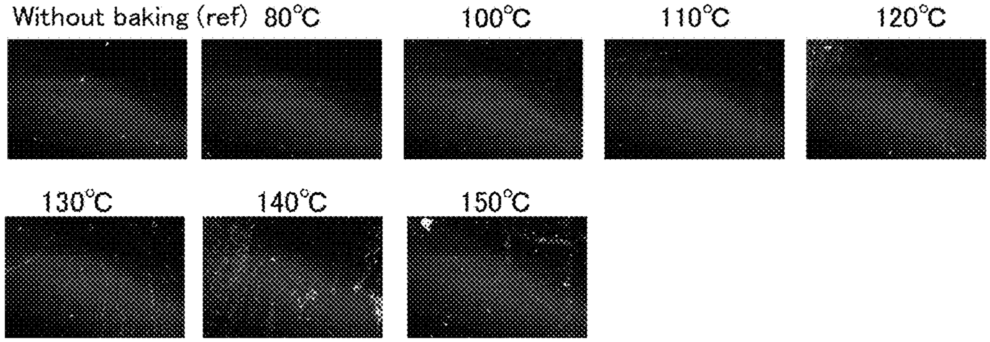
FIGS. 19A to 19D show photographs according to an example.
Figure 19B:
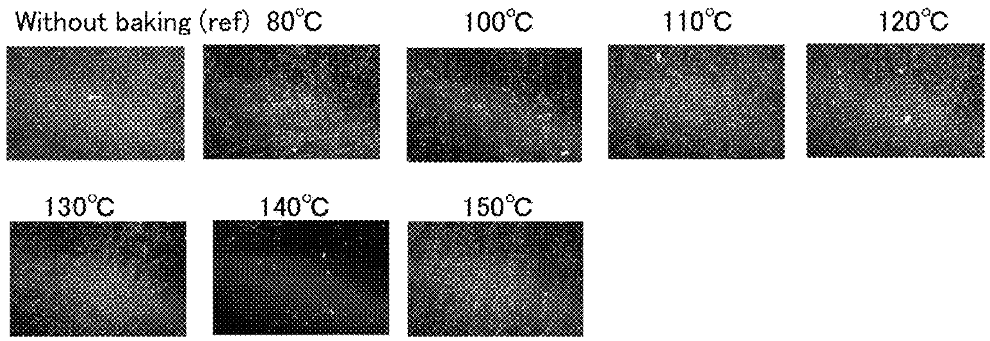
Figure 19C:
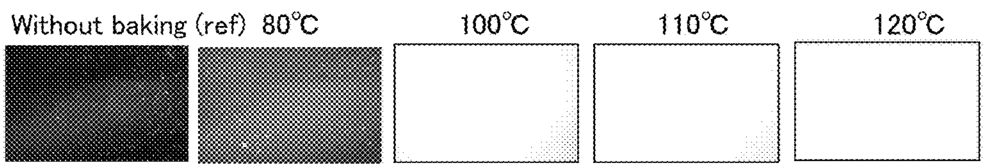
Figure 19D:
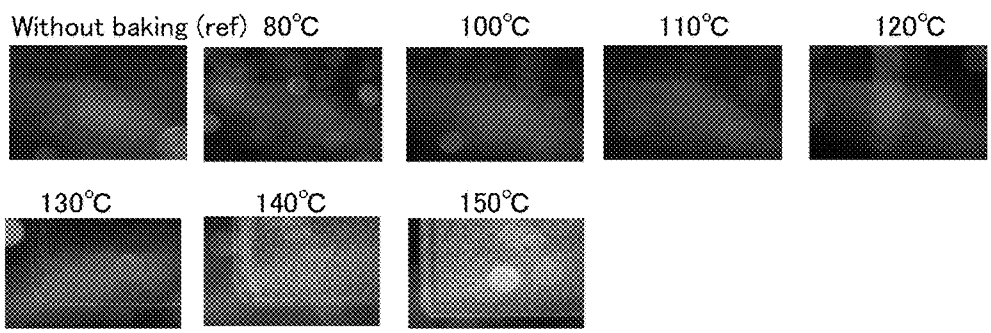

In this embodiment, an application example of a lighting device fabricated using the light-emitting apparatus of one embodiment of the present invention or the light-emitting device which is part of the light-emitting apparatus will be described with reference to FIG. 17.

A ceiling light 8001 can be used as an indoor lighting device. Examples of the ceiling light 8001 include a direct-mount light and an embedded light. Such a lighting device is fabricated using the light-emitting apparatus and a housing or a cover in combination. Besides, application to a cord pendant light (light that is suspended from a ceiling by a cord) is also possible.

A foot light 8002 lights a floor so that safety on the floor can be improved. It can be effectively used in a bedroom, on a staircase, or in a passage, for example. In that case, the size and shape of the foot light can be changed in accordance with the area or structure of a room. The foot light can also be a stationary lighting device fabricated using the light-emitting apparatus and a support base in combination.

A sheet-like lighting 8003 is a thin sheet-like lighting device. The sheet-like lighting, which is attached to a wall when used, is space-saving and thus can be used for a wide variety of uses. The area of the sheet-like lighting can be easily increased. The sheet-like lighting can also be used on a wall or a housing that has a curved surface.

In addition, a lighting device 8004 in which the direction of light from a light source is controlled to be only a desired direction can be used.

A desk lamp 8005 includes a light source 8006. As the light source 8006, the light-emitting apparatus of one embodiment of the present invention or the light-emitting device, which is part of the light-emitting apparatus, can be used.

Besides the above examples, when the light-emitting apparatus of one embodiment of the present invention or the light-emitting device which is a part thereof is used as part of furniture in a room, a lighting device that functions as the furniture can be obtained.

As described above, a variety of lighting devices that include the light-emitting apparatus can be obtained. Note that these lighting devices are also embodiments of the present invention.

The structures described in this embodiment can be used in an appropriate combination with any of the structures described in the other embodiments.

Example 1

This example will show the fabrication of films having different materials or composition (a stacked-layer film, a mixed film, and the like) over a glass substrate and the results of heat resistance test performed on the obtained samples (films). Note that nine kinds of samples that differ in a combination of a plurality of heteroaromatic compounds or a film composition were fabricated. The composition of the samples and the test results are shown in Table 1 below.

Chemical formulae of the materials used in this example are shown below.

[Chemical Formula 3]

(i)

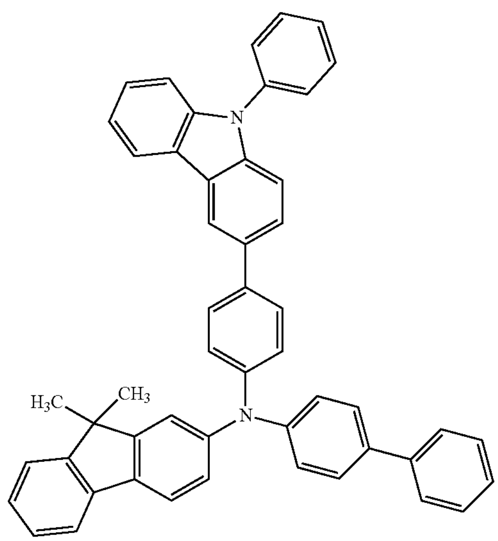

PCBBiF (ii)

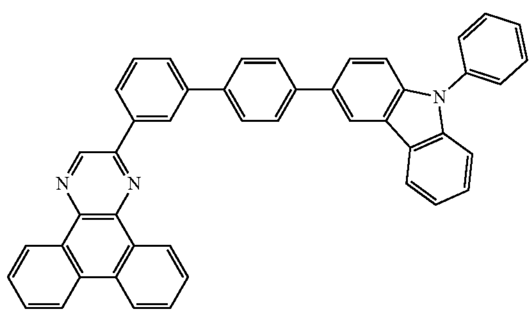

2mpPCBPDPq (iii)

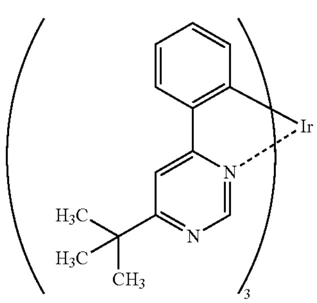

$Ir(tBuppm)_3$

-continued (iv)

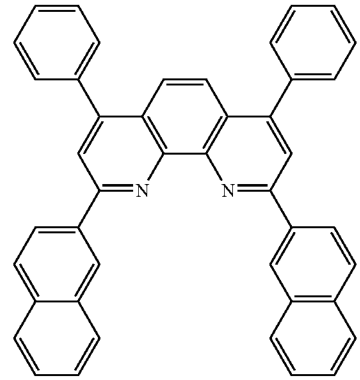

NBPhen

A fabrication method of each sample (Sample 1 to Sample 9) is described below.

First, a sample layer was formed over a glass substrate with a vacuum evaporation apparatus, and cut into strips of 1 cm×3 cm. Next, the substrate was introduced into a bell jar type vacuum oven (BV-001, SHIBATA SCIENTIFIC TECHNOLOGY LTD.), and the pressure was reduced to approximately 10 hPa, followed by 1-hour baking at temperatures in the range of 80° C. to 150° C.

Sample 1 is a single-layer film of one kind of heteroaromatic compound, which was formed by evaporation of 2,9-di(2-naphthyl)-4,7-diphenyl-1,10-phenanthroline (abbreviation: NBPhen) to a thickness of 10 nm over the glass substrate.

Sample 2 is a single-layer film of one kind of heteroaromatic compound, which was formed by evaporation of 2-[4'-(9-phenyl-9H-carbazol-3-yl)-3,1'-biphenyl-1-yl]dibenzo[f,h]quinoxaline (abbreviation: 2mpPCBPDBq) to a thickness of 10 nm over the glass substrate.

Sample 3 is a mixed film of a plurality of heteroaromatic compounds, which was formed by co-evaporation of 2mpPCBPDBq, N-(1,1'-biphenyl-4-yl)-N-[4-(9-phenyl-9H-carbazol-3-yl)phenyl]-9,9-dimethyl-9H-fluoren-2-amine (abbreviation: PCBBiF), and tris(4-t-butyl-6-phenylpyrimidinato)iridium(III) (abbreviation: $Ir(tBuppm)_3$) at a weight ratio of 0.8:0.2:0.06 (=2mpPCBPDBq:PCBBiF:$Ir(tBuppm)_3$) to a thickness of 40 nm over the glass substrate.

Sample 4 is a stacked-layer film of a plurality of heteroaromatic compounds, which was formed by evaporation of 2mpPCBPDBq to a thickness of 10 nm and then evaporation of NBPhen to a thickness of 10 nm over the glass substrate.

Sample 5 is a mixed film of a plurality of heteroaromatic compounds, which was formed by co-evaporation of 2mpPCBPDBq, PCBBiF, and $Ir(tBuppm)_3$ at a weight ratio of 0.8:0.2:0.06 (=2mpPCBPDBq:PCBBiF:$Ir(tBuppm)_3$) to a thickness of 40 nm, evaporation of 2mpPCBPDBq to a thickness of 10 nm, and then evaporation of NBPhen to a thickness of 10 nm over the glass substrate.

Sample 6 is a single-layer film of one kind of heteroaromatic compound, which was formed by evaporation of PCBBiF to a thickness of 40 nm over the glass substrate.

Sample 7 is a single-layer film of a mixture of a plurality of heteroaromatic compounds, which was formed by co-evaporation of 2mpPCBPDBq and NBPhen at a weight ratio of 0.5:0.5 (=2mpPCBPDBq:NBPhen) to a thickness of 20 nm over the glass substrate.

Sample 8 is a mixed film using a plurality of heteroaromatic compounds, which was formed by co-evaporation of 2mpPCBPDBq, PCBBiF, and Ir(tBuppm)$_3$ at a weight ratio of 0.8:0.2:0.06 (=2mpPCBPDBq:PCBBiF:Ir(tBuppm)$_3$) to a thickness of 40 nm and then evaporation of NBPhen to a thickness of 20 nm over the glass substrate.

Sample 9 is a mixed film using a plurality of heteroaromatic compounds, which was formed by co-evaporation of 2mpPCBPDBq, PCBBiF, and Ir(tBuppm)$_3$ at a weight ratio of 0.8:0.2:0.06 (=2mpPCBPDBq:PCBBiF:Ir(tBuppm)$_3$) to a thickness of 40 nm and then co-evaporation of 2mpPCBPDBq and NBPhen at a weight ratio of 0.5:0.5 (=2mpPCBPDBq:NBPhen) to a thickness of 20 nm over the glass substrate.

The samples formed in the above manners were observed visually and with an optical microscope (MX61L semiconductor/FPD inspection microscope, Olympus Corporation).

FIG. 18A to FIG. 18E and FIG. 19A to FIG. 19D show photographs (dark field observation at a magnification of 100 times) of the samples fabricated in this example. In addition, comparative examples to which the samples without baking (ref) correspond are also shown.

Table 1 shows the composition of the samples fabricated in this example and the observation results thereof. In Table 1, circles each denote that crystal was not generated, and crosses each denote that crystal was generated. Triangles each denote that whether crystal was generated was not able to be clarified.

deficient heteroaromatic compounds particularly has an effect of heat resistance improvement.

The above results indicate that even in the case of materials that exhibit relatively favorable heat resistance in a single-film form, use of the materials in a stacked-layer film causes crystallization at low temperatures in some cases. In comparison between Sample 5, Sample 8, and Sample 9 in each of which a plurality of films were stacked, Sample 5 and Sample 8 exhibited crystallization, respectively, at 100° C. and 80° C., whereas Sample 9 exhibited no clear crystallization up to 130° C. It was found that as compared to the case where the electron-transport layer is formed using one material, an improvement of heat resistance by 30° C. or more is obtained in the case where the electron-transport layer is a mixed film using a plurality of heteroaromatic compounds. In many cases, a plurality of organic compounds are stacked to form a light-emitting device. Thus, with use of the light-emitting device of one embodiment of the present invention, heat resistance of light-emitting devices can be significantly improved.

Example 2

The results in Example 1 reveal that the mixed film of the heteroaromatic compound and the organic compound that are used for the electron-transport layer in the light-emitting device of one embodiment of the present invention has higher heat resistance than a stacked-layer film in which single-layer films of these compounds are stacked. Here, Light-emitting device 1 including the mixed film of the heteroaromatic compound and the organic compound in an electron-transport layer and Comparative light-emitting device 1 including a stacked-layer film of the heteroaromatic compound and the organic compound in an electron-transport layer were fabricated, and characteristics of the devices were compared. The element structures and their characteristics are described below. Table 2 shows specific structures of Light-emitting device 1 and Comparative light-emitting device 1 used in this example. Chemical formulae of materials used in this example are shown below.

TABLE 1

| Sample No. | Composition | rt | 80° C. | 100° C. | 110° C. | 120° C. | 130° C. | 140° C. | 150° C. |
|---|---|---|---|---|---|---|---|---|---|
| 1 | NBPhen (10 nm) | ○ | ○ | ○ | ○ | ○ | ○ | Δ | Δ |
| 2 | 2mpPCBPDBq (10 nm) | ○ | ○ | ○ | Δ or x | Δ or x | — | — | — |
| 3 | 2mpPCBPDBq:PCBBiF:Ir(tBuppm)$_3$ (0.8:0.2:0.06) (40 nm) | ○ | ○ | ○ | ○ | ○ | x | x | x |
| 4 | NBPhen (10 nm)<br>2mpPCBPDBq (10 nm) | ○ | ○ | x | x | x | — | — | — |
| 5 | NBPhen (10 nm)<br>2mpPCBPDBq (10 nm)<br>2mpPCBPDBq:PCBBiF:Ir(tBuppm)$_3$ (0.8:0.2:0.06) (40 nm) | ○ | ○ | x | x | x | — | — | — |
| 6 | PCBBiF (40 nm) | ○ | ○ | ○ | ○ | ○ | ○ | ○ | ○ |
| 7 | 2mpPCBPDBq:NBPhen (0.5:0.5) (20 nm) | ○ | ○ | ○ | ○ | ○ | ○ | ○ | ○ |
| 8 | NBPhen (20 nm)<br>2mpPCBPDBq:PCBBiF:Ir(tBuppm)$_3$ (0.8:0.2:0.06) (40 nm) | ○ | x | x | x | x | — | — | — |
| 9 | 2mpPCBPDBq:NBPhen (0.5:0.5) (20 nm)<br>2mpPCBPDBq:PCBBiF:Ir(tBuppm)$_3$ (0.8:0.2:0.06) (40 nm) | ○ | ○ | ○ | ○ or Δ | ○ or Δ | Δ or x | x | x |

*rt: room temperature

According to the above results, a crystal was less likely to be generated in Sample 3 and Sample 7 each of which is a mixed film using a plurality of heteroaromatic compounds than in Sample 4 and Sample 5 each of which is a stacked-layer film using a plurality of heteroaromatic compounds. Thus, it was found that a mixed film using a plurality of heteroaromatic compounds has heat resistance improved. In particular, in comparison between Sample 4 and Sample 7 both of which use the same heteroaromatic compounds, Sample 4 that is a stacked-layer film exhibited crystallization at 100° C., whereas Sample 7 that is a mixed film exhibited no crystallization up to 150° C. Consequently, it was found that a mixed film using a plurality of π-electron

TABLE 2

| | Thickness | Light-emitting device 1 | Comparative light-emitting device 1 |
|---|---|---|---|
| Second electrode | 200 nm | Al | |
| Electron-injection layer | 1 nm | LiF | |
| Electron-transport layer | 30 nm | 2mpPCBPDBq:NBPhen (1:1) | NBPhen (20 nm) 2mpPCBPDBq (10 nm) |
| Light-emitting layer | 50 nm | 2mpPCBPDBq:PCBBiF:Ir(tBuppm)$_3$ (0.8:0.2:0.05) | |
| Hole-transport layer | 50 nm | PCBBiF | |
| Hole-injection layer | 10 nm | PCBBiF:OCHD-003 (1:0.03) | |
| First electrode | 70 nm | ITSO | |

[Chemical Formula 4]

(i)

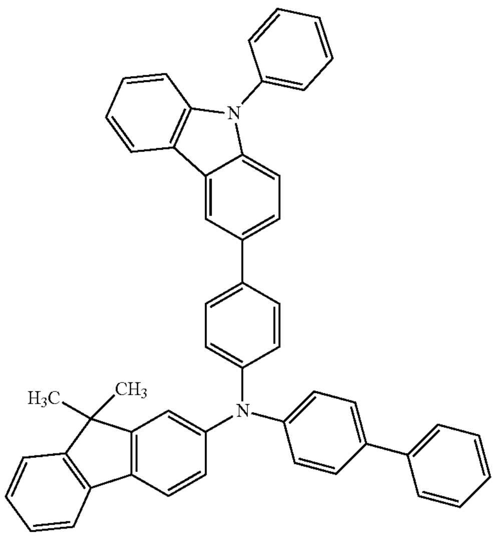

PCBBiF (ii)

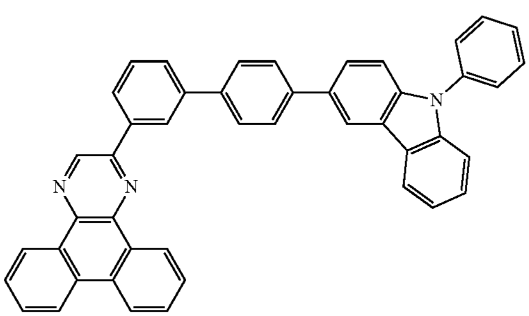

2mpPCBPDPq

-continued (iii)

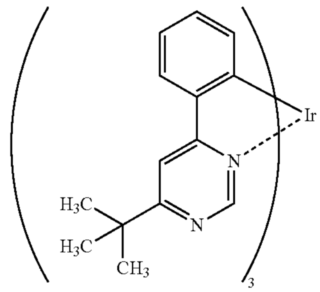

Ir(tBuppm)$_3$ (iv)

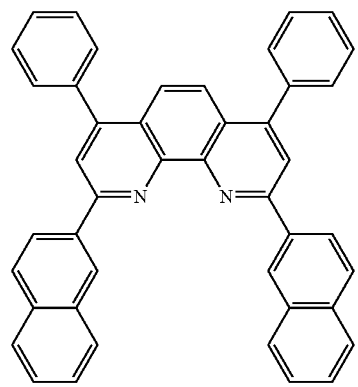

NBPhen

<<Fabrication of Light-Emitting Device 1>>

Figure 20:
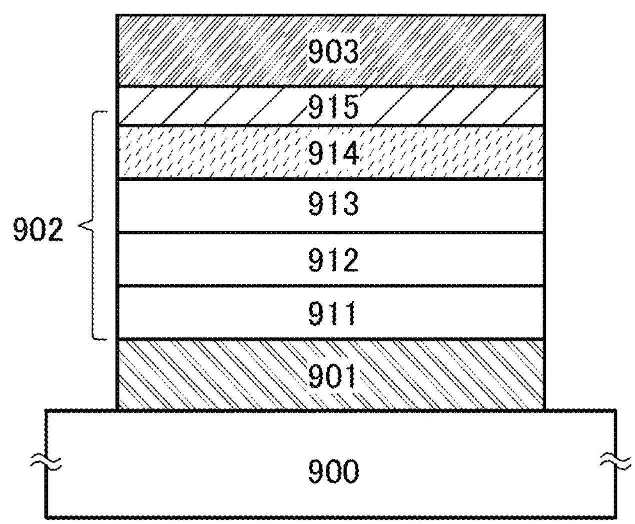
FIG. 20 is a diagram illustrating a structure of a light-emitting device of an example.

Light-emitting device 1 described in this example has a structure, as illustrated in FIG. 20, in which a hole-injection layer 911, a hole-transport layer 912, a light-emitting layer 913, an electron-transport layer 914, and an electron-injection layer 915 are stacked in this order over a first electrode 901 formed over a substrate 900, and a second electrode 903 is stacked over the electron-injection layer 915.

First, the first electrode 901 was formed over the substrate 900. The electrode area was set to 4 $mm^2$ (2 mm×2 mm). A glass substrate was used as the substrate 900. The first electrode 901 was formed to a thickness of 70 nm using indium tin oxide containing silicon oxide (ITSO) by a sputtering method.

As pretreatment, a surface of the substrate was washed with water, baking was performed at 200° C. for one hour, and then UV ozone treatment was performed for 370 seconds. After that, the substrate was transferred into a vacuum evaporation apparatus where the inside pressure had been reduced to approximately $10^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 911 was formed over the first electrode 901. The hole-injection layer 911 was formed in such a manner that the pressure in the vacuum evaporation apparatus was reduced to $10^{-4}$ Pa, and then N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) and an electron acceptor material (OCHD-003) that contains fluorine and has a molecular weight of 672 were deposited by co-evaporation to a thickness of 10 nm at a weight ratio of 1:0.03 (=PCBBiF:OCHD-003).

Then, the hole-transport layer 912 was formed over the hole-injection layer 911. The hole-transport layer 912 was formed to a thickness of 50 nm by evaporation of PCBBiF.

Next, the light-emitting layer 913 was formed over the hole-transport layer 912.

The light-emitting layer 913 was formed to a thickness of 50 nm by co-evaporation of 2-[4'-(9-phenyl-9H-carbazol-3-yl)-3,1'-biphenyl-1-yl]dibenzo[f,h]quinoxaline (abbreviation: 2mpPCBPDBq) represented by Structural Formula (ii), PCBBiF, and tris(4-t-butyl-6-phenylpyrimidinato)iridium (III) (abbreviation: $Ir(tBuppm)_3$) represented by Structural Formula (iii) at a weight ratio of 0.8:0.2:0.05 (=2mpPCBPDBq:PCBBiF:$Ir(tBuppm)_3$).

Next, the electron-transport layer 914 was formed over the light-emitting layer 913. The electron-transport layer 914 was formed to a thickness of 30 nm by co-evaporation of 2mpPCBPDBq and 2,9-di(2-naphthyl)-4,7-diphenyl-1,10-phenanthroline (abbreviation: NBPhen) represented by Structural Formula (iv) at a weight ratio of 1:1 (=2mpPCBPDBq:NBPhen).

Then, the electron-injection layer 915 was formed over the electron-transport layer 914. The electron-injection layer 915 was formed by evaporation of lithium fluoride (LiF) to a thickness of 1 nm.

Next, the second electrode 903 was formed over the electron-injection layer 915. The second electrode 903 was formed using aluminum by an evaporation method such that the obtained thickness was 200 nm. In this example, the second electrode 903 functions as a cathode.

Through the above steps, Light-emitting device 1 in which an EL layer was provided between the pair of electrodes over the substrate 900 was formed. The hole-injection layer 911, the hole-transport layer 912, the light-emitting layer 913, the electron-transport layer 914, and the electron-injection layer 915 described in the above steps are functional layers forming the EL layer in one embodiment of the present invention. Furthermore, in all the evaporation steps in the above fabrication method, an evaporation method by a resistance-heating method was used.

The fabricated light-emitting device 1 was sealed in a glove box containing a nitrogen atmosphere so as not to be exposed to the air (a sealant was applied to surround the element, and at the time of sealing, UV treatment was performed and then heat treatment was performed at 80° C. for one hour).

<<Fabrication Method of Comparative Light-Emitting Device 1>>

Comparative light-emitting device 1 was fabricated in the same manner as Light-emitting device 1 except that the electron-transport layer 914 was formed not by co-evaporation of 2mpPCBPDBq and NBPhen but by evaporation of 2mpPCBPDBq to a thickness of 10 nm and successively by evaporation of NBPhen to a thickness of 20 nm.

<<Operating Characteristics of Light-Emitting Device 1>>

Figure 21:
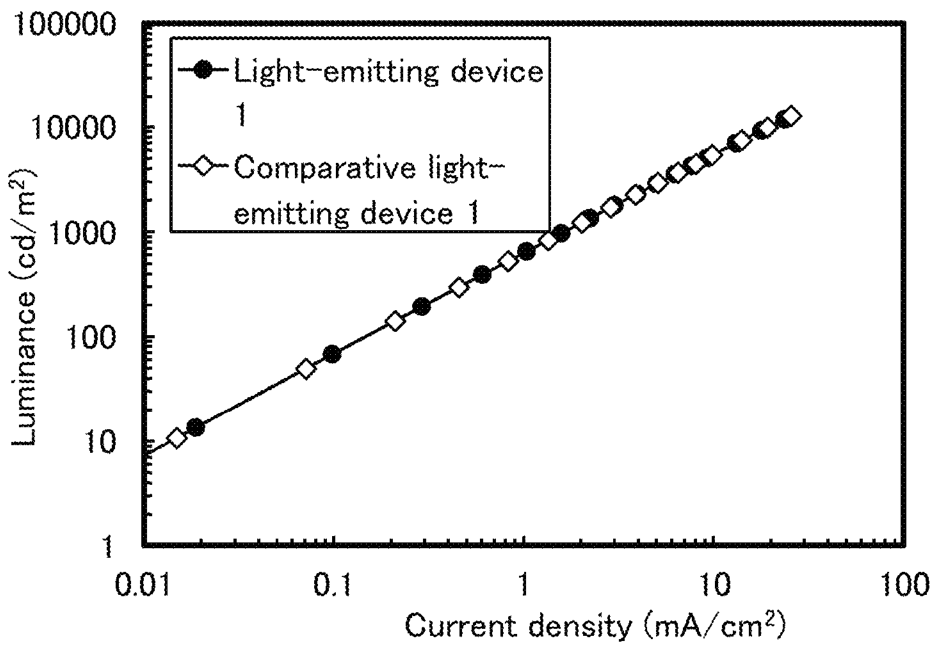
FIG. 21 shows luminance-current density characteristics of Light-emitting device 1 and Comparative light-emitting device 1.
Figure 22:
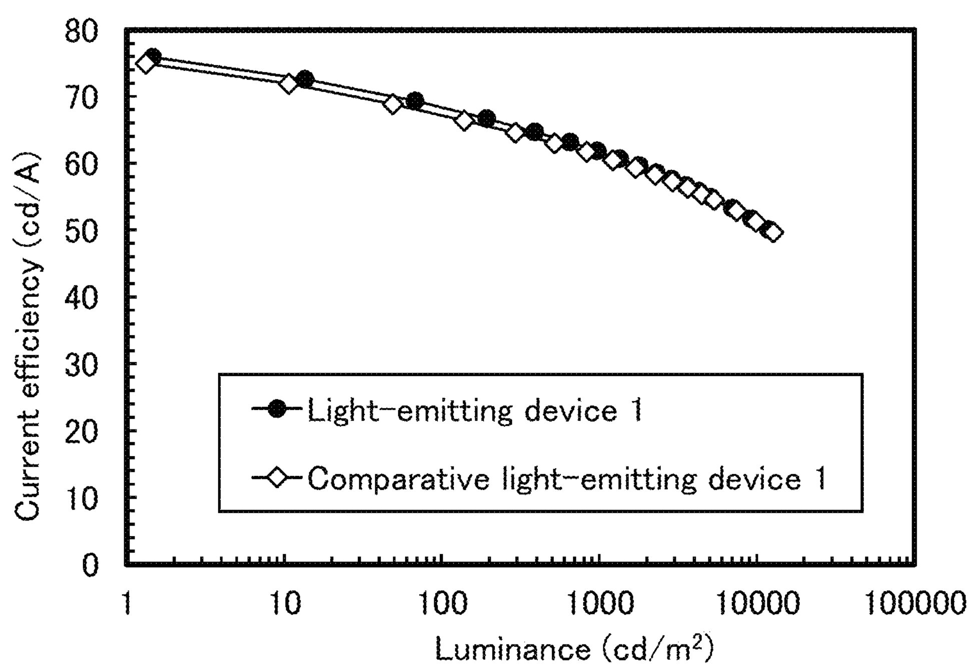
FIG. 22 shows current efficiency-luminance characteristics of Light-emitting device 1 and Comparative light-emitting device 1.
Figure 23:
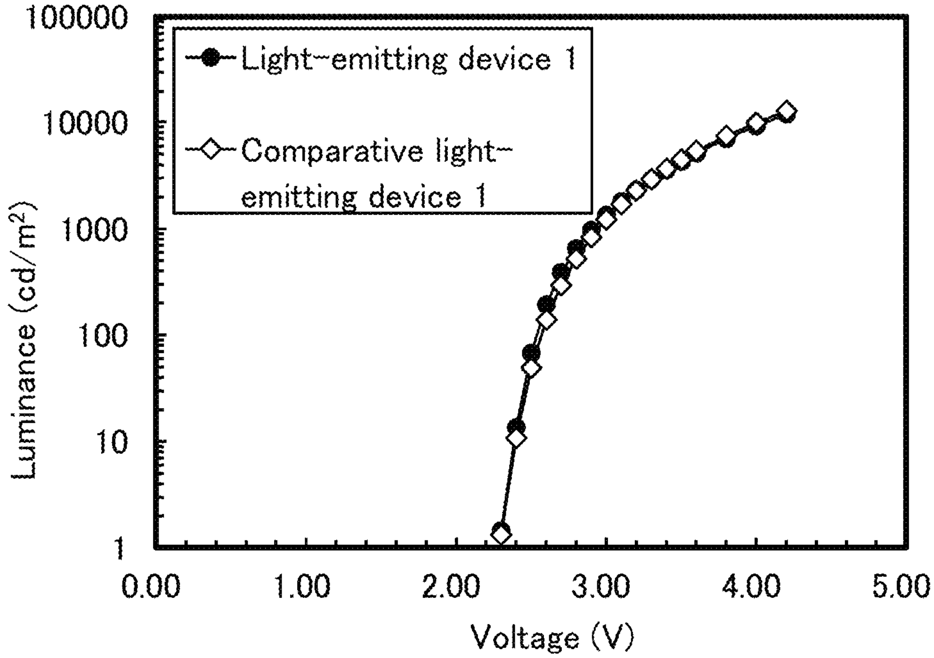
FIG. 23 shows luminance-voltage characteristics of Light-emitting device 1 and Comparative light-emitting device 1.
Figure 24:
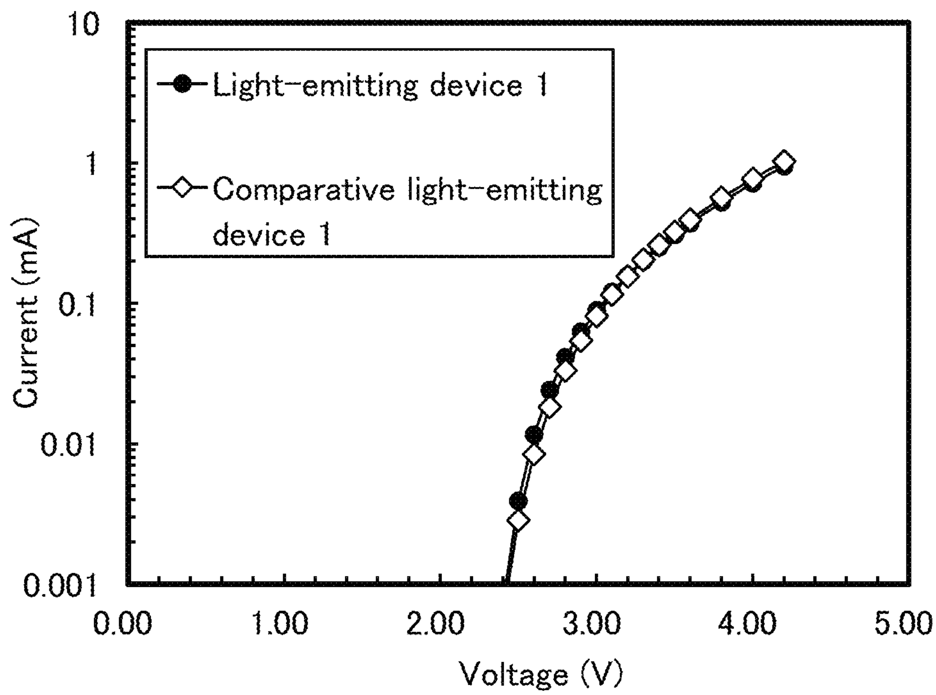
FIG. 24 shows current-voltage characteristics of Light-emitting device 1 and Comparative light-emitting device 1.
Figure 25:
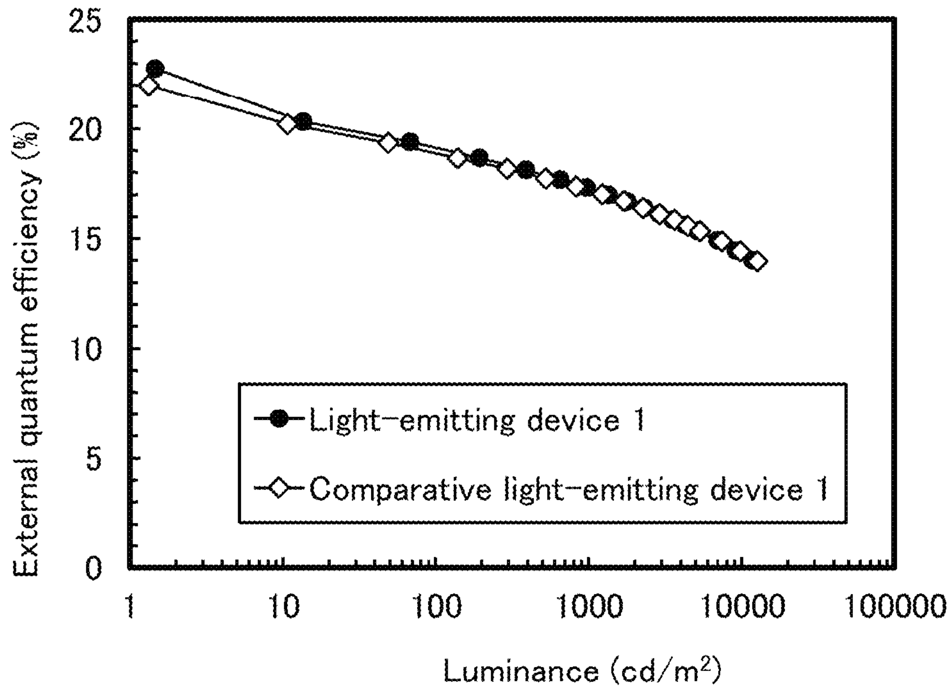
FIG. 25 shows external quantum efficiency-luminance characteristics of Light-emitting device 1 and Comparative light-emitting device 1.
Figure 26:
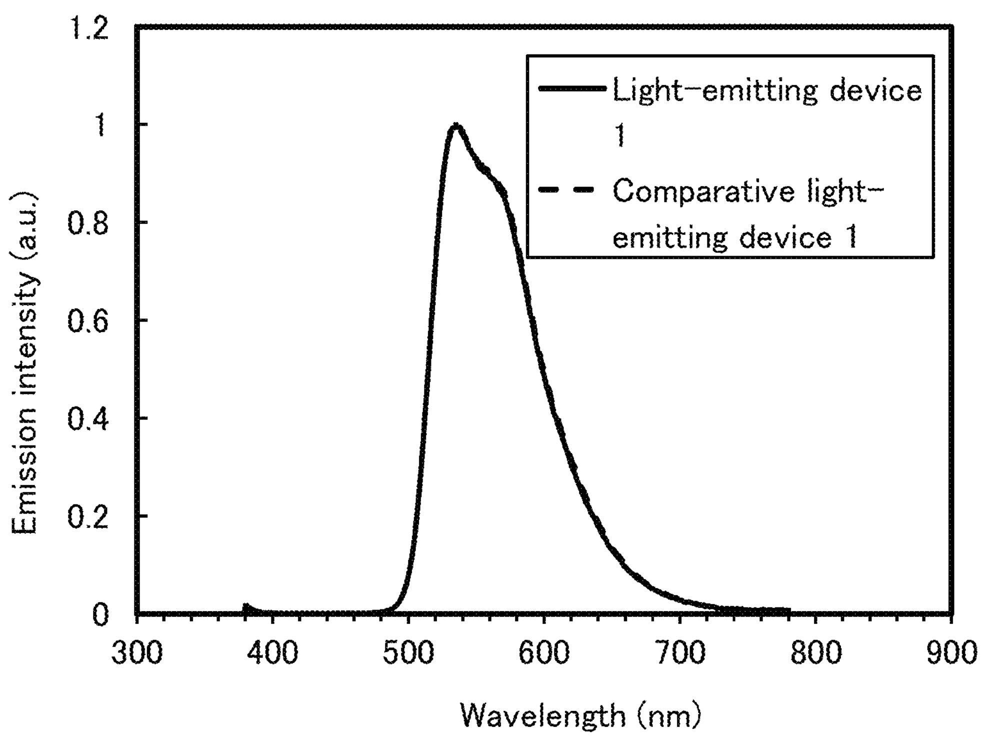
FIG. 26 shows light-emission spectra of Light-emitting device 1 and Comparative light-emitting device 1.

Luminance-current density characteristics of Light-emitting device 1 and Comparative light-emitting device 1 are shown in FIG. 21, current efficiency-luminance characteristics thereof are shown in FIG. 22, luminance-voltage characteristics thereof are shown in FIG. 23, current-voltage characteristics thereof are shown in FIG. 24, external quantum efficiency-luminance characteristics thereof are shown in FIG. 25, and emission spectra thereof are shown in FIG. 26. Table 3 shows the main characteristics of Light-emitting device 1 and Comparative light-emitting device 1 at approximately 1000 cd/m$^2$. The luminance, CIE chromaticity, and emission spectra were measured at normal temperature with a spectroradiometer (SR-UL1R manufactured by TOPCON TECHNOHOUSE CORPORATION).

TABLE 3

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 1 | 2.9 | 0.06 | 1.6 | 0.40 | 0.58 | 61.9 | 17.3 |
| Comparative light-emitting device 1 | 2.9 | 0.05 | 1.4 | 0.41 | 0.58 | 61.7 | 17.4 |

The results in FIG. 21 to FIG. 26 and Table 3 reveal that Light-emitting device 1 of one embodiment of the present invention has operation characteristics comparable to those of Comparative light-emitting device 1.

Figure 27:
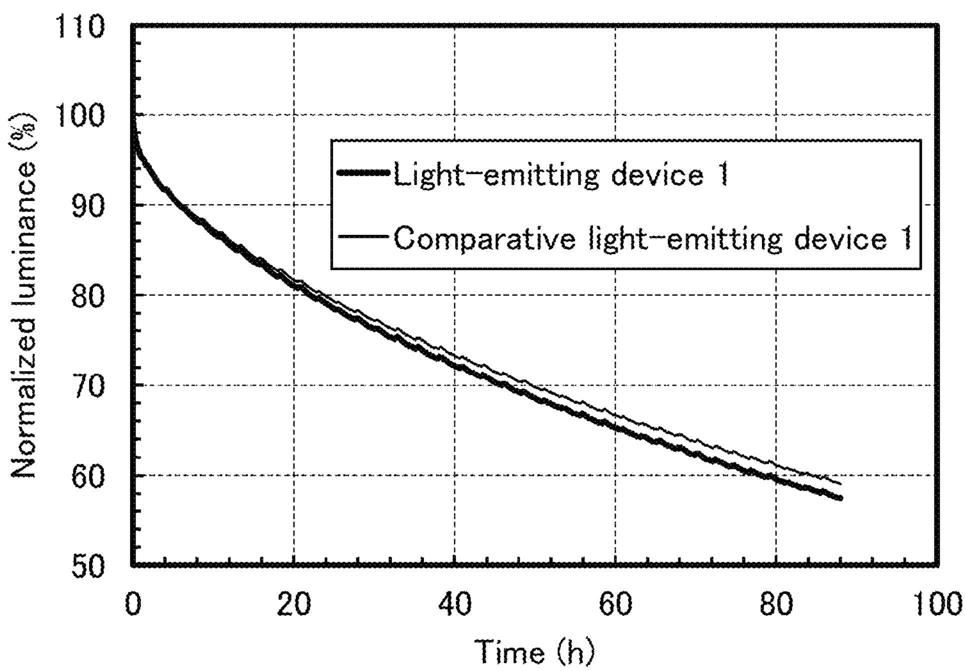
FIG. 27 shows reliabilities of Light-emitting device 1 and Comparative light-emitting device 1.

Next, a reliability test was performed on each light-emitting device. FIG. 27 shows the results of the reliability test of Light-emitting device 1 and Comparative light-emitting device 1. In FIG. 27, the vertical axis represents normalized luminance (%) with an initial luminance of 100%, and the horizontal axis represents driving time (h). As the reliability test, a driving test at a constant current density of 50 mA/cm$^2$ was performed on each light-emitting device.

The results in FIG. 27 verify that Light-emitting device 1 of one embodiment of the present invention has favorable reliability comparable to that of Comparative light-emitting device 1.

Example 3

This example will describe a synthesis method of 2-[4'-(9-phenyl-9H-carbazol-3-yl)-3,1'-biphenyl-1-yl]dibenzo[f,h]quinoxaline (abbreviation: 2mpPCBPDBq) used in Example 1 and Example 2. A structural formula of 2mpPCBPDBq is shown below.

[Chemical Formula 5]

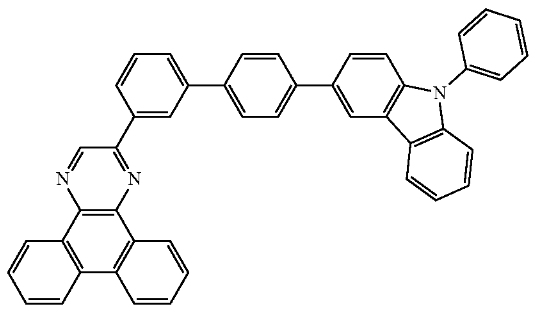

2mpPCBPDPq

<<Synthesis of 2mpPCBPDBq>>

Into a 200 mL three-neck flask were put 6.9 g (17 mmol) of 3-(4-bromophenyl)-9-phenylcarbazole, 4.4 g (17 mmol) of bis(pinacolato)diboron, 0.17 g (0.4 mmol) of 2-di-tert-butylphosphino-2',4',6'-triisopropylbiphenyl (tBuXPhos), 4.0 g (40 mmol) of potassium acetate, and 90 mL of xylene. After that, the mixture was degassed under reduced pressure, and then a nitrogen gas was made to flow in the system. The mixture was heated at 80° C., and 0.17 mg (0.2 mmol) of [1,1'-bis(diphenylphosphino)ferrocene]palladium(II) dichloride (Pd(dppf)$Cl_2$) was added thereto. Then, the mixture was stirred at 120° C. for 10 hours.

To the obtained mixture, 5.8 g (17 mmol) of 2-(3-chlorophenyl)dibenzo[f,h]quinoxaline, 13 g (40 mmol) of cesium carbonate, 0.18 mg (0.4 mmol) of tBuXPhos were added. Degassing under reduced pressure was performed, and then a nitrogen gas was made to flow in the system. The mixture was heated at 80° C., which was followed by addition of 0.16 mg (0.2 mmol) of Pd(dppf)$Cl_2$ thereto. Then, the mixture was heated and stirred at 130° C. for 3 hours, which was followed by heating and stirring at 150° C. for 15 hours. After the stirring, the precipitated solid was collected by suction filtration, and the obtained solid was washed with ethanol and water. On the obtained solid, suction filtration was performed through Celite (Catalog No. 537-02305 produced by Wako Pure Chemical Industries, Ltd.) and alumina with 1 L of toluene, and recrystallization was performed with toluene, so that 1.4 g of a target white powder was obtained (yield: 12%). The synthesis scheme is shown in Formula (a-1) below.

[Chemical Formula 6]

(a-1)

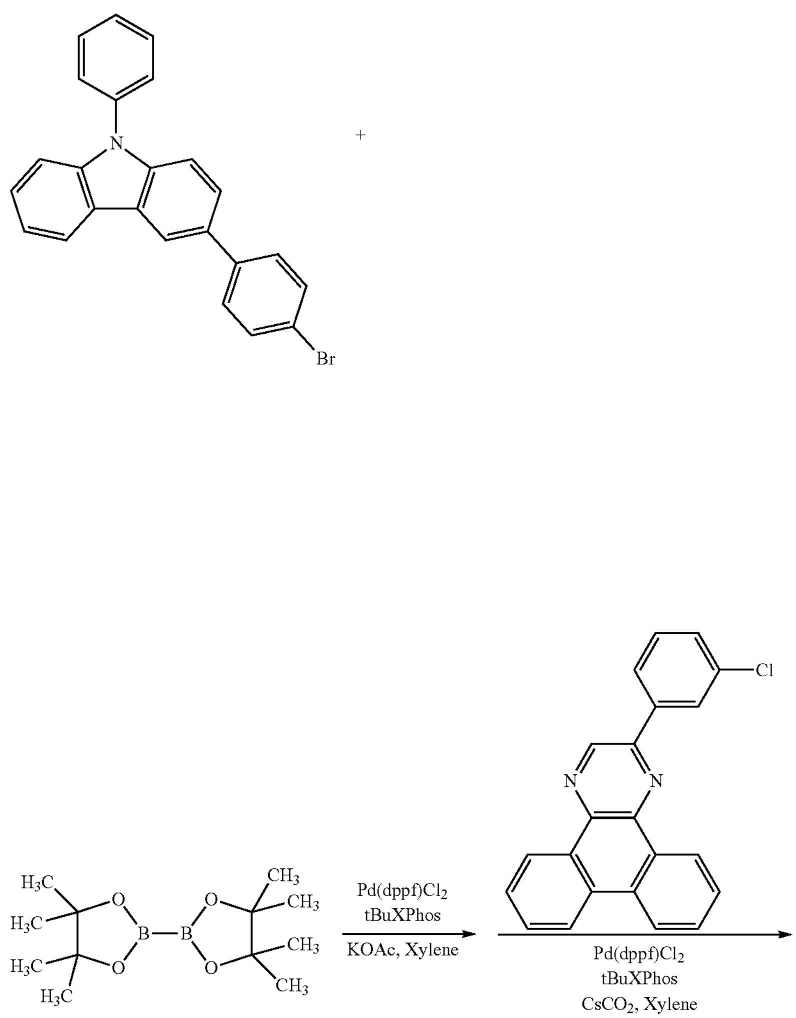

-continued

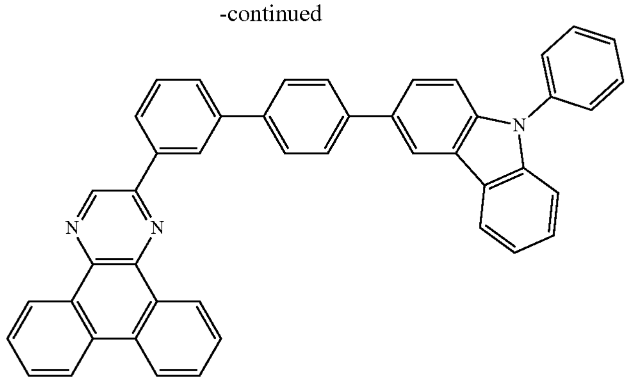

2mpPCBPDBq

Next, by a train sublimation method, the obtained solid was sublimated and purified. In the sublimation purification, 1.3 g of the obtained solid was heated at 340° C. for 15 hours under a pressure of 3.9 Pa with an argon flow rate of 15 sccm. After the sublimation purification, 1.5 g of a target solid was obtained at a collection rate of 85%.

Results of analysis by nuclear magnetic resonance ($^1$H-NMR) spectroscopy of the solid obtained above are shown below. The results mean that 2mpPCBPDBq was obtained in this example.

$^1$H NMR (chloroform-d, 500 MHz): δ=7.32-7.35 (m, 1H), 7.446 (s, 1H), 7.454 (s, 1H), 7.49-7.53 (m, 2H), 7.61-7.66 (m, 4H), 7.71-7.92 (m, 11H), 8.24 (d, J=8.0 Hz, 1H), 8.33 (d, J=8.0 Hz, 1H), 8.46 (sd, J=1.0 Hz, 1H), 8.67-8.68 (m, 3H), 9.26 (dd, J=7.8 Hz, J=1.3 Hz, 1H), 9.47 (dd, J=8.0 Hz, J=1.5 Hz, 1H), 9.48 (s, 1H).

REFERENCE NUMERALS

100: light-emitting device, 101: first electrode, 102: second electrode, 103B: EL layer, 103G: EL layer, 103R: EL layer, 103: EL layer, 104B: hole-injection/transport layer, 104G: hole-injection/transport layer, 104R: hole-injection/transport layer, 104: hole-injection/transport layer, 107B: insulating layer, 107G: insulating layer, 107R: insulating layer, 107: insulating layer, 108B: electron-transport layer, 108G: electron-transport layer, 108R: electron-transport layer, 108: electron-transport layer, 109: electron-injection layer, 110B: sacrificial layer, 110G: sacrificial layer, 110R: sacrificial layer, 110: sacrificial layer, 111: hole-injection layer, 112: hole-transport layer, 113: light-emitting layer, 114: electron-transport layer, 115: electron-injection layer, 231: display region, 400: substrate, 401: first electrode, 403: EL layer, 404: second electrode, 405: sealant, 406: sealant, 407: sealing substrate, 412: pad, 420: IC chip, 501C: insulating film, 501D: insulating film, 504: conductive film, 506: insulating film, 508A: region, 508B: region, 508C: region, 508: semiconductor film, 510: first substrate, 512A: conductive film, 512B: conductive film, 516A: insulating film, 516B: insulating film, 516: insulating film, 518: insulating film, 519: terminal, 520: functional layer, 524: conductive film, 528B: opening, 528G: opening, 528R: opening, 528: partition, 530B: pixel circuit, 530G: pixel circuit, 550B: light-emitting device, 550G: light-emitting device, 550R: light-emitting device, 551B: electrode, 551G: electrode, 551R: electrode, 552: electrode, 580: space, 591B: opening, 591G: opening, 700: light-emitting apparatus, 702B: pixel, 702G: pixel, 702R: pixel, 703: pixel, 705: insulating layer, 770: second substrate, 900: substrate, 901: first electrode, 903: second electrode, 911: hole-injection layer, 912: hole-transport layer, 913: light-emitting layer, 914: electron-transport layer, 915: electron-injection layer, 951: substrate, 952: electrode, 953: insulating layer, 954: partition layer, 955: EL layer, 956: electrode, 5200B: electronic appliance, 5210: arithmetic device, 5220: input/output device, 5230: display portion, 5240: input portion, 5250: sensing portion, 5290: communication portion, 8001: ceiling light, 8002: foot light, 8003: sheet-like lighting, 8004: lighting device, 8005: desk lamp, 8006: light source This application is based on Japanese Patent Application Serial No. 2021-021324 filed on Feb. 12, 2021, the entire contents is hereby incorporated herein by reference.

The invention claimed is:

1. A light-emitting device comprising:
a first electrode;
an EL layer over the first electrode;
an insulating layer in contact with at least a part of the EL layer; and
a second electrode over the EL layer and the insulating layer,
wherein the EL layer comprises at least a light-emitting layer, a first electron-transport layer over the light-emitting layer, and a second electron-transport layer over the first electron-transport layer,
wherein the insulating layer is in contact with an end portion of the light-emitting layer and an end portion of the first electron-transport layer,
wherein the second electron-transport layer covers the first electron-transport layer and the insulating layer, and
wherein the first electron-transport layer comprises a first heteroaromatic compound comprising at least one heteroaromatic ring and a first organic compound different from the first heteroaromatic compound.

2. The light-emitting device according to claim 1,
wherein the second electron-transport layer comprises a second heteroaromatic compound comprising at least one heteroaromatic ring.

3. The light-emitting device according to claim 1, wherein the first organic compound comprises at least one heteroaromatic ring.

4. The light-emitting device according to claim 1, wherein the heteroaromatic ring comprises any one of a pyridine skeleton, a diazine skeleton, a triazine skeleton, and a polyazole skeleton.

5. The light-emitting device according to claim 1, wherein the heteroaromatic ring comprises a fused heteroaromatic ring having a fused ring structure.

6. The light-emitting device according to claim 5, wherein the fused heteroaromatic ring is any one of a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

7. A light-emitting apparatus comprising:

the light-emitting device according to claim 1; and at least one of a transistor and a substrate.

8. The light-emitting device according to claim 1, wherein each of the first heteroaromatic compound and the first organic compound is contained in the first electron-transport layer at 10% or higher.

9. A light-emitting apparatus comprising:

a first light-emitting device and a second light-emitting device that are adjacent to each other, wherein the first light-emitting device comprises a second electrode over a first electrode with a first EL layer sandwiched therebetween, and a first insulating layer adjacent to a part of the first EL layer, wherein the first EL layer comprises at least a first light-emitting layer, a first electron-transport layer over the first light-emitting layer, and a second electron-transport layer over the first electron-transport layer, wherein the first insulating layer is in contact with an end portion of the first light-emitting layer and an end portion of the first electron-transport layer, wherein the second electron-transport layer covers the first electron-transport layer and the first insulating layer, wherein the second light-emitting device comprises the second electrode over a third electrode with a second EL layer sandwiched therebetween, and a second insulating layer adjacent to a part of the second EL layer, wherein the second EL layer comprises at least a second light-emitting layer, a third electron-transport layer over the second light-emitting layer, and the second electron-transport layer over the third electron-transport layer, wherein the second insulating layer is in contact with an end portion of the second light-emitting layer and an end portion of the third electron-transport layer, wherein the second electron-transport layer covers of the third electron-transport layer and the second insulating layer, wherein the first electron-transport layer comprises a first heteroaromatic compound comprising at least one heteroaromatic ring and a first organic compound different from the first heteroaromatic compound, and wherein the third electron-transport layer comprises a second heteroaromatic compound comprising at least one hetero aromatic ring and a second organic compound different from the second heteroaromatic compound.

10. The light-emitting apparatus according to claim 9, wherein the second electron-transport layer comprises a third heteroaromatic compound comprising at least one heteroaromatic ring.

11. The light-emitting apparatus comprising claim 9, wherein each of the first organic compound and the second organic compound comprises at least one heteroaromatic ring.

12. The light-emitting apparatus according to claim 9, wherein the heteroaromatic ring comprises any one of a pyridine skeleton, a diazine skeleton, a triazine skeleton, and a polyazole skeleton.

13. The light-emitting apparatus according to claim 9, wherein the heteroaromatic ring comprises a fused heteroaromatic ring having a fused ring structure.

14. The light-emitting apparatus according to claim 13, wherein the fused heteroaromatic ring is any one of a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

15. The light-emitting apparatus according to claim 9, wherein the second electron-transport layer is in contact with a top surface of the first electron-transport layer and a top surface of the third electron-transport layer.

16. An electronic appliance comprising:

the light-emitting apparatus according to claim 9; and at least one of a sensing portion, an input portion, and a communication portion.

17. A lighting device comprising:

the light-emitting apparatus according to claim 9; and a housing.

18. The light-emitting apparatus according to claim 9, wherein each of the first heteroaromatic compound and the first organic compound is contained in the first electron-transport layer at 10% or higher, and wherein each of the second heteroaromatic compound and the second organic compound is contained in the third electron-transport layer at 10% or higher.

* * * * *